(12) United States Patent
Nakagawa

(10) Patent No.: US 7,545,292 B2
(45) Date of Patent: Jun. 9, 2009

(54) MODULATION METHOD AND APPARATUS USING ALTERNATE TABLES FOR TRANSLATING DATA

(75) Inventor: Toshiyuki Nakagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/787,404

(22) Filed: Apr. 16, 2007

(65) Prior Publication Data

US 2007/0279264 A1 Dec. 6, 2007

(30) Foreign Application Priority Data

Apr. 28, 2006 (JP) ............................. 2006-126318

(51) Int. Cl.
*H03M 5/00* (2006.01)
(52) U.S. Cl. ........................................ 341/58; 375/253
(58) Field of Classification Search ............... 341/50–80
See application file for complete search history.

(56) References Cited

U.S. PATENT DOCUMENTS 5,579,003 A * 11/1996 Hirayama et al. ............ 341/59
6,445,313 B2 * 9/2002 Ahn ............................ 341/59
6,496,541 B1 12/2002 Kahlman et al.
7,333,033 B2 * 2/2008 Nakagawa ................... 341/59
7,336,207 B2 * 2/2008 Nakagawa ................... 341/59

FOREIGN PATENT DOCUMENTS

| EP | 0 597 443 A | 5/1994 |
| JP | 06-197024 | 7/1994 |
| JP | 11-346154 | 12/1999 |

* cited by examiner

*Primary Examiner*—Lam T Mai
(74) *Attorney, Agent, or Firm*—Robert J. Depke; Rockey, Depke & Lyons, LLC

(57) ABSTRACT

A modulation apparatus and method employs first and second conversion means for translating input data into an alternate form for recording. The first conversion means converts a portion of input data matching a first data pattern into a first code pattern in accordance with a first table which maintains an even/odd-characteristic and a second conversion means converts a portion of input data matching a second data pattern into a second code pattern in accordance with a second table which does not maintain an even/odd-characteristic.

14 Claims, 28 Drawing Sheets

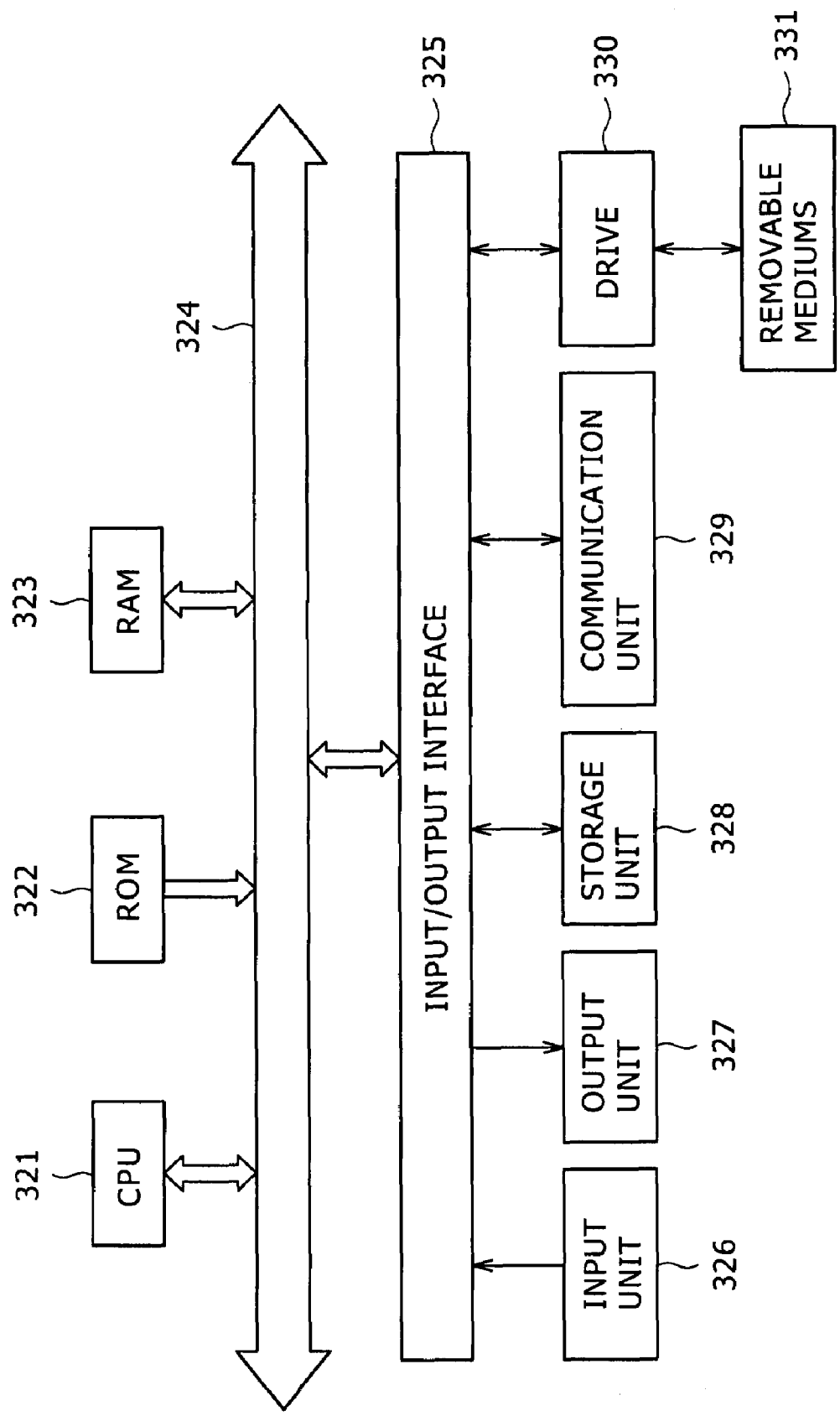

MODULATION METHOD AND APPARATUS USING ALTERNATE TABLES FOR TRANSLATING DATA

CROSS REFERENCES TO RELATED APPLICATIONS

The present invention contains subject matter related to Japanese Patent Application JP 2006-126318 filed in the Japan Patent Office on Apr. 28, 2006, the entire contents of which being incorporated herein by reference.

BACKGROUND OF THE INVENTION

1. Field of the Invention

The present invention relates to a modulation apparatus, a modulation method adopted by the modulation apparatus, a modulation program implementing the modulation method, a recording medium for storing a signal modulated by the modulation apparatus and a recording medium for storing the modulation program. More particularly, the present invention relates to a modulation apparatus capable of executing DSV control with a high degree of reliability even if an even/odd-characteristic retention violating conversion pattern is used as well as relates to a modulation method adopted by the modulation apparatus, a modulation program implementing the modulation method, a recording medium for storing a signal modulated by the modulation apparatus and a recording medium for storing the modulation program.

2. Description of the Related Art

Before data is transmitted through a predetermined transmission line or recorded onto a recording medium such as a magnetic disk, an optical disk or a magneto-optical disk, the data is modulated to convert the data into one suitable for the transmission line or the recording medium. One of methods to modulate the data is the commonly known block coding method. In accordance with the block coding method, data is divided into data words and, then, each of the data words is converted into a code word having a size of n×i bits in accordance with a proper coding rule. The data word is a data unit having a size of m×i bits. For i=1, the resulting code is a fixed-length code. For i having a selectable variable value in the range 1 to imax, on the other hand, the resulting code is a variable-length code. The code resulting from a coding process adopting the block coding method is represented by a variable-length code (d, k; m, n; r).

The parameter i is referred to as a restrain length and the range upper limit imax is referred to as a maximum restrain length. The parameter d is the minimum number of consecutive 0s inserted between two consecutive 1s. That is to say, the parameter d is the 0 minimum run. On the other hand, the parameter k is the maximum number of consecutive 0s inserted between two consecutive 1s. That is to say, the parameter k is the 0 maximum run.

By the way, code words obtained as described above are recorded onto an optical disk or a magneto-optical disk such as a compact disk (CD) or a mini disk (MD, which is also a trademark) by carrying out a recording process in which the code words are subjected to NRZI (NonReturn to Zero Inverted) modulation processing and data is recorded onto the recording medium on the basis of a variable-length code sequence obtained as a result of the NRZI modulation processing. The NRZI modulation processing is a process to invert each 1 in the input variable-length code sequence and not inverting every 0 in the sequence. In the following description, the variable-length code sequence obtained as a result of the NRZI modulation processing is referred to as a recording waveform sequence. Such a recording process is referred to hereafter as a mark edge recording process. In the case of a magneto-optical disk or the like used as a recording medium as a disk having a size of 3.5 inches and a recording capacity of 230 MB in conformity with the ISO standards, on the other hand, the code sequence of code words completing the modulation process is recorded onto the recording medium as it is without being subjected to the NRZI modulation processing. In the following description, this recording process without the NRZI modulation processing is referred to hereafter as a mark position recording process. In most cases, the mark edge recording process is applied to the contemporary recording medium, which has a high recording density.

In addition, a variety of modulation methods have been proposed and put to practical use. The modulation methods have been devised as methods satisfying conditions set for the recording medium as described as follows. Let Tmin and Tmax denote respectively a minimum inversion interval of a recording waveform sequence and a maximum inversion interval of the sequence. In a high-density recording process carried out in the line-velocity direction, a longer minimum inversion interval Tmin, that is, a larger minimum run d is better. In addition, in a process to reproduce blocks, it is desirable to provide a short maximum inversion interval Tmax, that is, a small maximum run k. On top of that, if an overwrite characteristic is taken into consideration, it is desirable to provide a small ratio Tmax/Tmin. In addition, from the jitter and/or S/N points of view, it is important to have a large detection window width Tw, which is defined as the ratio m/n.

To put it concretely, the following description explains codes to be used in a process to record data onto a recording medium such as a magnetic disk, an optical disk or a magneto-optical disk by adoption of the modulation methods already proposed and/or actually put to practical use. An EFM code also referred to as a code (2, 10; 8, 17; 1) to be used in a process to record data onto a CD and/or an MD, a 8-16 code also referred to as a code (2, 10; 1, 2; 1) to be used in a process to record data onto a DVD (Digital Versatile Disc) and an RLL (Run Length Limited) (2, 7) code also referred to as a code (2, 7; m, n; r) to be used in a process to record data onto a PD having a size of 120 mm and a recording capacity of 650 MB are each an RLL code having a minimum run d of 2 (d=2). On the other hand, an RLL (1, 7) code also referred to as a code (1, 7; 2, 3; r) to be used in a process to record data onto an MO having a size of 3.5 inches and a recording capacity of 640 MB is an RLL code having a minimum run d of 1 (d=1). In addition, an RLL code having a minimum run d of 1 (d=1) and a well balanced minimum mark size as well as a well balanced conversion efficiency is a code to be often recorded onto a disk recording medium presently under research/development in a disk recording/reproduction apparatus. Examples of the disk recording medium presently under research/development are an optical disk and a magneto-optical disk that each have a high recording density.

The following table is a modulation table for the variable-length RLL (1, 7) code.

TABLE 1

RLL (1, 7): (d, k; m, n; r) = (1, 7; 2, 3; 2)

|  | Data pattern | Code pattern |
|---|---|---|
| For i = 1 | 11 | 00x |
|  | 10 | 010 |
|  | 01 | 10x |

TABLE 1-continued

RLL (1, 7): (d, k; m, n; r) = (1, 7; 2, 3; 2)

|  | Data pattern | Code pattern |
|---|---|---|
| For i = 2 | 0011 | 000 00x |
|  | 0010 | 000 010 |
|  | 0001 | 100 00x |
|  | 0000 | 100 010 |

In the following description, the data and code patterns shown in a conversion table such as Table 1 are each referred to generically as a conversion pattern, meaning a data pattern to be converted or a code pattern obtained as a result of a process to convert the data pattern.

In the modulation table given above, symbol x is 1 if the following channel bit is 0 but symbol x is 0 if the following channel bit is 1. The maximum restrain length r is 2.

The parameters (d, k; m, n; r) of the RLL (1, 7) code are (1, 7; 2, 3; 2). The minimum inversion interval Tmin represented by an expression of (d+1)T is thus (1+1)T=2T where symbol T denotes the bit interval of the recording waveform sequence. The minimum inversion interval Tmin represented by an expression of (m/n)×2Tdata is thus (2/3)×2Tdata=1.33Tdata where symbol Tdata denotes the bit interval of the data sequence. The maximum inversion interval Tmax represented by an expression of (k+1)T is thus (7+1)T=8T. The maximum inversion interval Tmax represented by an expression of (m/n)×8Tdata is thus (2/3)×8Tdata=5.33Tdata. The detection window width Tw represented by an expression of (m/n)×Tdata is thus (2/3)×Tdata=0.67Tdata.

In a channel bit sequence completing a modulation process making use of the RLL (1, 7) code with Table 1 used as a modulation table, the generation frequency of the minimum inversion interval Tmin equal to 2T is highest to be followed sequentially by the minimum inversion intervals Tmin equal to 3T, 4T, 5T, 6T and so on. In addition, if the minimum inversion interval Tmin equal to 2T is repeated, that is, if edge information is generated much in an early period, such generation of the edge information is advantageous to generation of a clock signal in many cases.

By the way, in a process to record data onto a recording medium specially having a high recording density or reproduce data from such a recording medium, the minimum run is a parameter most likely causing an error. This is because, in a process to reproduce data from a recording medium, the output waveform having the minimum run is smaller than other output waveforms having a smaller run and is hence prone to an effect caused by an abnormal state such as a defocus or tangential-tilt state. In addition, a process to record data with consecutive minimum marks onto a recording medium having a high recording density or reproduce such data from such a recording medium is prone to an effect of an external disturbance such as a noise. Thus, a data reproduction error is generated easily. As a pattern of the data reproduction error generated in such a reproduction process, data between the front and rearmost edges of the consecutive minimum marks is mistakenly shifted all together in some cases. That is to say, the generated bit error length becomes the distance of error propagation from the head of the succession of minimum runs to the tail of the succession. Thus, there is raised a problem that the error propagation becomes undesirably long.

As control to establish a stabilized state in a process to record data onto a recording medium specially having a high line recording density or reproduce data from such a recording medium, control of minimum-run succession is effective.

As described above, before data is transmitted through a predetermined transmission line or recorded onto a recording medium, the data is modulated to convert the data into one suitable for the transmission line or the recording medium. In this case, if the code obtained as a result of the modulation process includes low-frequency components, variations and/or jitters are generated easily in a variety of error signals. The error signals represent errors such as tracking errors detected in servo control executed by a disk recording/reproduction apparatus. For this reason, it is desirable to suppress low-frequency components included in the code obtained as a result of the modulation process as much as possible.

DSV (Digital Sum Value) control is a typical method to suppress low-frequency components included in code obtained as a result of a modulation process. A DSV is a quantity obtained as follows. First of all, a channel bit sequence is subjected to a NRZI modulation process, which is a level coding process, in order to generate a bit sequence to be used as a recording code sequence. Then, each bit value of 1 in the bit sequence representing data symbols is changed to the value of +1 whereas each bit value of 0 in the bit sequence is changed to the value of −1. Subsequently, values of +1 and −1 in the resulting code are summed up to result in the DSV. The DSV is an indicator of low-frequency components included in the recording bit sequence. Thus, the DSV control is control to get rid of DC components included in the recording code sequence in order to suppress low-frequency components.

The code obtained as a result of a modulation process based on the variable-length RLL (1, 7) table given as Table 1 has not been subjected to the DSV control. In the DSV control executed on a channel bit sequence, which is a recording code sequence obtained as a result of such a modulation process, first of all, DSVs are calculated at predetermined intervals. Then, predetermined DSV control bits are inserted into the channel bit sequence used as the recording code sequence. For more information, the reader is suggested to refer to documents such as Japanese Patent Laid-open No. Hei 6-197024.

The number of DSV control bits to be inserted into the channel bit sequence is determined by the minimum run d. For a minimum run d of 1 (d=1), DSV control bits are inserted into such positions in the code word so as to abide by the minimum run d. In this case, the number of necessary DSV control bits to be inserted as channel bits is 2 (=d+1). In addition, DSV control bits are also inserted into arbitrary positions in the code word so as to abide by the maximum run k. In this case, the number of necessary DSV control bits to be inserted as channel bits is 4 (=2×(d+1)). If the DSV control is executed by inserting DSV control bits as channel bits fewer than the number of necessary DSV control bits to sustain the minimum run d and the number of necessary DSV control bits to sustain the maximum run k, there will be some cases in which the DSV control may not be executed.

In case of the RLL (1, 7) code with the parameters (d, k; m, n) set at (1, 7; 2, 3), the DSV control bits are converted into data on the basis of a conversion factor as follows:

4 channel bits×2/3=8/3=2.67

Thus, the DSV control bits are converted into 2.67-bit data (or 2.67 Tdata).

By the way, the DSV control bits are basically redundant bits. Thus, from the code-conversion-efficiency point of view, it is nice to reduce the number of DSV control bits by as large a quantity as possible.

In addition, it is also nice to prevent the minimum run d and the maximum run k from being changed due to insertion of DSV control bits. This is because a change in (d, k) will undesirably have an effect on recording and reproduction characteristics.

In case of an actual RLL code, however, it is absolutely necessary to abide by the minimum run. This is because the minimum run has a big effect on recording and reproduction characteristics. Nevertheless, it is not absolutely necessary to abide by the maximum run. Thus, in some cases, there is also a format making use of a pattern violating the maximum run in a synchronization pattern. For example, the maximum run of the 8-16 code use for the DVD (Digital Versatile Disk) is 11T. However, the synchronization pattern portion is provided with a run of 14T greater than the maximum run in order to increase a capability of detecting the synchronization pattern.

Taking what is explained above into consideration, inventors of the present invention earlier proposed a 1,7PP code having parameters (d, k)=(1, 7) and Table 2 as a table of modulation adopting a modulation method tailored to even higher recording densities. For more information, the reader is suggested to refer to documents such as Japanese Patent Laid-open No. Hei 11-346154.

TABLE 2

1, 7PP: (d, k; m, n; r) = (1, 7; 2, 3; 4)

| Data pattern | Code pattern |
| --- | --- |
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| 110111 | 001 000 000 (next 010) |
| 00001000 | 000 100 100 100 |
| 00000000 | 010 100 100 100 | if "xx1", then *0* = 000
"xx0", then *0* = 101
===============
Sync & termination:
01 001 000 000 001 000 000 001 (24 channel bits)
# = 0 indicates a sequence with no termination pattern.
# = 1 indicates a sequence with a termination pattern.

<Termination table>

| Data pattern | Code pattern |
| --- | --- |
| 00 | 000 |
| 0000 | 010 100 |

The row showing conversion patterns of "110111 001 000 000" (next 010) in the above modulation table means: When the next channel bits are "010", the data pattern of (110111) is converted into a code pattern of "001 000 000".

As shown in the modulation table given as Table 2, the modulation table includes data patterns to be converted into their respective code patterns. The data patterns to be converted into their respective code patterns include basic patterns, patterns to be replaced and termination patterns. The basic patterns are data patterns ranging from (11) to (000000). Without a basic pattern, the conversion process may not be carried out. The patterns to be replaced are the data patterns of (110111), (00001000) and (00000000). Even without a replacement pattern, a conversion process can be carried out. With a replacement pattern, however, an effective conversion process can be carried out. Shown on the left column of the termination table, the termination patterns of (00) and (0000) are each a pattern placed at any position in the data sequence to terminate the data sequence at the position.

In addition, the modulation table given as Table 2 for a minimum run d of 1 (d=1) and a maximum run k of 7 (k=7) includes indeterminate codes each including indeterminate bits each denoted by symbol * as bit elements of a code pattern corresponding to a basic pattern. The indeterminate bits of an indeterminate code are each determined to be a 0 or a 1 in order to abide by the minimum run d of 1 (d=1) and a maximum run k of 7 (k=7) without regard to the positions of the immediately preceding and immediately succeeding codes. To put it concretely, as is obvious from Table 2, if the 2-bit data pattern to be converted is (11), the code pattern of "*0*" selected for the 2-bit data pattern to be converted is "000" or "101", depending on the immediately preceding code sequence (or the channel bit sequence) To be more specific, the 2-bit data pattern of (11) is converted into the code pattern of "000" or "101", depending on the 1 bit of the immediately preceding code sequence (or the channel bit sequence). That is to say, if the 1 channel bit of the immediately preceding code sequence is "1" or the immediately preceding code sequence is "xx1", for example, the 2-bit data pattern of (11) is converted into the code pattern of "000" in order to abide by the minimum run d. If the 1 channel bit of the immediately preceding code sequence is "0" or the immediately preceding code sequence is "xx0", on the other hand, the 2-bit data pattern of (11) is converted into the code pattern of "101" in order to abide by the maximum run k.

The basic patterns included in the modulation table given as Table 2 have a variable-length structure. For the restrain length i set at 1 (i=1), the basic patterns are associated with 3 code patterns, i. e., "*0*", "001" and "010", which are fewer than the required pattern count of 4 (=2^m=2^2=4). Thus, with only the restrain length i set at 1 (i=1) in a process to convert a data sequence, there may be a data sequence that may not be converted into a code sequence. In the end, in a process convert all data sequences, it is necessary to refer to basic patterns for all restrain lengths including a restrain length i of 3 (i=3) in order for the modulation table given as Table 2 to be available as a modulation table.

In addition, the modulation table given as Table 2 also includes a replacement pattern of (110111) to be converted (or replaced) as a pattern for controlling the succession of minimum runs d. The replacement data pattern of (110111) is converted into a code pattern as follows. If the data pattern is (110111), the following code word sequence is referred to. If the following code word sequence is "010", the 6-bit data pattern of (110111) is converted into a code pattern of "001 000 000". If the following code word sequence is not "010", on the other hand, the data pattern of (110111) is replaced with a data pattern of ((11, (01), (11)) having 2-bit data units. Eventually, the data pattern of ((11, (01), (11)) is converted into a code word of "*0* 010 *0*". Thus, in the code word sequence obtained as a result of converting the data, the succession of minimum runs d is restricted. That is to say, the minimum run can be repeated up to six times at the most.

In the modulation table given as Table 2, the maximum restrain length r is 4 (r=4). Patterns provided with a restrain length i set at 4 (i=4) as patterns to be converted include the patterns to be replaced as patterns for realizing a maximum run k of 7 (k=7). The patterns for realizing a maximum run k of 7 (k=7) are each referred to hereafter as a maximum-run assuring pattern. The patterns for realizing a maximum run k of 7 (k=7) are a data pattern of (00001000) and a data pattern of (00000000). The data pattern of (00001000) is converted into a code pattern of "000 100 100 100" whereas the data pattern of (00000000) is converted into a code pattern of "010 100 100 100". Also in this case, the minimum run d of 1 (d=1) is obeyed.

In addition, the modulation table given as Table 2 also includes data patterns of (00) and (0000) to be located at any termination positions in a data sequence as termination patterns immediately preceding a synchronization pattern. A termination pattern located at any termination position in a data sequence is used to terminate the data sequence at the position. The 1-bit code word at the head of an inserted synchronization pattern is a bit indicating whether or not a termination pattern has been used. That is to say, if a termination pattern has been used, the 1-bit code word at the head of an inserted synchronization pattern sequence immediately following the termination pattern is set at "1". If no termination pattern has been used, on the other hand, the 1-bit code word at the head of an inserted synchronization pattern sequence immediately following the termination pattern is set at "0". It is to be noted that the synchronization pattern in the modulation table given as Table 2 includes the 1-bit code word located at the head of the synchronization pattern sequence as a bit indicating whether or not a termination pattern has been used at a location immediately preceding the synchronization pattern and a code pattern repeated twice to create a synchronization detection pattern as a code pattern for a maximum run k set at 8 (k=8) greater than the maximum run k of 7 (k=7). Thus, the synchronization pattern is a code word having a total of 24 channel bits.

By the way, the modulation table given as Table 2 establishes a conversion rule for conversion patterns each provided on a row as a pattern pair consisting of a data pattern and a code pattern. In accordance with the conversion rule, a remainder obtained as a result of an operation to divide the number of 1s included as bit elements in a data pattern serving as a pattern to be converted into a code pattern by 2 and a remainder obtained as a result of an operation to divide the number of 1s included as bit elements in the code pattern resulting from the conversion process by 2 are both 1 or 0. The remainder of 1 indicates that both the number of 1s included in the data pattern and the number of 1s included in the data pattern are odd. On the other hand, the remainder of 0 indicates that both the number of 1s included in the data pattern and the number of 1s included in the data pattern are even. For example, a data pattern of (000001) corresponds to a code pattern of "010 100 100". In this case, the number of 1s included as bit elements in the data pattern is 1 while the number of 1s included as bit elements in the code pattern is three. If the number of 1s included as bit elements in the data pattern and the number of 1s included as bit elements in the code pattern are divided by 2, the remainders obtained as a result of the division operations agree with each other, being both equal to 1 indicating that both the number of 1s included in the data pattern and the number of 1s included in the code pattern are odd. As another example, a data pattern of (000000) corresponds to a code pattern of "010 100 000". In this case, the number of 1s included as bit elements in the data pattern is 0 while the number of 1s included as bit elements in the code pattern is 2. If the number of 1s included as bit elements in the data pattern and the number of 1s included as bit elements in the code pattern are divided by 2, the remainders obtained as a result of the division operations agree with each other, being both equal to both 0 indicating that both the number of 1s included in the data pattern and the number of 1s included in the code pattern are even.

As described above, the modulation table given as Table 2 includes only conversion patterns forming pattern pairs each consisting of a data pattern and a code pattern wherein a remainder obtained as a result of an operation to divide the number of 1s included in the data pattern agrees with a remainder obtained as a result of an operation to divide the number of 1s included in the code pattern are both 0 or 1, indicating that the number of is included in the data pattern and the number of 1s included in the code pattern are both even or odd. Such a pair of data and code patterns is referred to as a pair of even/odd-characteristic retaining conversion patterns. That is to say, the modulation table given as Table 2 does not include conversion patterns forming pattern pairs each consisting of a data pattern and a code pattern wherein a remainder obtained as a result of an operation to divide the number of 1s included in the data pattern does not agree with a remainder obtained as a result of an operation to divide the number of 1s included in the code pattern. Such a pair of data and code patterns is referred to as a pair of even/odd-characteristic retention violating conversion patterns.

Next, a method of executing the DSV control is described. DSV control is not executed for conversion patterns of a modulation table such as Table 1 for the RLL (1, 7) code. In this case, the existing DSV control is executed typically by modulating the data sequence and then adding at least (d+1) DSV control bits at predetermined intervals to a channel bit sequence obtained as a result of the modulation process. Much like the existing DSV control, DSV control can be executed for conversion patterns of the modulation table given as Table 2. However, the DSV control can be executed with an even higher degree of efficiency by making use of relations between the data patterns and the code patterns. That is to say, with Table 2 establishing a conversion rule in accordance with which a remainder obtained as a result of an operation to divide the number of 1s included as bit elements in a data pattern serving as a pattern to be converted into a code pattern by 2 and a remainder obtained as a result of an operation to divide the number of 1s included as bit elements in the code pattern resulting from the conversion process by 2 are both 1 or 0, an operation to insert a DSV control bit of 1 indicating inversion or 0 indicating non-inversion into the channel bit sequence as described earlier is equivalent to an operation to insert respectively a DSV control bit of 1 for inversion or 0 for non-inversion into the data bit sequence.

For example, in the modulation table given as Table 2, 3 data bits to be converted are (001) immediately preceding a DSV control bit behind the data bits. In this case, the data can be represented by a pattern of (001-x), where symbol x denotes 1 bit having the value of 0 or 1. For x=0, the data pattern is (0010) and included in the modulation table given as Table 2 as follows.

| Data pattern | Code pattern |
| --- | --- |
| 0010 | 010 000 |

In this case, the data pattern of (0010) is converted into a code pattern of "010 000".

For x=1, on the other hand, the data pattern is (0010) and included in the modulation table given as Table 2 as follows.

| Data pattern | Code pattern |
|---|---|
| 0011 | 010 100 |

In this case, the data pattern of (0011) is converted into a code pattern of "010 100". Then, a code patterns obtained as a result of conversion is subjected to an NZRI modulation process in order to generate a level code sequence as follows:

| Data pattern | Code pattern | Level code sequence |
|---|---|---|
| 0010 | 010 000 | 011111 |
| 0011 | 010 100 | 011000 |

The last 3 bits in one of the level code sequences are obtained by inversion of the last 3 bits in the other level code sequences. The result implies that by selecting the DSV control bit 0 or 1, the DSV control can be executed inside the data sequences.

If redundancy of the DSV control is taken into consideration, execution of the DSV control by making use of 1 bit in a data sequence corresponds to execution of DSV control by making use of 1.5 bits added to the channel bit sequence due to the fact that the conversion factor m/n of the modulation table given as Table 2 is 2/3 (that is, m:n=2:3). In order to execute DSV control for the RLL (1, 7) code modulation table like the one shown as Table 1, on the other hand, it is necessary to execute the DSV control for the channel bit sequence. Thus, in comparison with the DSV control for the modulation table given as Table 2, the degree of redundancy undesirably increases. In other words, by executing DSV control within the data sequence in the structure of the modulation table given as Table 2, the DSV control can be executed with a high degree of efficiency.

The modulation table given as Table 2 for a code provided with a minimum run r of 1 and a maximum run d of 7 ((d, k)=1, 7)) as a code to be recorded onto a recording medium having a high recording density is used as a table for creating a recording format in, among others, Blu-ray Disc ReWritable ver 1.0 (a trademark of a high-density optical disk system).

A more stable system is expected as a system that can be implemented by also adoption of a modulation method for future higher-density recording. To put it concretely, such a more stable modulation system is expected for, among others, higher-density specifications set for high-density optical disks.

In this case, if it is possible to realize a modulation method for implementing a more stable system as a modulation system realizable by making use of the configuration of a similar modulation table for a code having the same parameters as those of the existing (1, 7) PP code for Blu-ray Disc ReWritable ver 1.0, which has already been made available in the market as a commercial product, the existing design technology can be applied. Thus, it is possible to reduce the number of design risks encountered in the process to design hardware for realizing the modulation system.

SUMMARY OF THE INVENTION

By the way, we may conceivably need to limit the succession of minimum runs in a modulation table by making use not only even/odd-characteristic retaining conversion patterns but also even/odd-characteristic retention violating conversion patterns. Since the DSV control may not be executed on even/odd-characteristic retention violating conversion patterns, however, it is necessary to carry out a conversion process (or a replacement process) on a member included in the input data sequence as a member located at a sequence-inside position, into which DSV control bits are inserted. By carrying out a conversion process (or a replacement process) on such a member, however, it becomes difficult to execute the DSV control on the DSV control segment of the member. As a result of the conversion process carried out in this. way, a conversion pattern not subjected to DSV control may be output.

Addressing the problems described above, inventors of the present invention have innovated a modulation apparatus that allows the DSV control to be executed with a high degree of reliability even if even/odd-characteristic retention violating conversion patterns are used.

In accordance with a first embodiment of the present invention, there is provided a modulation apparatus including:

first conversion means for converting a portion included in processed data as a portion matching a first data pattern into a first code pattern in accordance with a first table associating an even/odd-characteristic retaining conversion pattern used as the first data pattern with the first code pattern;

second conversion means for converting a portion included in processed data as a portion matching a second data pattern into a second code pattern in accordance with a second table associating an even/odd-characteristic retention violating conversion pattern used as the second data pattern with the second code pattern; and select means for selecting either the first code pattern or the second code pattern, wherein, if a DSV control bit has been inserted into the processed data, a process carried out by the second conversion means to convert the portion into the second code pattern is inhibited.

It is possible to provide a configuration in which the modulation apparatus further employs first processing control means for make use of information on a position, into which a DSV control bit is inserted, in order to generate control information to be used by the select means to select either the first code pattern or the second code pattern wherein the select means selects either the first code pattern or the second code pattern on the basis of the control information.

It is possible to provide the modulation apparatus with a configuration in which the first processing control means produces a result of determination as to whether a DSV control bit has been inserted into the processed data on the basis of information indicating that the second conversion means is allowed to carry out a conversion process and the information on a position, into which a DSV control bit is inserted, and generates the control information on the basis of the result of the determination.

It is possible to provide the modulation apparatus with a configuration in which the first processing control means generates the control information also on the basis of information received from an external source.

It is possible to provide the modulation apparatus with a configuration in which the a process carried out by the second conversion means to convert a portion included in processed data as a portion matching the second data pattern into the second code pattern is a conversion process of limiting the succession of minimum runs.

It is possible to provide a configuration in which the modulation apparatus further employs second processing control means for changing the control information generated by the first processing control means on the basis of a result of detecting a frequency of using the code pattern not included in another table with which reproduction compatibility is sustained wherein the select means selects either the first code pattern or the second code pattern on the basis of the control information changed by the second processing control means.

It is possible to provide the modulation apparatus with a configuration in which the code patterns, the usage frequency of each of which is detected, include the even/odd-characteristic retaining conversion pattern listed in the first table as a code pattern and the even/odd-characteristic retention violating conversion pattern listed in the second table as a code pattern.

It is possible to provide the modulation apparatus with a configuration in which the second processing control means changes the control information generated by the first processing control means so as to allow a process to be carried out to produce the code pattern if a detected usage frequency of the code pattern is not greater than a predetermined reference value, or the second processing control means changes the control information generated by the first processing control means so as to disallow the process to produce the code pattern if a detected usage frequency of the code pattern is greater than the predetermined reference value.

It is possible to provide the modulation apparatus with a configuration in which the second processing control means sets the reference value at a value limited to a range allowing errors to be corrected.

It is possible to provide the modulation apparatus with a configuration in which the second processing control means detects a usage frequency in an ECC block of the code pattern and limits the reference value to such values in the range allowing errors to be corrected in the ECC block that the detected usage frequency does not exceed the reference value.

It is possible to provide the modulation apparatus with a configuration wherein the first table is a table corresponding to the other table with which reproduction compatibility is sustained.

It is possible to provide the modulation apparatus with a configuration wherein, as a table corresponding to the other table with which reproduction compatibility is sustained, the first table includes all contents of a basic conversion table.

It is possible to provide the modulation apparatus with a configuration wherein, as a table corresponding to the other table with which reproduction compatibility is sustained, the first table includes a replacement/conversion table in addition to all the contents of the basic conversion table.

It is possible to provide the modulation apparatus with a configuration in which a signal modulated by the modulation apparatus can be recorded onto a recording medium.

In accordance with a second embodiment of the present invention, there is provided a modulation method or a program implementing the modulation method including:

a first conversion step of converting a portion included in processed data as a portion matching a first data pattern into a first code pattern in accordance with a first table associating an even/odd-characteristic retaining conversion pattern used as the first data pattern with the first code pattern;

a second conversion step of converting a portion included in processed data as a portion matching a second data pattern into a second code pattern in accordance with a second table associating an even/odd-characteristic retention violating conversion pattern used as the second data pattern with the second code pattern; and a select step of selecting either the first code pattern or the second code pattern, whereby, if a DSV control bit has been inserted into the processed data, a process carried out at the second conversion step to convert the portion into the second code pattern is inhibited.

It is possible to provide a configuration in which the program is recorded on a recording medium.

In accordance with the embodiments of the present invention:

a portion included in processed data as a portion matching a first data pattern is converted into a first code pattern in accordance with a first table associating an even/odd-characteristic retaining conversion pattern used as the first data pattern with the first code pattern;

a portion included in processed data as a portion matching a second data pattern is converted into a second code pattern in accordance with a second table associating an even/odd-characteristic retention violating conversion pattern used as the second data pattern with the second code pattern; and if a DSV control bit has been inserted into the processed data, a process to convert a portion included in the processed data as a portion matching the second data pattern into the second code pattern is inhibited.

In accordance with the embodiments of the present invention, the DSV control can be executed with a high degree of reliability even if even/odd-characteristic retention violating conversion patterns are used.

BRIEF DESCRIPTION OF THE DRAWINGS

FIG. 28 is a block diagram showing the configuration of a personal computer.

DETAILED DESCRIPTION OF THE PREFERRED EMBODIMENTS

Before preferred embodiments of the present invention are explained, relations between disclosed configuration elements of the present invention and the embodiments described in this specification and/or shown in figures are explained in the following comparative description. It is to be noted that the following comparative description merely confirms that the embodiments supporting the present invention are described in this specification and/or shown in the figures. Thus, even if there is an embodiment described in this specification and/or shown in any of the figures but not included in the following comparative description as an embodiment corresponding to a configuration element of the present invention, such an embodiment is not to be interpreted as an embodiment not corresponding to a configuration element of the present invention. Conversely speaking, an embodiment included in the following comparative description as an embodiment corresponding to a specific configuration element of the present invention is not to be interpreted as an embodiment not corresponding to a configuration element other than the specific configuration element of the present invention.

Figure 1:
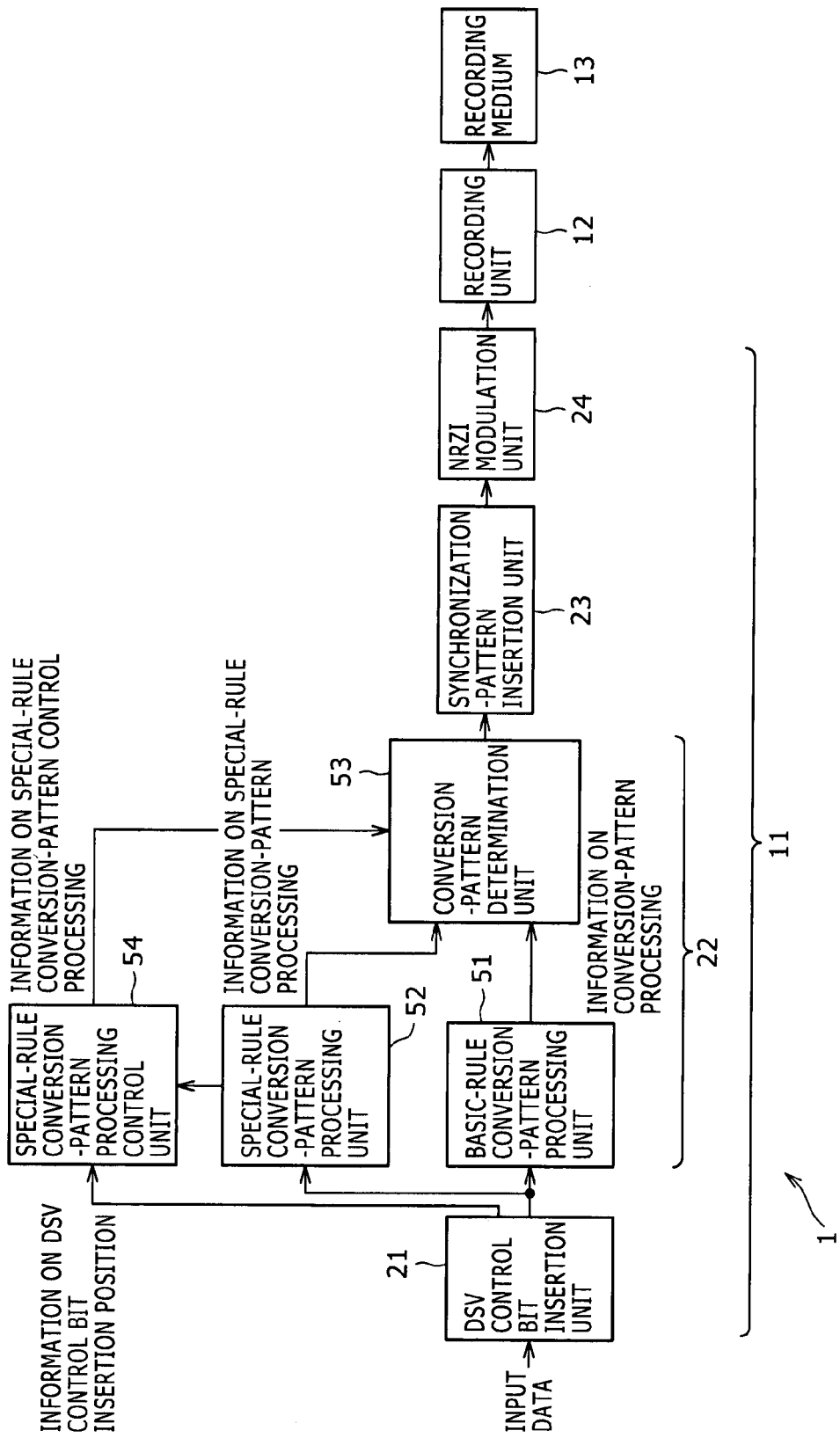
FIG. 1 is a block diagram showing an embodiment implementing a modulation apparatus according to the present invention.

In accordance with a first embodiment of the present invention, there is provided a modulation apparatus (such as a modulation apparatus 1 shown in FIG. 1) including:

first conversion means (such as a basic-rule conversion-pattern processing unit 51 employed in the modulation apparatus 1 shown in FIG. 1) for converting a portion included in processed data as a portion matching a first data pattern into a first code pattern in accordance with a first table associating an even/odd-characteristic retaining conversion pattern used as the first data pattern with the first code pattern;

second conversion means (such as a special-rule conversion-pattern processing unit 52 employed in the modulation apparatus 1 shown in FIG. 1) for converting a portion included in processed data as a portion matching a second data pattern into a second code pattern in accordance with a second table associating an even/odd-characteristic retention violating conversion pattern used as the second data pattern with the second code pattern; and select means (such as a conversion-pattern determination unit 53 employed in the modulation apparatus 1 shown in FIG. 1) for selecting either the first code pattern or the second code pattern, wherein, if a DSV control bit has been inserted into the processed data, a process carried out by the second conversion means to convert the portion into the second code pattern is inhibited.

Figure 8:
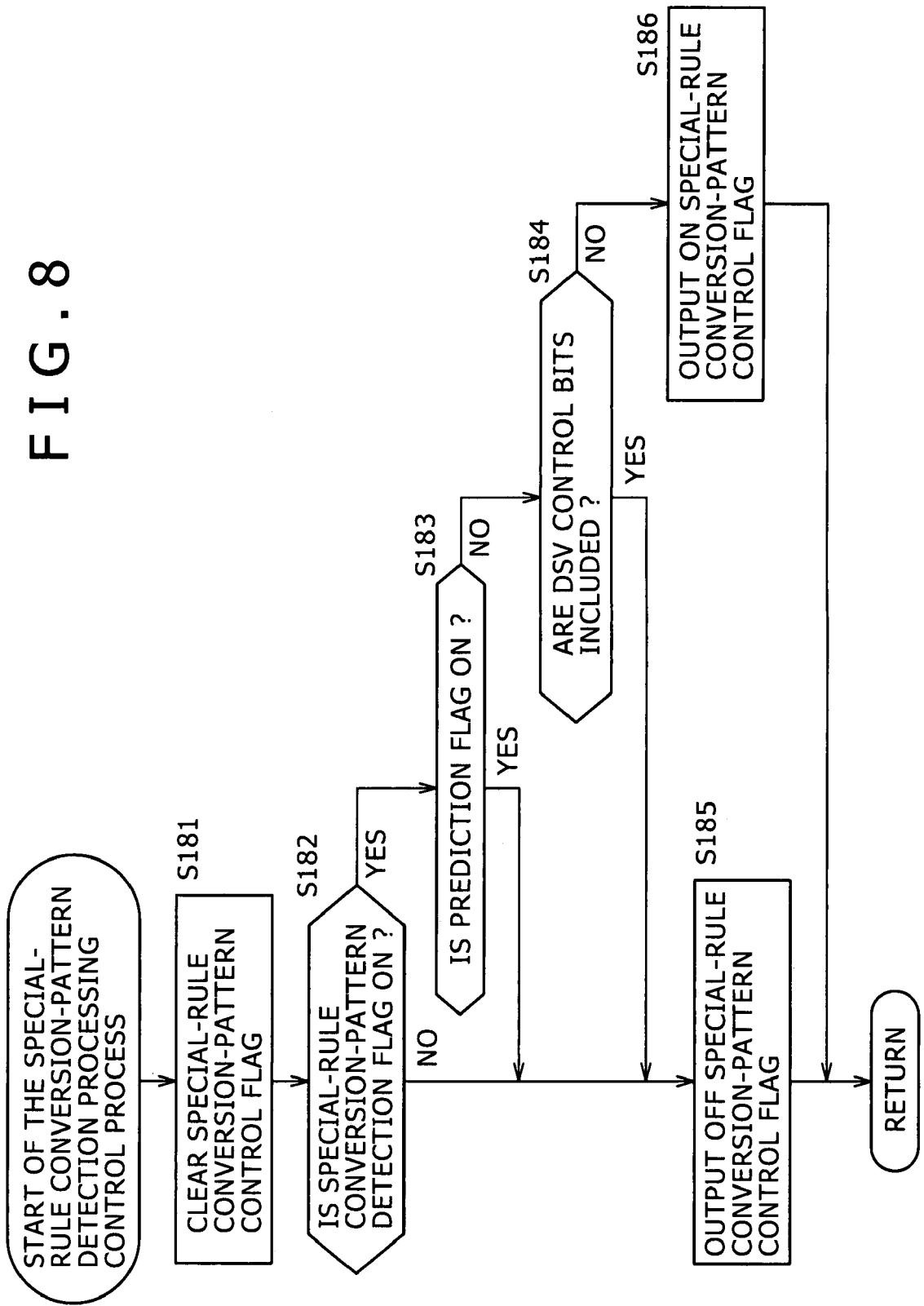
FIG. 8 shows a flowchart to be referred to in explanation of processing carried out at a step S6 of the flowchart shown in FIG. 4 to control a special-rule conversion-pattern process.

It is possible to provide a configuration in which the modulation apparatus further employs first processing control means (such as a special-rule conversion-pattern processing control unit 54 employed in the modulation apparatus 1 shown in FIG. 1) for making use of information on a position, into which a DSV control bit is inserted, in order to generate control information (such as a special-rule conversion-pattern control flag output in processes carried out at steps S185 and S186 of a flowchart shown in FIG. 8) to be used by the select means to select either the first code pattern or the second code pattern wherein the select means selects either the first code pattern or the second code pattern on the basis of the control information.

It is possible to provide the modulation apparatus with a configuration in which the first processing control means produces a result of determination (for example, in processes carried out at steps S182 to S184 of the flowchart shown in FIG. 8) as to whether a DSV control bit has been inserted into the processed data on the basis of information (such as a determination result produced in a process carried out at a step S182 of the flowchart shown in FIG. 8 as a result indicating that a special-rule conversion-pattern detection flag is in an on state and a determination result produced in a process carried out at a step S183 of the flowchart shown in FIG. 8 as a result indicating that a prediction flag is in an off state) indicating that the second conversion means is allowed to carry out a conversion process and the information (such as DSV control bit insertion information output by a DSV control bit insertion unit 21 employed in the modulation apparatus 1 shown in FIG. 1 to the special-rule conversion-pattern processing control unit 54 employed in the modulation apparatus 1 shown in FIG. 1 as information indicating a position, into which a DSV control bit is inserted) on a position, into which a DSV control bit is inserted, and generates the control information on the basis of the result of the determination (for example, in processes carried out at steps S185 and S186 of the flowchart shown in FIG. 8).

Figure 14:
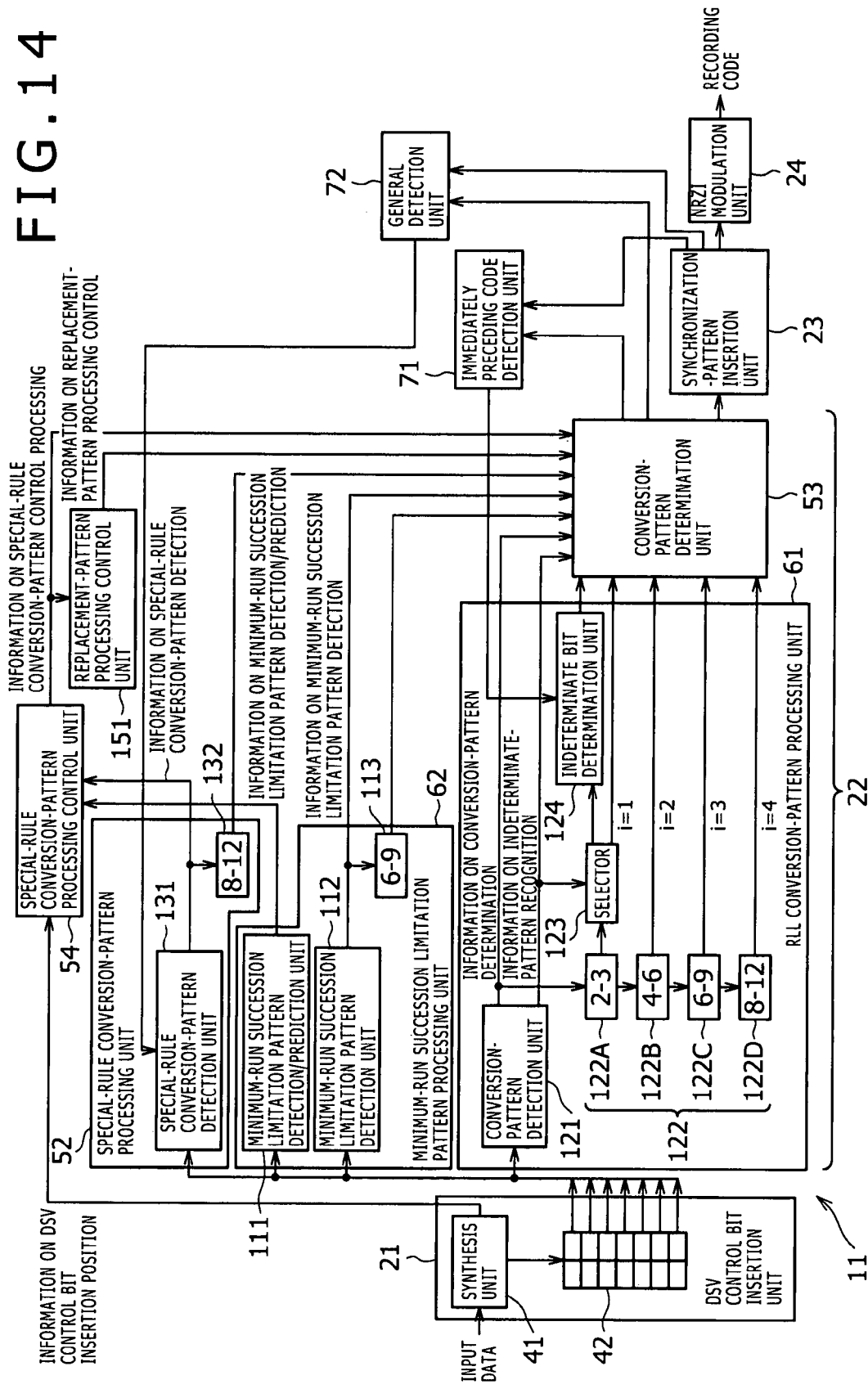
FIG. 14 is a block diagram showing another embodiment implementing the modulation apparatus according to the present invention.
Figure 16:
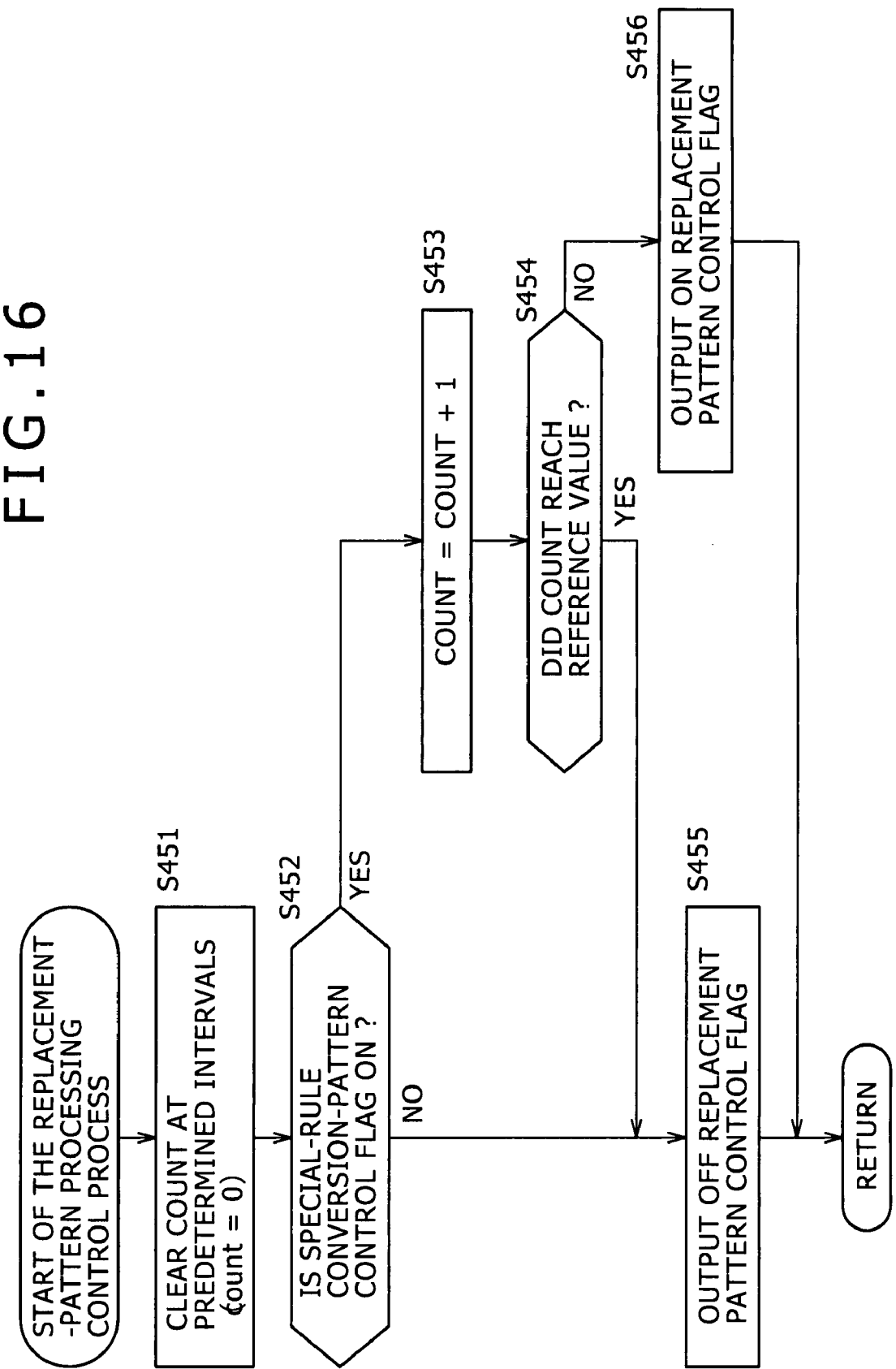
FIG. 16 shows a flowchart to be referred to in explanation of processing carried out at a step S407 of the flowchart shown in FIG. 15 to control a replacement-pattern process.
Figure 17:
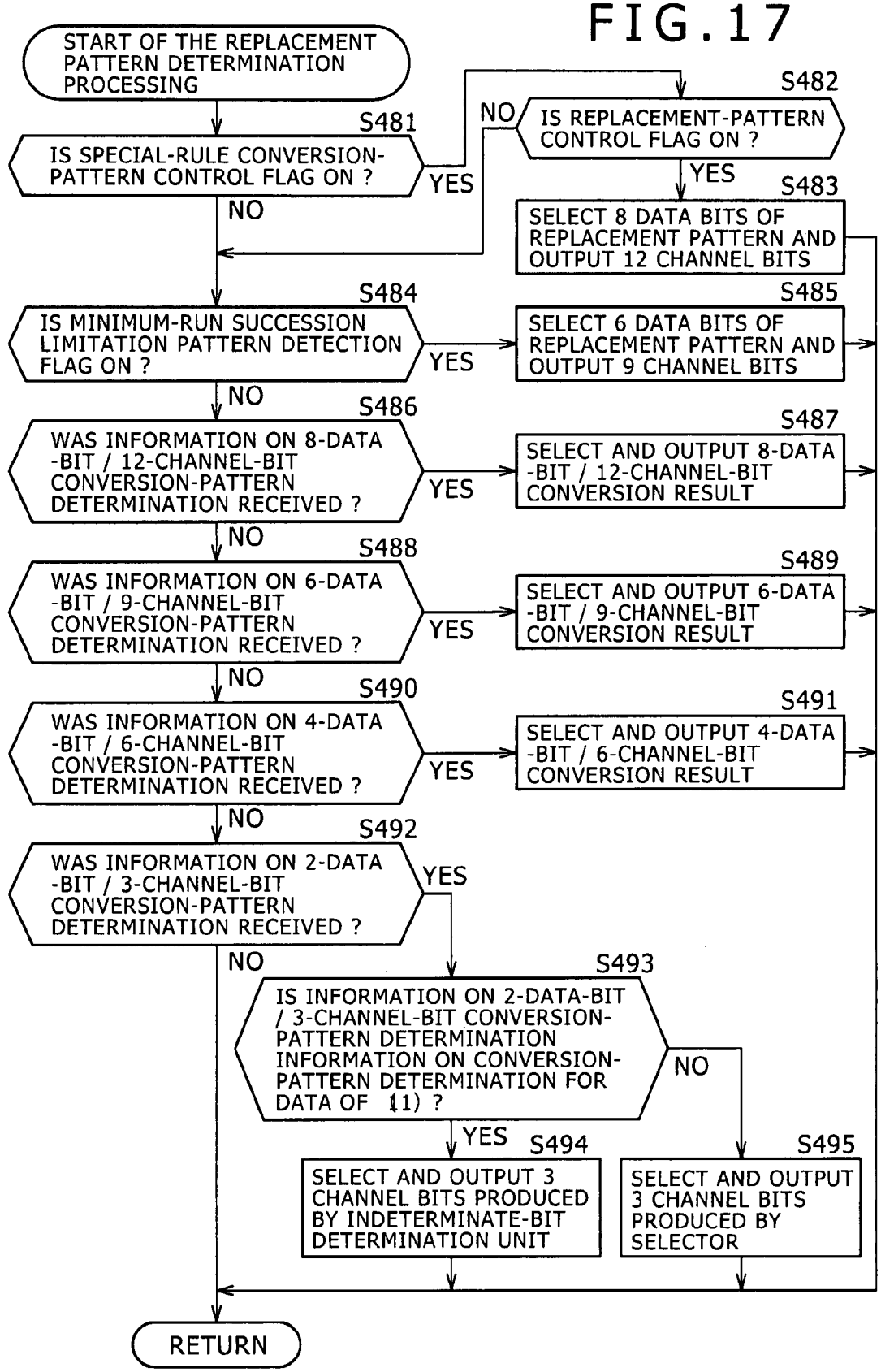
FIG. 17 shows a flowchart to be referred to in explanation of processing carried out at a step S409 of the flowchart shown in FIG. 15 to detect a conversion pattern.
Figure 18:
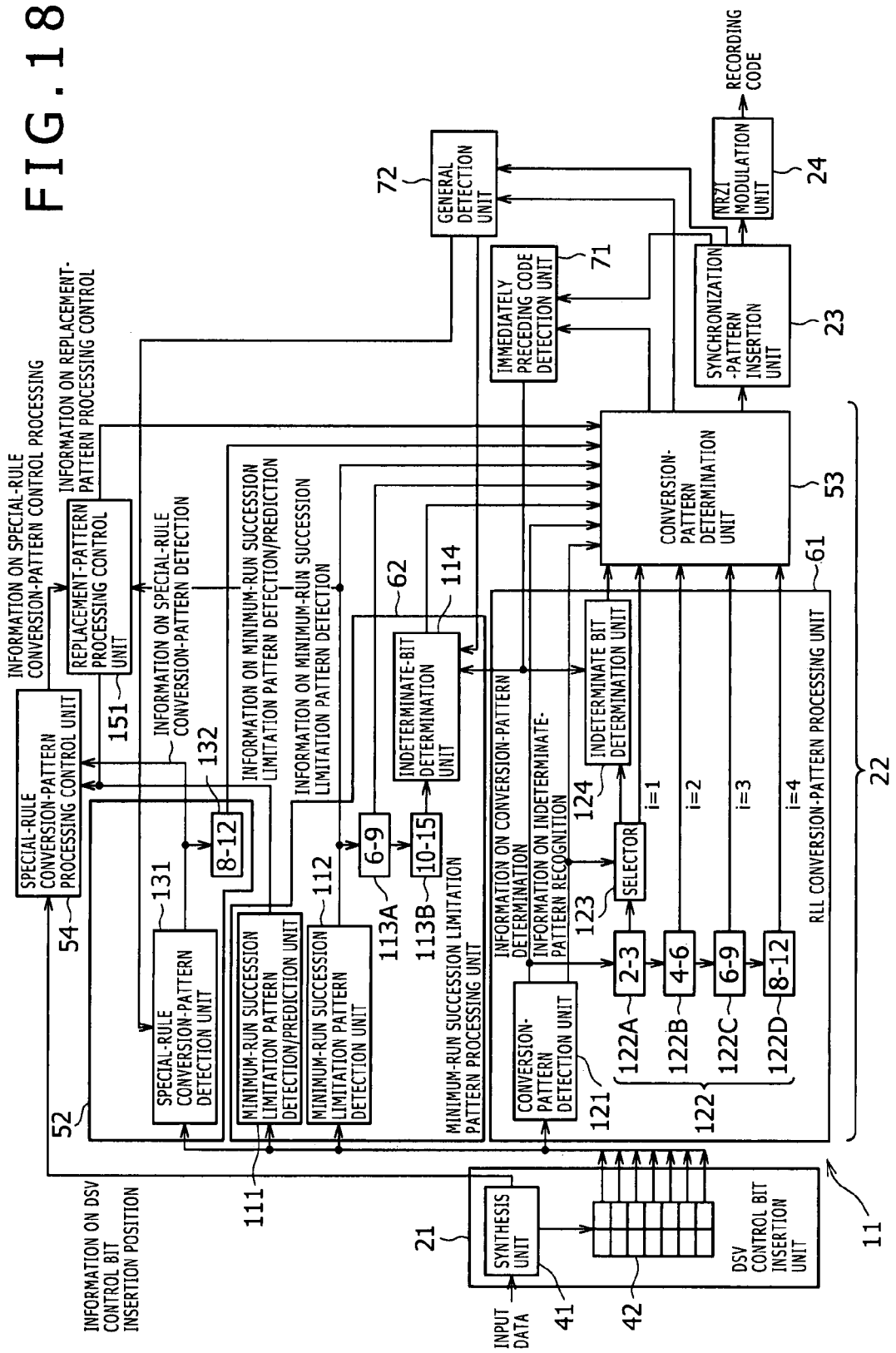
FIG. 18 is a block diagram showing a further embodiment implementing the modulation apparatus according to the present invention.
Figure 25:
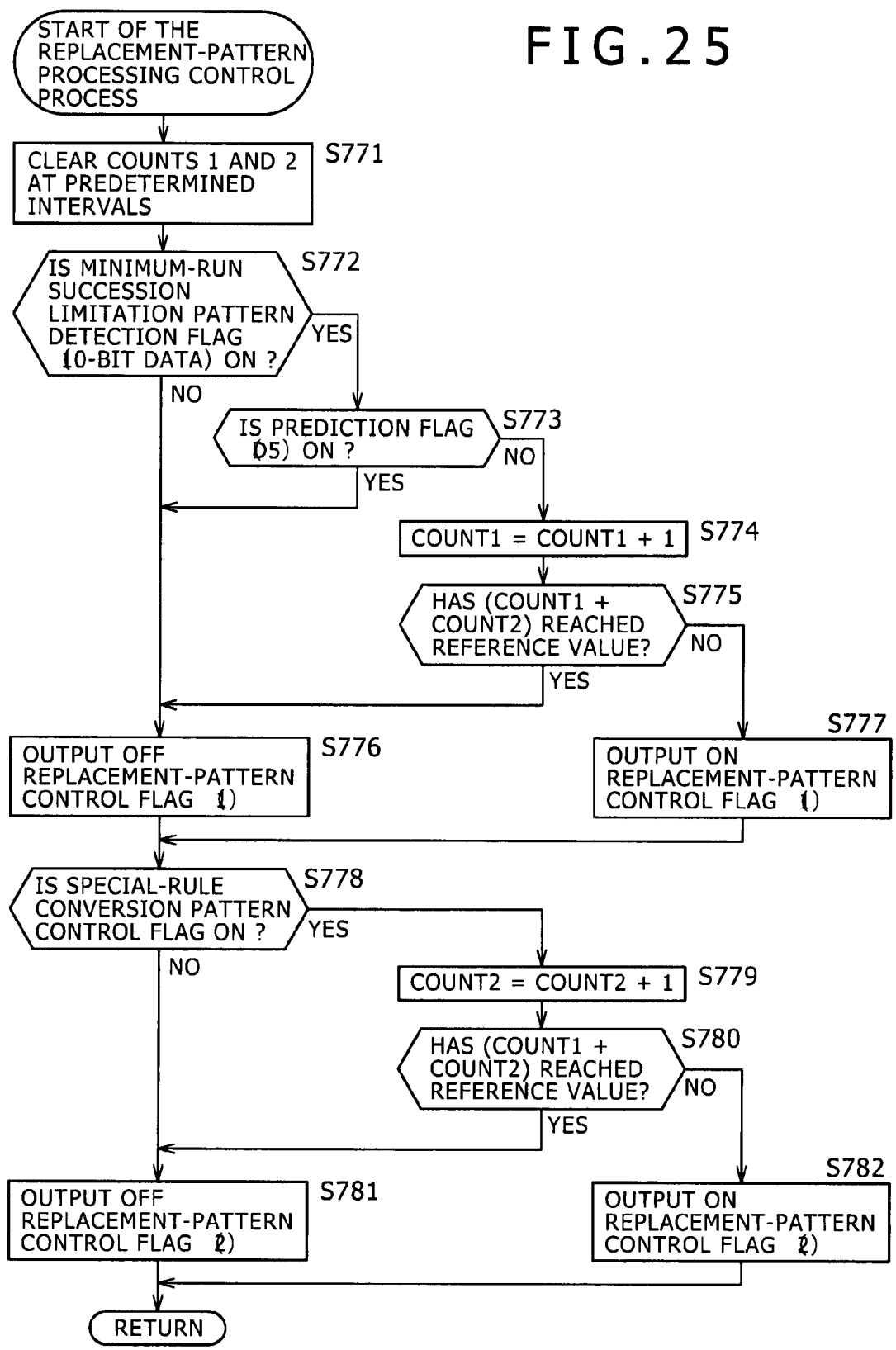
FIG. 25 shows a flowchart to be referred to in explanation of processing carried out at a step S607 of the flowchart shown in FIG. 19 to control a replacement-pattern process.
Figure 27:
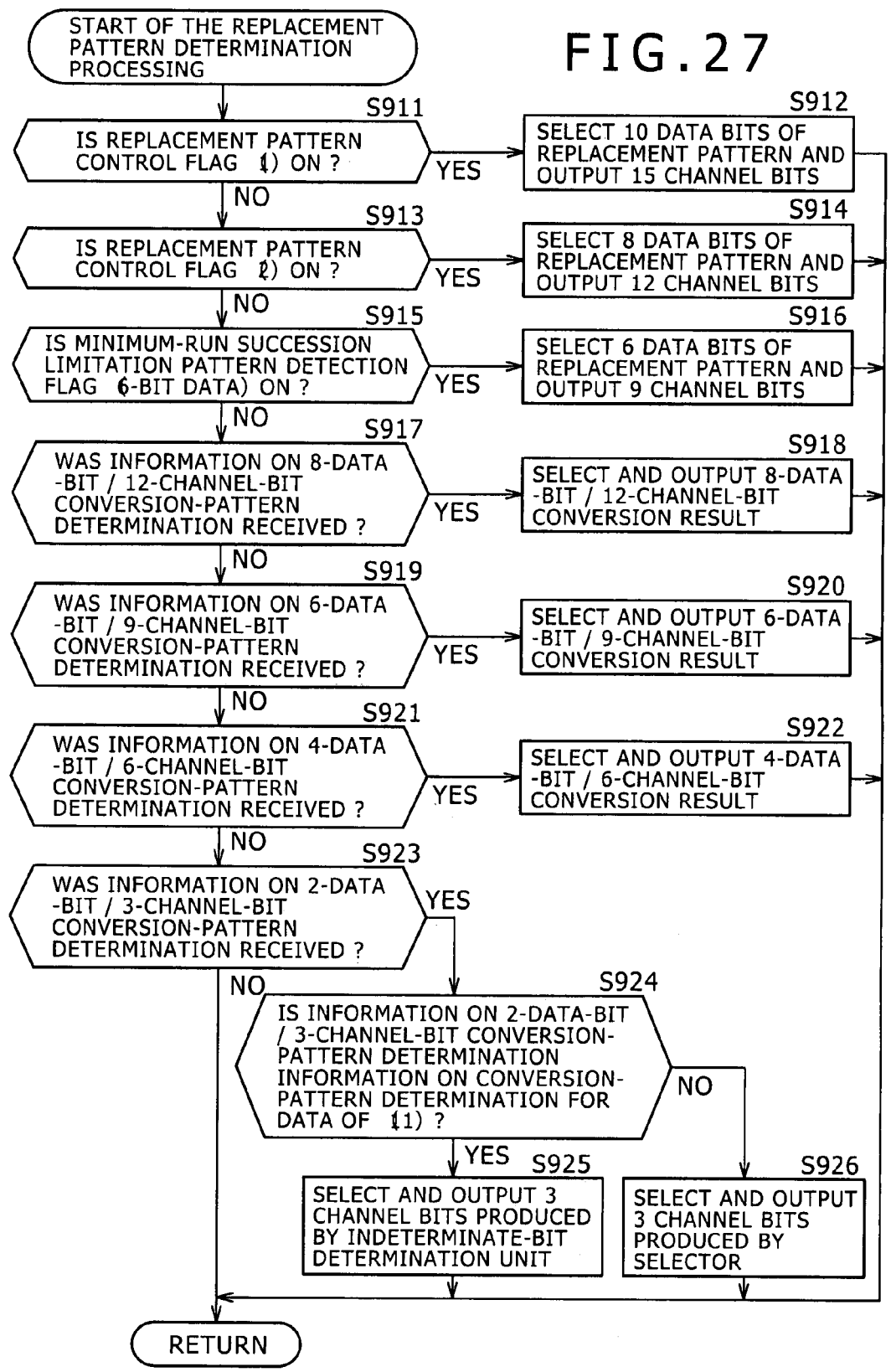
FIG. 27 shows a flowchart to be referred to in explanation of processing carried out at a step S609 of the flowchart shown in FIG. 19 to determine a conversion pattern.

It is possible to provide a configuration in which the modulation apparatus further employs second processing control means (such as a replacement-pattern processing control unit 151 shown in FIGS. 14 and 18) for changing the control information generated by the first processing control means (for example, by outputting a replacement pattern control flag in processes carried out at steps S455 and S456 of a flowchart shown in FIG. 16, outputting a replacement pattern control flag (1) in processes carried out at steps S776 and S777 of a flowchart shown in FIG. 25 or outputting a replacement pattern control flag (2) in processes carried out at steps S781 and S782 of the flowchart shown in FIG. 25) on the basis of a result of detecting a frequency of using the code pattern (such as a code pattern of "(pre 1) 010 000 000 101 (not 010)" associated with a data pattern of (01110111) for a restrain length i of 4 (i=4) as shown in the modulation table given as Table 4, a code pattern of "(pre 1) 010 000 000 101 (not 010)" associated with a data pattern of (01110111) for a restrain length i of 4 (i=4) as indicated in the modulation table given as Table 8 or a code pattern of "$0$ 010 000 000 101 (not 010)" associated with a data pattern of (1001110111) for a restrain length i of 5 (i=5)) not included in another table with which reproduction compatibility is sustained wherein the select means selects either the first code pattern or the second code pattern on the basis of the control information changed by the second processing control means (for example, in a process carried out at a step S482 of a flowchart shown in FIG. 17 or in processes carried out at steps S911 and S913 of a flowchart shown in FIG. 27).

It is possible to provide the modulation apparatus with a configuration in which the code patterns, the usage frequency of each of which is detected, include the even/odd-characteristic retaining conversion pattern (such as a code pattern of "$0$ 010 000 000 101 (not 010)" associated with a data pattern of (1001110111) for a restrain length i of 5 (i=5) as indicated in the modulation table given as Table 8) listed in the first table as a code pattern and the even/odd-characteristic retention violating conversion pattern (such as a code pattern of "(pre 1) 010 000 000 101 (not 010)" associated with a data pattern of (01110111) for a restrain length i of 4 (i=4) as indicated in the modulation tables shown as Tables 4 and 8) listed in the second table as a code pattern.

It is possible to provide the modulation apparatus with a configuration in which the second processing control means changes the control information generated by the first processing control means so as to allow a process to be carried out to produce the code pattern if a detected usage frequency of the code pattern is not greater than a predetermined reference value, or the second processing control means changes the control information generated by the first processing control means (for example, in processes carried out at steps S454 to S456 of a flowchart shown in FIG. 16 or processes carried out at steps S775 to S777 and S780 to S782 of a flowchart shown in FIG. 25) so as to disallow the process to produce the code pattern if a detected usage frequency of the code pattern is greater than the predetermined reference value.

Figure 3:
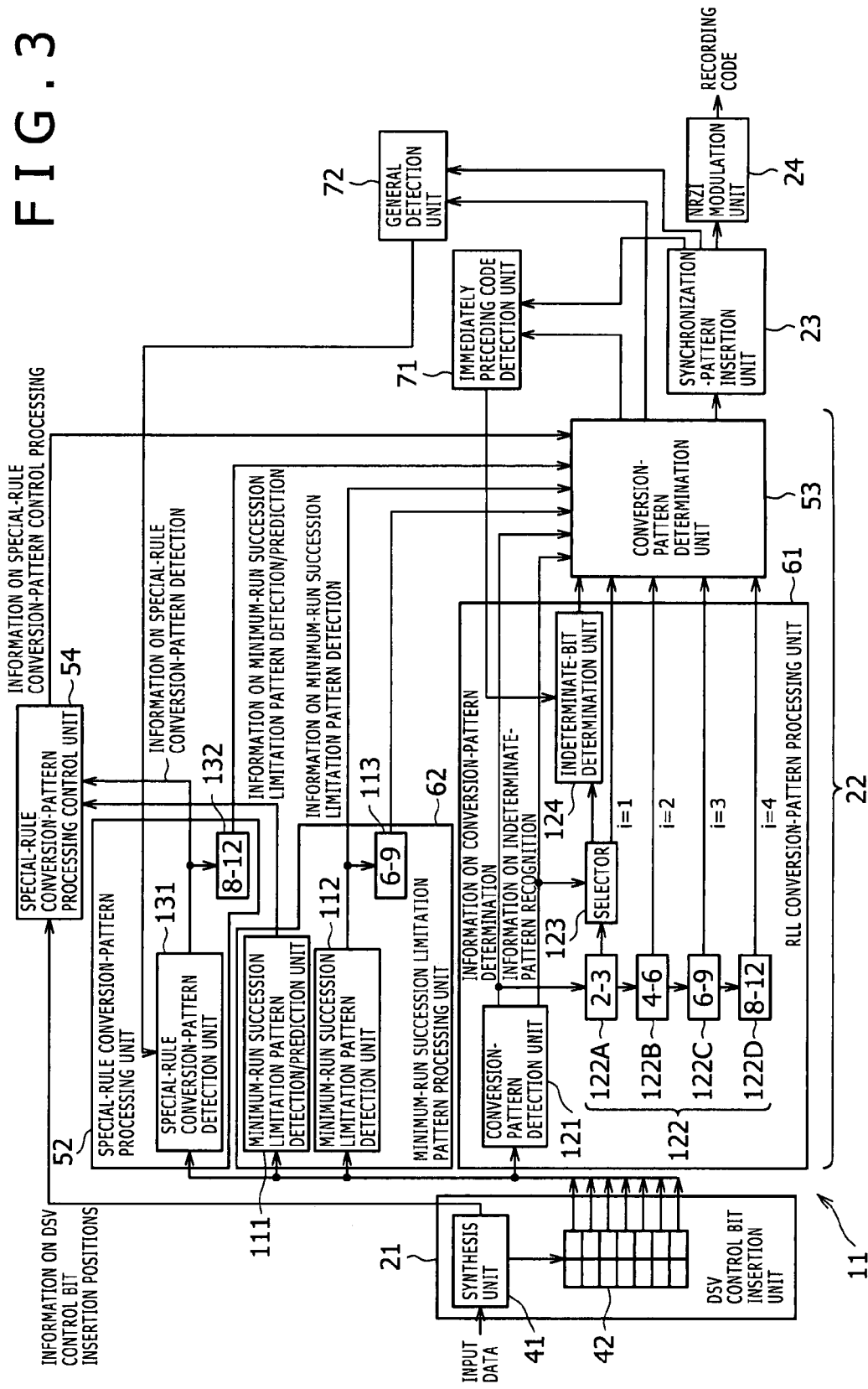
FIG. 3 is a block diagram showing a more detailed configuration of the coding apparatus shown in FIG. 2.

It is possible to provide the modulation apparatus with a configuration wherein the first table (such as conversion tables 122 or a minimum-run succession limitation table 113 or 113A shown in FIGS. 3, 14 and 18) is a table corresponding to the other table (such as a stable shown as Table 2) with which reproduction compatibility is sustained.

It is possible to provide the modulation apparatus with a configuration wherein, as a table corresponding to the other table with which reproduction compatibility is sustained, the first table (such as the conversion tables 122 shown in FIGS. 3, 14 and 18) includes all contents (such as a data pattern of (11) for a restrain length i of 1 (i=1) and a code pattern of "*0*" associated with the data pattern to a data pattern of (00000000) for a restrain length i of 4 (i=4) and a code pattern of "010 100 100 100" associated with the data pattern as indicated in the modulation table given as Table 3 or 9) of a basic conversion table.

It is possible to provide the modulation apparatus with a configuration wherein, as a table corresponding to the other table with which reproduction compatibility is sustained, the first table (such as a minimum-run succession limitation table 113 shown in FIG. 3, 14 or 18) includes a replacement/conversion table (such as a table including a data pattern of (110111) for a restrain length i of 3 (i=3) and a code pattern of "001 000 000 (next 010)" associated with the data pattern as indicated in the modulation table given as Table 3) in addition to all the contents of the basic conversion table.

Figure 4:
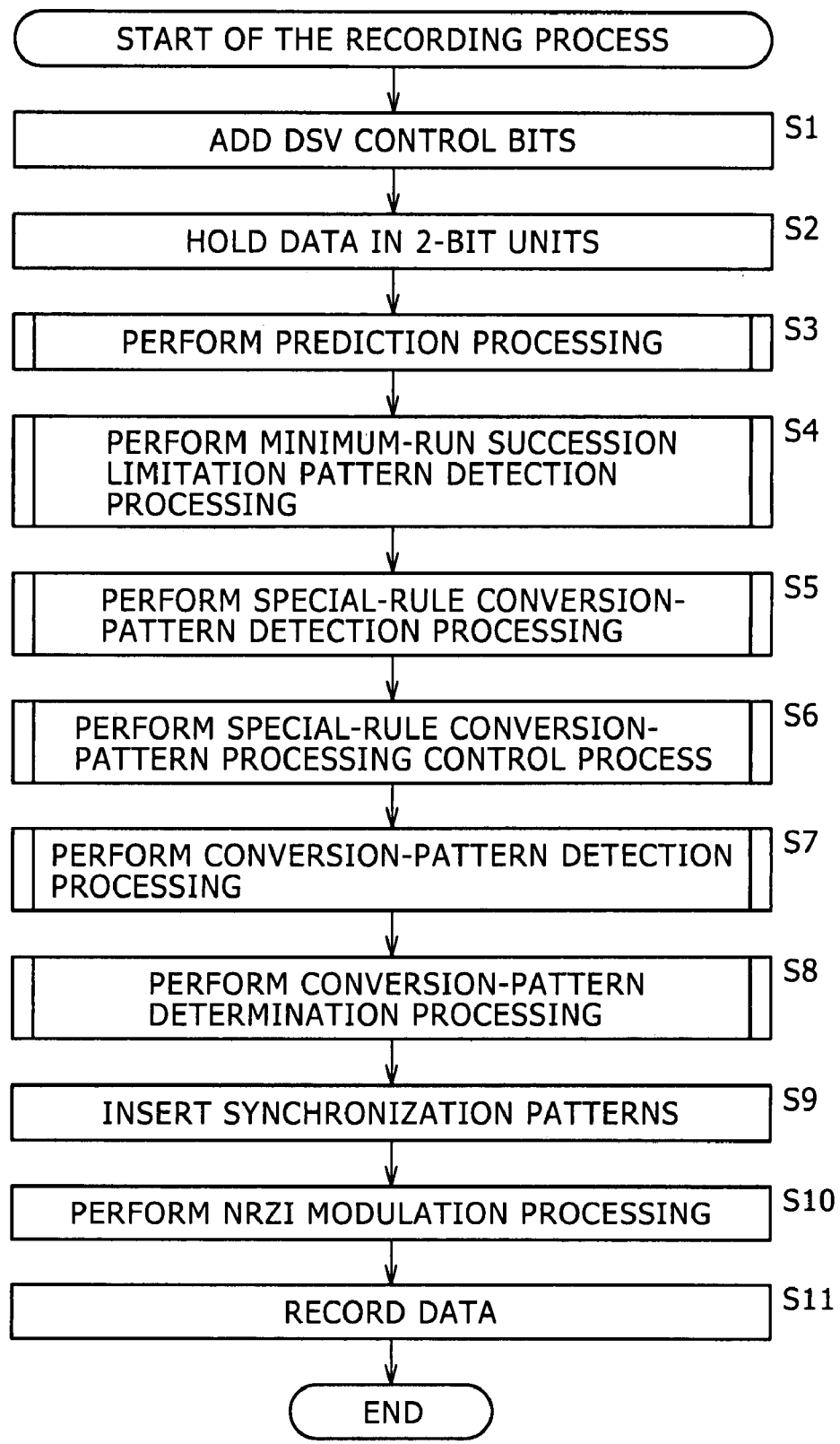
FIG. 4 shows a flowchart to be referred to in explanation of recording operations carried out by the embodiment shown in FIG. 3.
Figure 15:
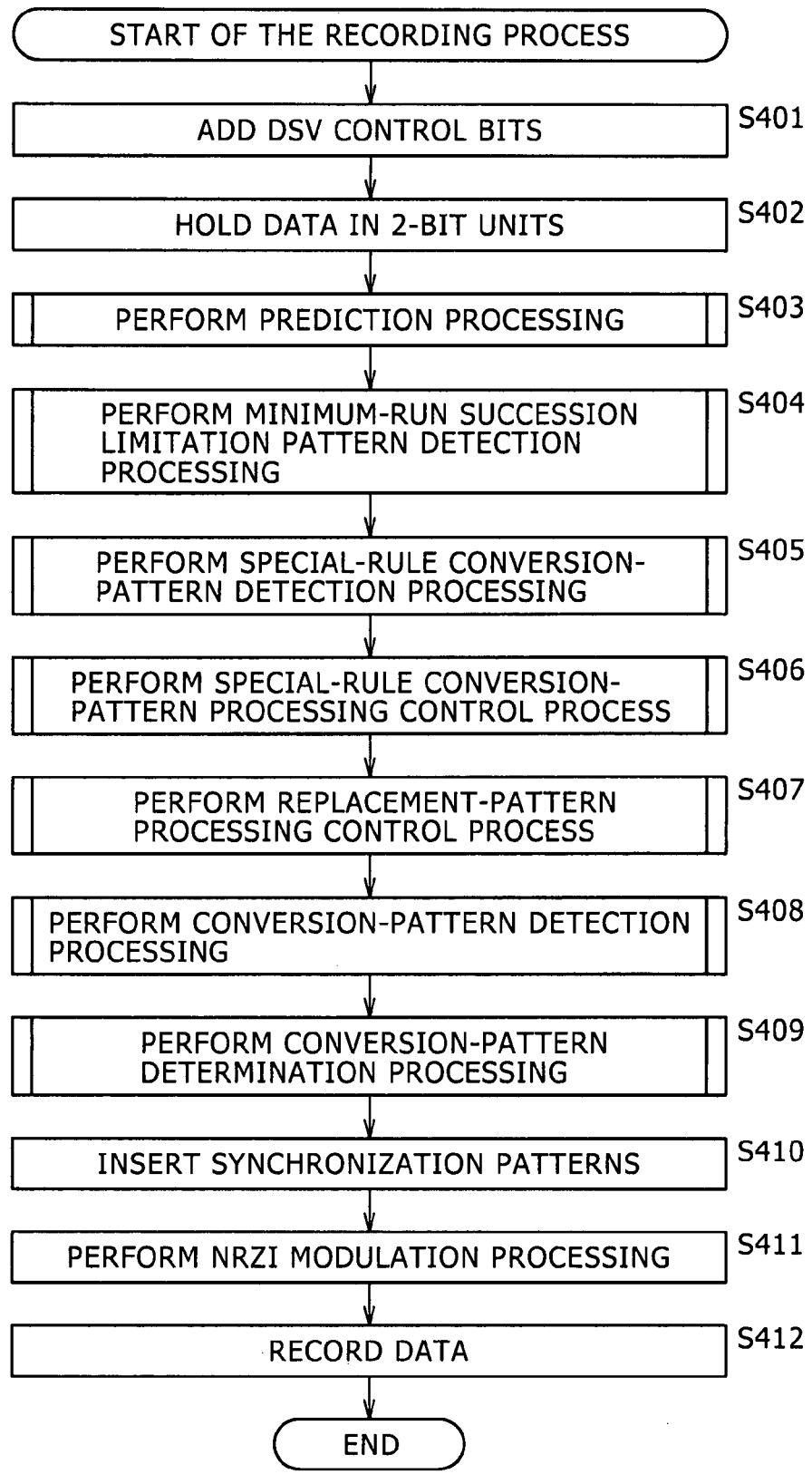
FIG. 15 shows a flowchart to be referred to in explanation of recording operations carried out by the other embodiment shown in FIG. 14.
Figure 19:
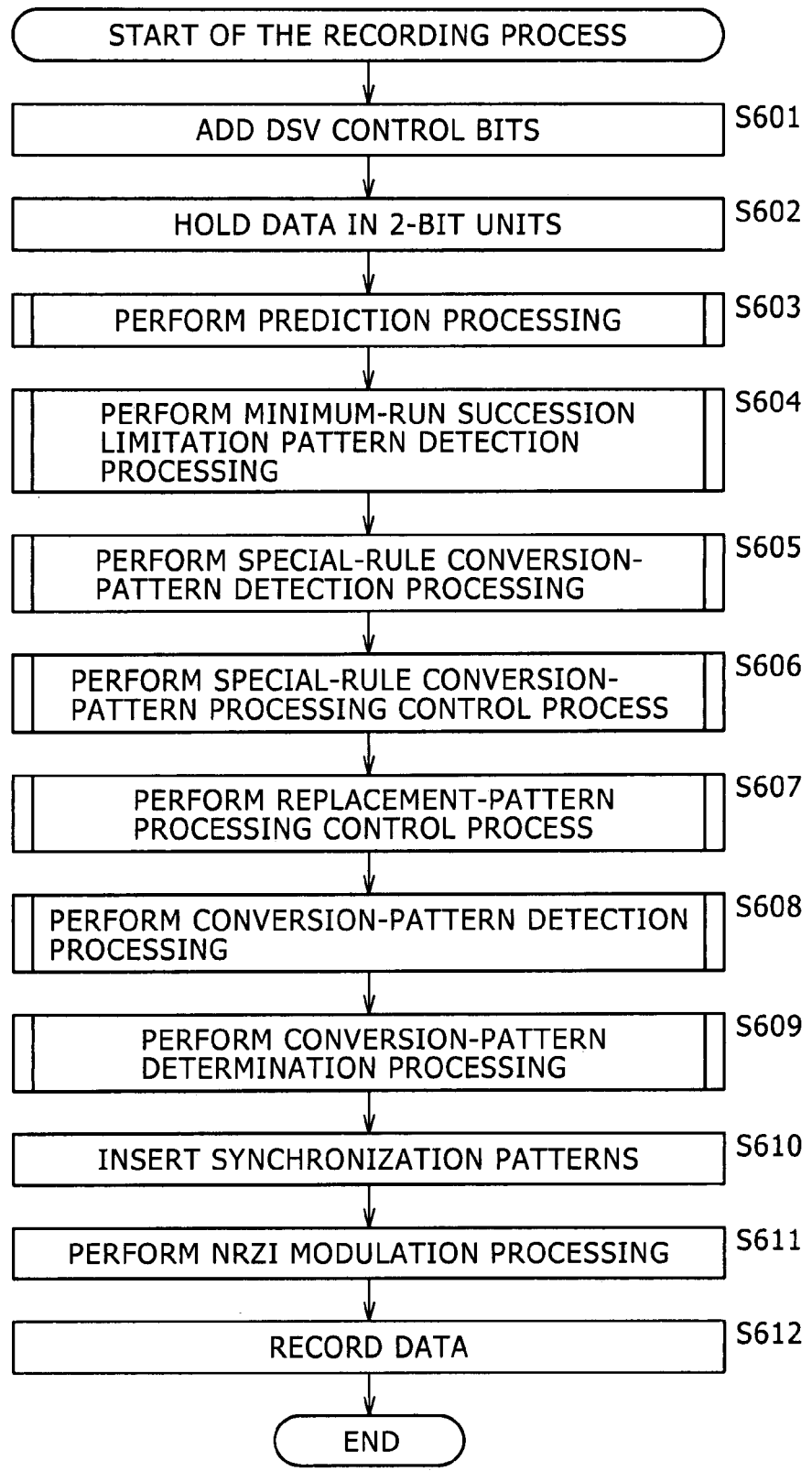
FIG. 19 shows a flowchart to be referred to in explanation of recording operations carried out by the further embodiment shown in FIG. 18.

In accordance with a second embodiment of the present invention, there is provided a modulation method or a program implementing the modulation method (such as a modulation method represented by a flowchart shown in FIG. 4, 15 or 19) including:

a first conversion step (such as a step S7 of the flowchart shown in FIG. 4, a step S408 of the flowchart shown in FIG. 15 and a step S608 of the flowchart shown in FIG. 19) of converting a portion included in processed data as a portion matching a first data pattern into a first code pattern in accordance with a first table associating an even/odd-characteristic retaining conversion pattern used as the first data pattern with the first code pattern;

a second conversion step (such as a step S5 of the flowchart shown in FIG. 4, a step S405 of the flowchart shown in FIG. 15 and a step S605 of the flowchart shown in FIG. 19) of converting a portion included in processed data as a portion matching a second data pattern into a second code pattern in accordance with a second table associating an even/odd-characteristic retention violating conversion pattern used as the second data pattern with the second code pattern; and a select step (such as a step S8 of the flowchart shown in FIG. 4, a step S409 of the flowchart shown in FIG. 15 and a step S609 of the flowchart shown in FIG. 19) of selecting either the first code pattern or the second code pattern, whereby, if a DSV control bit has been inserted into the processed data, a process carried out at the second conversion step to convert the portion into the second code pattern is inhibited.

The embodiments of the present invention are explained as follows. In the following description, the numerical value of a data sequence also referred to as a data pattern is enclosed between parentheses ( ) such as (000011) whereas the numerical value of a post-conversion channel bit sequence also referred to as a code pattern is enclosed between double quotation marks " " such as "000 100 100". In this specification, the code is assumed to be a variable-length code with minimum run d of 1 (d=1), a maximum run k of 7 (k=7) and a conversion ratio (m:n) of a (2:3). In addition, the succession of minimum runs is limited. The code conforming to a conversion table for executing perfect DSV control by inserting efficient DSV control bits while abiding by the minimum and maximum runs is referred to as 1,7 PP (Parity-preserved Prohibit-repeated-minimum-transition-runlength) code.

The modulation table given as Table 3 given below is a typical conversion table (also referred to as a modulation table) according to an embodiment of the present invention. The table is used in a process carried out by a modulation apparatus to convert a data pattern on the left column of the table into a code pattern shown on the right column as a code pattern corresponding to the data pattern.

TABLE 3

1, 7 PP-rmtr5__code. rev.30 RLL (1, 7) code: (d, k; m, n; r) = (1, 7; 2, 3; 4)

|  | Data patterns | Code patterns |
|---|---|---|
| For i = 1 | 11 | *0* |
|  | 10 | 001 |
|  | 01 | 010 |
| For i = 2 | 0011 | 010 100 |
|  | 0010 | 010 000 |
|  | 0001 | 000 100 |
| For i = 3 | 000011 | 000 100 100 |
|  | 000010 | 000 100 000 |
|  | 000001 | 010 100 100 |
|  | 000000 | 010 100 000 |
| For i = 4 | 00001000 | 000 100 100 100 |
|  | 00000000 | 010 100 100 100 |
| For i = 3 | 110111 | 001 000 000 (next 010) |
| For i = 4 | 01110111 | (pre 1)010 000 000 101 (not 010) |

If "xx1", then *0* = 000
If "xx0", then *0* = 101
===============
Sync & termination:
01 010 000 000 010 000 000 010 yyy yyy (30 channel bits = 24 SY channel bits + 6 ID channel bits)
# = 0 indicates a sequence with no termination pattern.
# = 1 indicates a sequence with a termination pattern.

<Termination table>

| Data pattern | Code pattern |
|---|---|
| 00 | 000 |
| 0000 | 010 100 |

The modulation table given as Table 3 has a replacement pattern for limiting the succession of minimum runs for a restrain length i of 4 (i=4). The replacement pattern is also shown separately in a modulation table given as Table 4. A row described as '01110111 (pre 1) 010 000 000 101 (not 010)' in Table 3 as a row of the replacement pattern is interpreted as follows. A data sequence is converted into a code word sequence including a synchronization pattern if the (pre 1) conversion condition and the (not 010) conversion condition are satisfied. To put it in detail, the 8-bit data sequence of (01110111) is converted into a code word of "010 000 000 101" if the code word immediately preceding the data sequence is "1" and the code word sequence immediately following the data sequence is not "010". If the code word immediately preceding the data sequence is "0" or the code word sequence immediately following the data sequence is "010", on the other hand, the data sequence is split (or divided) into a data sub-sequence of (01) and a data sub-sequence of (110111). Subsequently, the 2-bit data sub-sequence of (01) is converted into a code word of "010". Then, in the next conversion process, the data sub-sequence of (110111) is converted into a code word sequence.

The data pattern of (01110111) and the code pattern of "010 000 000 101" associated with the data pattern of (01110111) are conversion patterns included in the modulation table given as Table 3 as even/odd-characteristic retention violating conversion patterns. That is to say, a remainder obtained as a result of an operation to divide the number of 1s included as bit elements in the data pattern serving as a pattern to be converted into a code pattern by 2 is 0 or 1 while a remainder obtained as a result of an operation to divide the number of 1s included as bit elements in the code pattern resulting from the conversion process by 2 is respectively 1 or 0, which does not agree with the remainder for the data pattern. Thus, as a conversion rule, the modulation table given as Table 3 has a special rule, in accordance with which DSV control may not be executed.

By the way, a difference between the modulation tables shown as Tables 2 and 3 can be recognized by comparison of the two tables with each other. The difference is a newly added portion included in the modulation table given as Table 3. The difference is shown as the modulation table given as aforementioned Table 4 as follows:

TABLE 4

|  | Data pattern | Code pattern |
|---|---|---|
| For i = 4 | 01110111 | (pre 1)010 000 000 101 (not 010) |

It is to be noted that notation (pre 1) indicates the conversion condition requiring that a code immediately preceding the code pattern be "1" whereas notation (not 010) indicates the conversion condition requiring that a code immediately succeeding the code pattern be not "010" as described above.

Conversion patterns shown in the modulation table given as Table 3 are divided into RLL conversion patterns and replacement patterns. Indicated in the modulation table given as Table 5 given below, the replacement patterns are patterns for limiting the succession of minimum runs. As is obvious from the modulation tables shown as Tables 4 and 5, the modulation table given as Table 4 is a portion of the modulation table given as Table 5.

TABLE 5

|  | Data pattern | Code pattern |
|---|---|---|
| For i = 3 | 110111 | 001 000 000 (next 010) |
| For i = 4 | 01110111 | (pre 1)010 000 000 101 (not 010) |

It is to be noted that notation (next 010) indicates a conversion condition requiring that a code immediately succeeding the code pattern be "010" as described above.

Conversion patterns shown in the modulation table given as Table 3 as conversion patterns other than the conversion patterns shown in the modulation table given as Table 4 are referred to as basic-rule conversion patterns or even/odd-characteristic retaining conversion patterns. As is obvious from the above description, the conversion patterns included in the modulation table given as Table 4 are referred to as the aforementioned even/odd-characteristic retention violating conversion patterns or special-rule conversion patterns. In the case of the basic-rule conversion patterns or the even/odd-characteristic retaining conversion patterns, a remainder obtained as a result of an operation to divide the number of 1s included as bit elements in the data pattern serving as a pattern to be converted into a code pattern by 2 and a remainder obtained as a result of an operation to divide the number of 1s included as bit elements in the code pattern resulting from the conversion process by 2 are both 1 or 0, agreeing with each other. That is to say, a remainder of 1 indicates that the number of 1s in each of the data and code patterns is odd while a remainder of 0 indicates that the number of 1s in each of the data and code patterns is even. Thus, as a conversion rule, the modulation table given as Table 3 has a basic rule, in accordance with which DSV control can basically be executed.

If the special-rule conversion patterns are excluded from the modulation table given as Table 5, a modulation table given as Table 6 given below is obtained. The conversion patterns shown in the modulation table given as Table 6 as replacement patterns are referred to as minimum-run succession limitation patterns, which are the basic-rule conversion patterns also referred to as the even/odd-characteristic retaining conversion patterns. On the other hand, the minimum-run succession limitation patterns shown in FIG. 4 as other replacement patterns are the special-rule conversion patterns also referred to as the even/odd-characteristic retention violating conversion patterns.

TABLE 6

|  | Data pattern | Code pattern |
|---|---|---|
| For i = 3 | 110111 | 001 000 000 (next 010) |

The conversion table given as Table 3 is configured in accordance with the embodiment for a maximum restrain length r of 4 (r=4) for the following objectives.
1: Circuit simplification to make circuits simple
2: Reduction of propagation of errors generated at a demodulation time to decrease propagation of errors.

The position of the special-rule conversion pattern included in the configuration of the conversion table given as Table 3 as the special-rule conversion pattern to be subjected to replacement processing is not specially limited. That is to say, the special-rule conversion pattern can exist at any position in the input data.

The DSV control may not be executed on the special-rule conversion pattern shown in FIG. 4. That is to say, if the special-rule conversion pattern in a member at a DSV control bit insertion position in the input data is subjected to a conversion process (or a replacement process), the DSV control becomes difficult to execute on the DSV control segment of the member. At that time, there are some cases in which the modulation table given as Table 3 including the modulation table given as Table 4 may produce a result not experiencing DSV control.

In general, on the other hand, the actual input data has a data format obtained as a result of a randomization process carried out by a scrambler. Thus, the case in which the special-rule conversion pattern shown in the modulation pattern given as Table 4 to serve as a pattern in a member at each DSV. control bit insertion position in the input data sequence is typically subjected to a conversion process (or a replacement process) can be considered to be a very rare case. That is to say, even if the special-rule conversion pattern in a member at a DSV control bit insertion position in the input data is subjected to a conversion process (or a replacement process), a member at the next DSV control bit insertion position in the input data can be subjected to a conversion process according to a basic rule allowing the DSV control to be executed. In this way, for the whole input data, the DSV control is executed.

Thus, if a code word sequence is generated by applying the modulation table given as Table 3 as it is so that the DSV control is not executed in some cases, the resulting code word sequence has a minimum run d of 1 (d=1), a maximum run k of 7 (k=7) and an FS (Frame Synchronization) maximum run k of 8 (k=8) and, in addition, the succession of minimum runs is limited to an upper limit of 5.

However, there are cases in which desired DSV control performance may not be obtained due to the existence of a segment not allowing the DSV control to be executed. In order to solve this problem, in accordance with the embodiment, characteristics described below as the characteristics of the present invention are implemented by execution of control as to whether or not to carry out a conversion process on a special-rule conversion pattern in a member at a DSV control bit insertion position on a case-by-case basis. In the present invention, the DSV control is executed without generating any error by applying the modulation table given as Table 3 and, in addition, the circuit can be made simpler whereas the propagation of errors generated at a demodulation time can be reduced.

By the way, when a code word sequence is generated by making use of the conversion table given as Table 3, the code word sequence is a sequence different from a result of modulation based on the existing 1,7 PP code conforming to the modulation table given as Table 2. Thus, the code word sequence generated by making use of the conversion table given as Table 3 may not be demodulated by a demodulation apparatus (or a decoder) based on the existing 1,7 PP code conforming to the modulation table given as Table 2.

As described above, a difference between the modulation tables shown as Tables 2 and 3 is a newly added portion included in the modulation table given as Table 3 and shown as the modulation table given as Table 4. The rest of the modulation table given as Table 3 is identical with the modulation table given as Table 2. For this reason, in accordance with this embodiment, the conversion process of the conversion patterns shown in the modulation table given as Table 4 is further carried out as a replacement process. By execution of control as to whether or not to carry out the replacement process on a case-by-case basis, a code word sequence generated by making use of the conversion table given as Table 3 can be demodulated by a demodulation apparatus (or a decoder) based on the existing 1,7 PP code conforming to the modulation table given as Table 2.

It is to be noted that a modulation table given as Table 7 shown below is obtained by elimination of the (pre 1) conversion condition requiring that a code word immediately preceding the code pattern be "1" from the modulation table given as Table 4, which is obtained as a table showing the special-rule conversion patterns also referred to as the even/odd-characteristic retention violating conversion patterns extracted from the modulation table given as Table 3. Thus, the modulation table given as Table 7 can be regarded as another typical table derived from the modulation table given as Table 3. On the basis of the modulation table given as Table 7, the modulation process can be carried out by making use of an apparatus to be described later. In comparison with the modulation table given as Table 4, the appearance frequency of the special-rule conversion pattern is high due to elimination of the conversion condition.

TABLE 7

|  | Data pattern | Code pattern |
|---|---|---|
| For i = 4 | 01110111 | 010 000 000 101 (not 010) |

In addition, a modulation table given as Table 8 shown below is obtained by addition of conversion patterns for a restrain length i of 5 (i=5) to the modulation table given as Table 4, which is obtained as a table showing the special-rule conversion patterns also referred to as the even/odd-characteristic retention extracted from the modulation table given as Table 3. Thus, the modulation table given as Table 8 can also be regarded as another typical table derived from the modulation table given as Table 3. On the basis of the modulation table given as Table 8, the modulation process can be carried out by making use of an apparatus to be described later. With the modulation table given as Table 8, the freedom to set the minimum unit limit of the DSV control interval can be raised.

TABLE 8

|  | Data pattern | Code pattern |
|---|---|---|
| For i = 4 | 01110111 (pre 1) | 010 000 000 101 (not 010) |
| For i = 5 | 1001110111 | $0$ 010 000 000 101 (not 010) |

It is to be noted that notation $ in the above table denotes an indeterminate bit, which is "0" if the 3 immediately preceding code bits are "010" or "1" if the 3 immediately preceding code bits are not "010".

Next, an embodiment implementing a modulation apparatus according to the present invention is explained by referring to diagrams as follows.

FIG. 1 is a block diagram showing the embodiment implementing a modulation apparatus 1 according to an embodiment of the present invention. As shown in the figure, the modulation apparatus 1 employs a coding apparatus 11 and a recording unit 12 for recording a code sequence onto a recording medium 13. The coding apparatus 11 includes a DSV control bit insertion unit 21, a modulation unit 22, a synchronization-pattern insertion unit 23 and a NRZI modulation unit 24. The modulation unit 22 has a basic-rule conversion-pattern processing unit 51, a special-rule conversion-pattern processing unit 52, a conversion-pattern determination unit 53 and a special-rule conversion-pattern processing control unit 54.

The DSV control bit insertion unit 21 is a unit for inserting DSV control bits into input data at predetermined intervals. The DSV control bit insertion unit 21 not only outputs a data sequence including the inserted DSV control bits to the basic-rule conversion-pattern processing unit 51 and the special-rule conversion-pattern processing unit, 52, but also provides the special-rule conversion-pattern processing control unit 54 with DSV control bit insertion position information indicating positions into which the DSV control bits have been inserted. The basic-rule conversion-pattern processing unit 51 is a unit for carrying out a conversion process on the data sequence from the DSV control bit insertion unit 21 on the basis of basic-rule conversion patterns for which DSV control may be executed. On the other hand, the special-rule conversion-pattern processing unit 52 is a unit for carrying out a conversion process on the data sequence from the DSV control bit insertion unit 21 on the basis of special-rule conversion patterns for which DSV control may not be executed. The special-rule conversion-pattern processing control unit 54 is a unit for making use of the DSV control bit insertion position information received from the DSV control bit insertion unit 21 to produce a result of determination as to whether or not a special-rule conversion-pattern process is to be carried out and outputs the result of the determination to the conversion-pattern determination unit 53 as information on control of the special-rule conversion-pattern process.

As described above, the basic-rule conversion-pattern processing unit 51 carries out a conversion process on the data sequence from the DSV control bit insertion unit 21 on the basis of basic-rule conversion patterns listed in the modulation table given as Table 9 showing some of the conversion patterns listed in the modulation table given as Table 3 and outputs information on the basic-rule conversion pattern process to the conversion-pattern determination unit 53. The modulation table given as Table 9 is provided by the embodiment as a table compatible with the modulation table given as Table 2 used by the existing modulation apparatus.

TABLE 9

|  | Data patterns | Code patterns |
|---|---|---|
| For i = 1 | 11 | *0* |
|  | 10 | 001 |
|  | 01 | 010 |
| For i = 2 | 0011 | 010 100 |
|  | 0010 | 010 000 |
|  | 0001 | 000 100 |
| For i = 3 | 000011 | 000 100 100 |
|  | 000010 | 000 100 000 |
|  | 000001 | 010 100 100 |
|  | 000000 | 010 100 000 |
| For i = 4 | 00001000 | 000 100 100 100 |
|  | 00000000 | 010 100 100 100 |
| For i = 3 | 110111 | 001 000 000 (next 010) |

On the other hand, the special-rule conversion-pattern processing unit 52 carries out a conversion process on the data sequence from the DSV control bit insertion unit 21 on the basis of special-rule conversion patterns, which are shown in the modulation table given as Table 4.

Thus, the special-rule conversion-pattern processing unit 52 has the modulation table given as Table 4 showing the special-rule conversion patterns also referred to as the even/odd characteristic retention violating patterns. The special-rule conversion patterns shown in the modulation table given as Table 4 are some of replacement patterns shown in the modulation table given as Table 5. As described before, the replacement patterns are also referred to as the minimum-run succession limitation patterns for limiting the succession of minimum runs d. The special-rule conversion patterns are replacement patterns for which the DSV control may not be executed in the data sequence. When a special-rule conversion pattern is detected from the data sequence received from the DSV control bit insertion unit 21, the special-rule conversion-pattern processing unit 52 carries out a conversion process on the data sequence on the basis of the special-rule conversion patterns, and outputs information on the special-rule conversion pattern process to the conversion-pattern determination unit 53. If necessary, a special-rule conversion pattern is detected by making use of a synchronization pattern inserted into a position immediately preceding the special-rule conversion pattern. The special-rule conversion-pattern processing control unit 54 makes use of the DSV control bit insertion position information received from the DSV control bit insertion unit 21 to execute processing control with regard to the special-rule conversion patterns shown in the modulation table given as Table 4. To be more specific, special-rule conversion-pattern processing control unit 54 produces a result of determination as to whether or not a special-rule conversion-pattern process is to be carried out and outputs the result of the determination to the conversion-pattern determination unit 53 as information on control of the special-rule conversion-pattern process.

In addition, the special-rule conversion-pattern processing control unit 54 receives a clear signal not shown in FIG. 1 and, if necessary, clears internal information as well as its output in accordance with the clear signal. On top of that, the special-rule conversion-pattern processing control unit 54 receives a control signal also not shown in FIG. 1 and, if necessary, switches the processing control in accordance with the control signal.

The conversion-pattern determination unit 53 is a unit for determining output conversion patterns on the basis of the pieces of information received from the basic-rule conversion-pattern processing unit 51, the special-rule conversion-pattern processing unit 52 and the special-rule conversion-pattern processing control unit 54, outputting the conversion patterns to the synchronization-pattern insertion unit 23. An example of the information output by the special-rule conversion-pattern processing control unit 54 to the conversion-pattern determination unit 53 as the information on control of the special-rule conversion-pattern process is a replacability flag. If the replacability flag is on, the conversion-pattern determination unit 53 selects a process based on special-rule conversion patterns if an input special-rule conversion pattern is detected. If the replacability flag is off, on the other hand, the conversion-pattern determination unit 53 does not select a process based on special-rule conversion patterns even if an input special-rule conversion pattern is detected.

Figure 2:
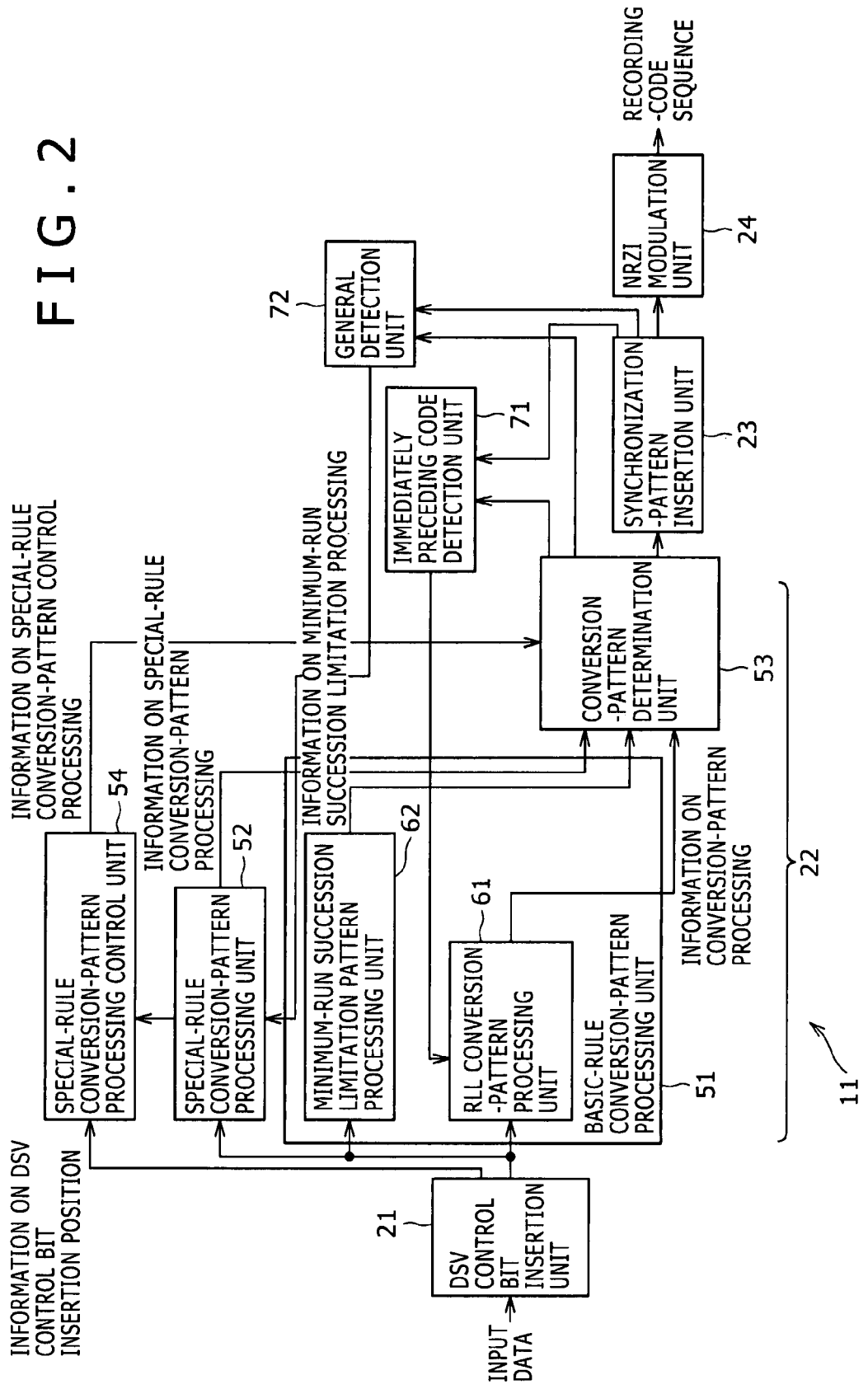
FIG. 2 is a block diagram showing a detailed configuration of a coding apparatus employed in the modulation apparatus shown in FIG. 1.

FIG. 2 is a block diagram showing a detailed configuration of the coding apparatus 11 described above. As shown in the figure, the basic-rule conversion-pattern processing unit 51 employs an RLL conversion-pattern processing unit 61 and a minimum-run succession limitation pattern processing unit 62. In addition, the coding apparatus 11 shown in FIG. 2 also has an immediately preceding code detection unit 71 and a general detection unit 72, which are not shown in FIG. 1.

The data output by the DSV control bit insertion unit 21 as a data sequence including inserted DSV control bits is supplied to the special-rule conversion-pattern processing unit 52 as well as the RLL conversion-pattern processing unit 61 and the minimum-run succession limitation pattern processing unit 62. The DSV control bit insertion unit 21 also provides the special-rule conversion-pattern processing control unit 54 with DSV control bit insertion position information indicating positions into which the DSV control bits have been inserted.

The RLL conversion-pattern processing unit 61 has a basic conversion table including patterns listed in the modulation table given as Table 3 or the basic pattern portion of the modulation table given as Table 9. The basic-rule pattern portion of the modulation table given as Table 9 is a portion starting with a data pattern of (11) for a restrain length i of 1 (i=1) and a code pattern of "*0*" associated with the data pattern of (11) and ending with a data pattern of (00000000) for a restrain length i of 4 (i=4) and a code pattern of "010 100 100 100" associated with the data pattern of (00000000). The RLL conversion-pattern processing unit 61 carries out a conversion-pattern process so as to abide by an RLL rule, and supplies information on the process to the conversion-pattern determination unit 53. In the execution of the conversion-pattern process., the RLL conversion-pattern processing unit 61 makes use of information received from the immediately preceding code detection unit 71. In addition, the RLL conversion-pattern processing unit 61 has a termination table used for inserting a synchronization pattern into a processed sequence. The RLL conversion-pattern processing unit 61 makes use of the termination table for terminating the sequence at a predetermined position. If the termination table is used, information on termination is included in the synchronization pattern.

The minimum-run succession limitation pattern processing unit 62 has a replacement conversion table showing replacement patterns included in the modulation table given as Table 9 as a data pattern of (110111) for a restrain length i of 3 (i=3) and a code pattern of "001 000 000 (next: 010)" associated with the data pattern of (110111). As described earlier, replacement patterns are patterns for limiting the succession of minimum runs d. The succession of minimum runs d is a sequence of consecutive minimum runs d. The minimum-run succession limitation pattern processing unit 62 carries out a process of limiting the succession of minimum runs d, that is, limiting the number of minimum runs d included in the sequence to a predetermined upper limit. Then, the minimum-run succession limitation pattern processing unit 62 outputs information on the process of limiting the succession of minimum runs d to the conversion-pattern determination unit 53.

The immediately preceding code detection unit 71 is a unit for generating information necessary for assuring the RLL from a conversion pattern eventually established by the conversion-pattern determination unit 53 and from a synchronization pattern output by the synchronization-pattern insertion unit 23, supplying the generated information to the RLL conversion-pattern processing unit 61. On the other hand, the general detection unit 72 is a unit for generating information necessary for assuring a value serving as the upper limit of the number of consecutive minimum runs included in the minimum-run succession from a conversion pattern eventually established by the conversion-pattern determination unit 53 and from a synchronization pattern output by the synchronization-pattern insertion unit 23, supplying the generated information to the special-rule conversion-pattern processing unit 52.

Operation timings of the units described above are controlled to states of synchronization with timing. signals supplied by a timing management unit shown in none of the figures.

FIG. 3 is a block diagram showing a more detailed configuration of the coding apparatus 11 described above. As shown in the figure, the DSV control bit insertion unit 21 employs a synthesis unit 41 and a register 42. The synthesis unit 41 is a unit for synthesizing DSV control bits with the input data. The register 42 is a unit for holding the input data including the inserted DSV control bits and outputting the input data to a variety of other units. The RLL conversion-pattern processing unit 61 employs a conversion-pattern detection unit 121, conversion tables 122, a selector 123 and an indeterminate-bit determination unit 124. In the case of the embodiment, the conversion tables 122 are conversion tables 122A to 122D. The minimum-run succession limitation pattern processing unit 62 includes a minimum-run succession limitation pattern detection/prediction unit 111, a minimum-run succession limitation pattern detection unit 112 and a minimum-run succession limitation table 113. The special-rule conversion-pattern processing unit 52 employs a special-rule conversion-pattern detection unit 131 and a special-rule conversion table 132. The special-rule conversion table 132 has a replacement conversion table, the access frequency of which is to be counted. This replacement conversion table is the modulation table given as Table 4, which is a newly portion added to the modulation table given as Table 2 to obtain a modulation table given as Table 3 as described above. To put it concretely, the modulation table given as Table 4 shows a data pattern of (01110111) and a code pattern of "(pre 1) 010 000 000 101 (not 010)" associated with the data pattern of (01110111).

The synthesis unit 41 inserts DSV control bits into the input data at predetermined intervals and outputs a data sequence including the inserts DSV control bits to the register 42. In addition, the synthesis unit 41 also supplies information indication the positions of the inserted DSV control bits to the special-rule conversion-pattern processing control unit 54. The register 42 shifts the input data sequence including the inserts DSV control bits bit by bit. Since the unit of processing is a 2-bit unit, however, the register 42 supplies a data sequence of 2-bit units to the conversion-pattern detection unit 121, the minimum-run succession limitation pattern detection unit 112, the minimum-run succession limitation pattern detection/prediction unit 111 and the special-rule conversion-pattern detection unit 131 as data necessary in the processes carried out by the conversion-pattern detection unit 121, the minimum-run succession limitation pattern detection unit 112, the minimum-run succession limitation pattern detection/prediction unit 111 and the. special-rule conversion-pattern detection unit 131 respectively.

The minimum-run succession limitation pattern detection/prediction unit 111 references up to 5 bits following 8 bits output by the special-rule conversion-pattern detection unit 131. Thus, a referenced data sequence includes 13 bits in total.

The conversion-pattern detection unit 121 is a unit for detecting a conversion pattern abiding by an RLL rule. The conversion-pattern detection unit 121 outputs information on determination of a conversion pattern as a result of the detection to the conversion-pattern determination unit 53 and the conversion tables 122A to 122D. From the conversion tables 122A to 122D, detected conversion patterns are each supplied to the conversion-pattern determination unit 53 as a sequence of conversion channel bits. In addition, if necessary, the conversion-pattern detection unit 121 outputs information on recognition of an indeterminate pattern to the selector 123 and the conversion-pattern determination unit 53. The indeterminate-bit determination unit 124 is a unit for confirming an indeterminate bit received from the selector 123 and supplying the result of the confirmation to the conversion-pattern determination unit 53.

When the minimum-run succession limitation pattern detection unit 112 detects a conversion pattern for limiting the number of successive minimum runs from the data sequence, the minimum-run succession limitation pattern detection unit 112 outputs information on the detection of the conversion pattern for limiting the number of consecutive minimum runs to the conversion-pattern determination unit 53 and the minimum-run succession limitation table 113 as a result of the detection. Receiving the information from the minimum-run succession limitation pattern detection unit 112, the minimum-run succession limitation table 113 supplies a detected conversion pattern, which is a sequence of conversion channel bits, to the conversion-pattern determination unit 53.

When the minimum-run succession limitation pattern detection/prediction unit 111 detects a predetermined conversion pattern at a predetermined position other than the head of the data sequence among conversion patterns each used for limiting the number of consecutive minimum runs, the minimum-run succession limitation pattern detection/prediction unit 111 supplies information on the detection of the predetermined conversion pattern to the special-rule conversion-pattern processing control unit 54 as a result of the detection. To put it concretely, the predetermined conversion pattern is the data pattern of (110111) included in the modulation table given as Table 3 as a data pattern for a restrain length i of 3 (i=3).

When the special-rule conversion-pattern detection unit 131 detects the special-rule conversion pattern shown in the modulation table given as Table 4, the special-rule conversion-pattern detection unit 131 supplies information on the detection of the special-rule conversion pattern to the special-rule conversion table 132 as a result of the detection. As described before, the special-rule conversion pattern shown in the modulation table given as Table 4 is a replacement pattern for limiting the succession of minimum runs d. This replacement pattern is referred to as a special-rule conversion pattern because the pattern abides by a special rule not allowing the DSV control to be executed in the data sequence. From the special-rule conversion table 132, a detected conversion pattern is supplied to the conversion-pattern determination unit 53 as a sequence of conversion channel bits. The special-rule conversion-pattern detection unit 131 also supplies the information on the detection of the special-rule conversion pattern to the special-rule conversion-pattern processing control unit 54. If necessary, the special-rule conversion-pattern detection unit 131 detects the special-rule conversion pattern by making use of information on a synchronization pattern inserted into a position immediately preceding the special-rule conversion pattern.

The special-rule conversion-pattern processing control unit 54 is a unit for carrying out a control process on the special-rule conversion pattern shown in the modulation table given as Table 4. To be more specific, on the basis of the information received from the minimum-run succession limitation pattern detection/prediction unit 111 and the information received from the special-rule conversion-pattern detection unit 131, the special-rule conversion-pattern processing control unit 54 executes control of making a decision as to whether or not to carry out a conversion process making use of the special-rule conversion pattern.

The conversion-pattern determination unit 53 is a unit for outputting a conversion pattern selected and determined from channel bit sequences listed in the conversion tables 122A to 122D, the minimum-run succession limitation table 113 and the special-rule conversion table 132 on the basis of the information received from the conversion-pattern detection unit 121, the information received from the minimum-run succession limitation pattern detection unit 112 as well as the information received from the special-rule conversion-pattern processing control unit 54. In addition, the conversion-pattern determination unit 53 also makes use of the information received from the special-rule conversion-pattern processing control unit 54 in order to recognize a special-rule conversion pattern, for which a conversion process is prohibited, and deselect the special-rule conversion pattern as the output conversion pattern.

The immediately preceding code detection unit 71 provides the indeterminate-bit determination unit 124 with information generated by the immediately preceding code detection unit 71 as information necessary for assuring the RLL. The general detection unit 72 provides the special-rule conversion-pattern detection unit 131 with information generated by the general detection unit 72 as information necessary for assuring a value serving as the upper limit of the succession of minimum runs.

By referring to a flowchart shown in FIG. 4, the following description explains a recording method (which is also referred to as a modulation method) adopted by the modulation apparatus 1, which has been explained above with reference to FIGS. 1 to 3. As shown in FIG. 4, the flowchart begins with a step S1 at which the synthesis unit 41 employed in the DSV control bit insertion unit 21 inserts DSV control bits into an input data sequence. At this step, the synthesis unit 41 provides the special-rule conversion-pattern processing control unit 54 with DSV control bit insertion position information indicating positions, into which the DSV control bits have been inserted. Then, at the next step S2, the input data sequence including the DSV control bits inserted by the synthesis unit 41 is stored in the register 42 in 2-bit units.

Subsequently, at the next step S3, the minimum-run succession limitation pattern detection/prediction unit 111 carries out prediction processing. At the next step S4, the minimum-run succession limitation pattern detection unit 112 and the minimum-run succession limitation table 113 carry out processing to detect a pattern limiting the succession of minimum runs. At the next step S5, the special-rule conversion-pattern processing unit 52 carries out processing to detect a special-rule conversion pattern. At the next step S6, the special-rule conversion-pattern processing control unit 54 executes processing to control the processing to detect a special-rule conversion pattern. At the next step S7, the RLL conversion-pattern processing unit 61 carries out processing to detect a conversion pattern.

It is to be noted that, in actuality, the processes of the steps S3 to S7 are carried out concurrently.

Details of the prediction processing carried out at the step S3 will be described later by referring to a flowchart shown in FIG. 5. In the prediction processing carried out at the step S3, a prediction flag is turned on if the data sequence includes a conversion pattern of (110111) in the middle of the data (strictly speaking, the middle of the data means a location starting from the third bit) and the next channel bits are "010". Otherwise, the prediction flag is turned off.

Details of the processing carried out at the step S4 to detect a pattern limiting the succession of minimum runs will be described later by referring to a flowchart shown in FIG. 6. In the processing carried out at the step S4 to detect a pattern limiting the succession of minimum, a minimum-run succession limitation pattern detection flag is turned on if a conversion pattern of (110111) is detected in the data and the next channel bits are "010". Otherwise, the minimum-run succession limitation pattern detection flag is turned off.

Details of the processing carried out at the step S5 to detect a special-rule conversion pattern will be described later by referring to a flowchart shown in FIG. 7. In the processing carried out at the step S5 to detect a special-rule conversion pattern, a special-rule conversion-pattern detection flag is turned on if a conversion pattern of (01110111) is detected in the data and the minimum-run succession limitation pattern detection flag is on. In this case, and the 8-bit data is converted into 12 channel bits.

Details of the processing carried out at the step S6 to control the processing to detect a special-rule conversion pattern will be described later by referring to a flowchart shown in FIG. 8. In the processing carried out at the step S6 to control the processing to detect a special-rule conversion pattern, a special-rule conversion pattern control flag is turned on to indicate that a conversion process can be carried out if the special-rule conversion-pattern detection flag is on, the prediction flag is off and the data sequence does not include DSV control bits.

Details of the processing carried out at the step S7 to a detect conversion pattern will be described later by referring to a flowchart shown in FIG. 9. In the processing carried out at the step S7 to detect a conversion pattern, 8-bit data is converted into 12 channel bits, 6-bit data is converted into 9 channel bits, 4-bit data is converted into 6 channel bits or 2-bit data is converted into 3 channel bits.

Let us refer back to the flowchart shown in FIG. 4. At the following step S8, the conversion-pattern determination unit 53 carries out processing to determine a conversion pattern. Details of the processing carried out at the step S8 to determine a conversion pattern will be described later by referring to a flowchart shown in FIG. 13. In the processing to determine a conversion pattern, a code pattern is selected among code patterns obtained as results of conversion processes by making use of the conversion tables 122A to 122D employed in the RLL conversion-pattern processing unit 61, the minimum-run succession limitation table 113 and the special-rule conversion table 132.

Then, at the next step S9, the synchronization-pattern insertion unit 23 inserts a synchronization pattern into the code sequence received from the conversion-pattern determination unit 53 as a sequence confirmed as the eventual conversion pattern. Subsequently, at the next step S10, the NRZI modulation unit 24 carries out an NRZI modulation process on the code sequence received from the synchronization-pattern insertion unit 23 as a code sequence including the inserted synchronization pattern. Then, at the next step S11, the recording unit 12 records a recording code sequence output by the NRZI modulation unit 24 as a result of the NRZI modulation process onto the recording medium 13.

Next, details of the prediction processing carried out at the step S3 of the flowchart shown in FIG. 4 are described by referring to the flowchart shown in FIG. 5 as follows.

Figure 5:
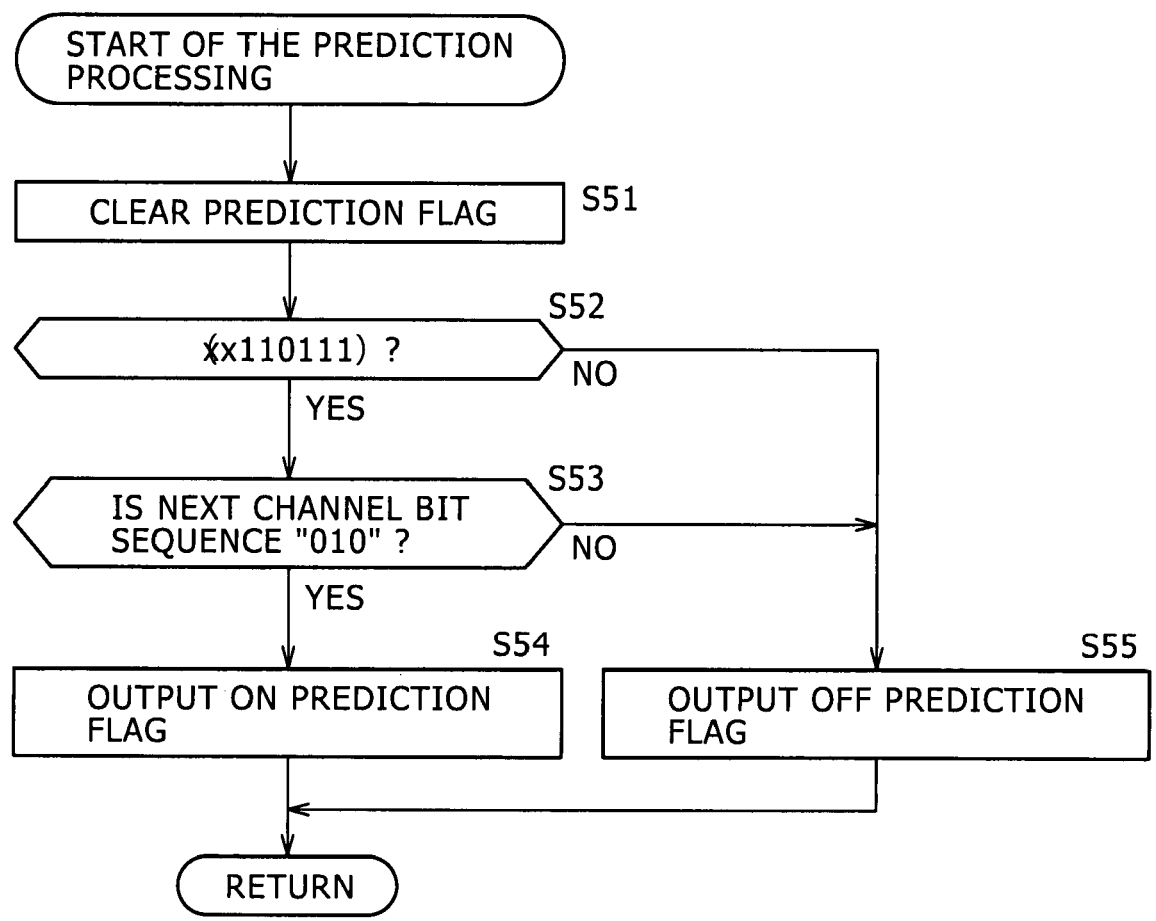
FIG. 5 shows a flowchart to be referred to in explanation of prediction processing carried out at a step S3 of the flowchart shown in FIG. 4.

As shown in FIG. 5, the flowchart begins with a step S51 at which the minimum-run succession limitation pattern detection/prediction unit 111 clears a prediction flag. The prediction flag will be output in a process carried out at a step S54 or S55 as described later. Then, at the next step S52, the minimum-run succession limitation pattern detection/prediction unit 111 produces a result of determination as to whether or not the input data matches a pattern of (xx110111). The minimum-run succession limitation pattern detection/prediction unit 111 determines whether or not the input data is a data pattern of (110111) by comparing the third and subsequent bits of the input data with those of the data pattern. If the result of the determination indicates that the input data matches the pattern of (xx110111), the flow of the prediction processing goes on to a step S53 at which the minimum-run succession limitation pattern detection/prediction unit 111 further produces a result of determination as to whether or not the next channel bits are "010". If the result of the determination indicates that the next channel bits are "010", the flow of the prediction processing goes on to the aforementioned step S54 at which the minimum-run succession limitation pattern detection/prediction unit 111 turns on the prediction flag and outputs the flag to the conversion-pattern determination unit 53 as information on detection and prediction of a pattern limiting the succession of minimum runs. The prediction flag will be used in a process carried out at a step S183 of the flowchart shown in FIG. 8 and a process carried out at a step S362 of the flowchart shown in FIG. 13. If the next channel bits are not "010", on the other hand, the flow of the prediction processing goes on to the aforementioned step S55 at which the prediction flag is turned off. Thus, the prediction flag turned off indicates that a conversion process based on conversion patterns listed in the modulation table given as Table 4 can be carried out due to the fact that a condition for execution of the conversion process is satisfied.

If the determination result produced in the process carried out at the step S52 indicates that the input data does not matches the pattern of (xx110111) or the determination result produced in the process carried out at the step S53 indicates that the next channel bits are not "010" (namely, the next channel bits are "000", "101" or "001"), on the other hand, the flow of the prediction processing goes on to a step S55 at which the minimum-run succession limitation pattern detection/prediction unit 111 turns off the prediction flag and outputs the flag to the conversion-pattern determination unit 53 as information on detection and prediction of a pattern limiting the succession of minimum runs.

Next, details of the processing carried out at the step S4 of the flowchart shown in FIG. 4 to detect a pattern for limiting the succession of minimum runs are described by referring to the flowchart shown in FIG. 6 as follows.

Figure 6:
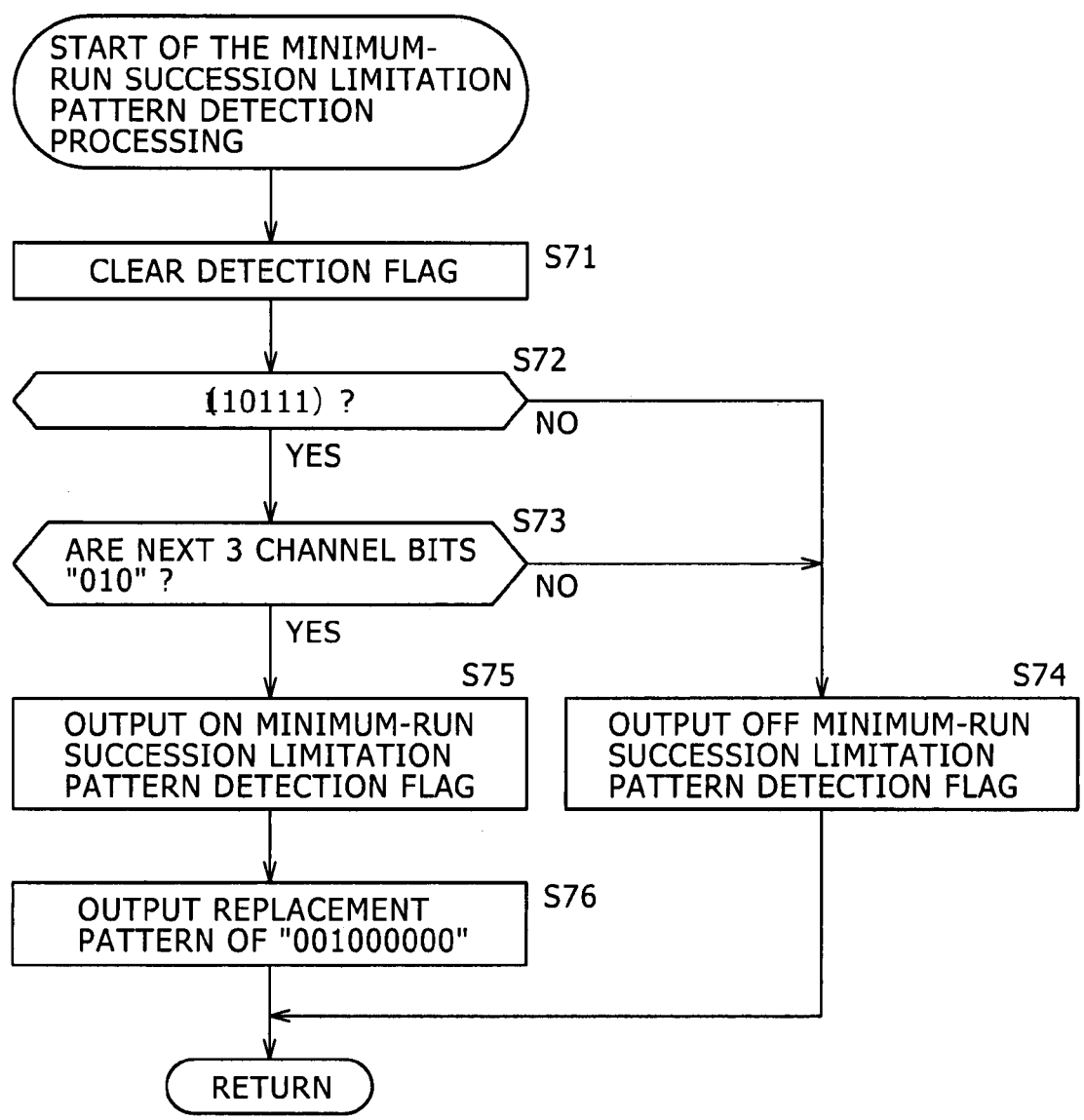
FIG. 6 shows a flowchart to be referred to in explanation of processing carried out at a step S4 of the flowchart shown in FIG. 4 to detect a pattern for limiting the succession of minimum runs.

As shown in the FIG. 6, the flowchart begins with a step S71 at which the minimum-run succession limitation pattern detection unit 112 clears a detection flag. In the following description, the detection flag is also referred to as a minimum-run succession limitation pattern detection flag to be output in a process carried out at either of steps S75 and S76 described later. Then, at the next step S72, the minimum-run succession limitation pattern detection unit 112 produces a result of determination as to whether or not data output by the register 42 matches a pattern of (110111). If the result of the determination indicates that the data output by the register 42 matches the pattern of (110111), the flow of the processing goes on to a step S73 at which the minimum-run succession limitation pattern detection unit 112 further produces a result of determination as to whether or not the next 3 channel bits are "010". If the result of the determination indicates that the 3 next channel bits are "010", the flow of the processing goes on to the aforementioned step S75 at which the minimum-run succession limitation pattern detection/prediction unit 111 turns on the minimum-run succession limitation pattern detection flag and outputs the flag. The minimum-run succession limitation pattern detection flag will be used in a process carried out at a step S363 of a flowchart shown in FIG. 13. Then, at the next step S76, a replacement pattern of "001 000 000" is output from the minimum-run succession limitation table 113 to the conversion-pattern determination unit 53. The replacement patter, which is a sequence of channel bits, is selected and output in a process carried out at a step S364 of the flowchart shown in FIG. 13.

If the determination result produced in the process carried out at the step S72 indicates that the input data does not matches the pattern of (110111) or the determination result produced in the process carried out at the step S73 indicates that the next 3 channel bits are not "010", on the other hand, the flow of the prediction processing goes on to the aforementioned step S74 at which the minimum-run succession limitation pattern detection unit 112 turns off the minimum-run succession limitation pattern detection flag and outputs the flag.

Next, details of the processing carried out at the step S5 of the flowchart shown in FIG. 4 to detect a special-rule conversion pattern are described by referring to the flowchart shown in FIG. 7 as follows.

Figure 7:
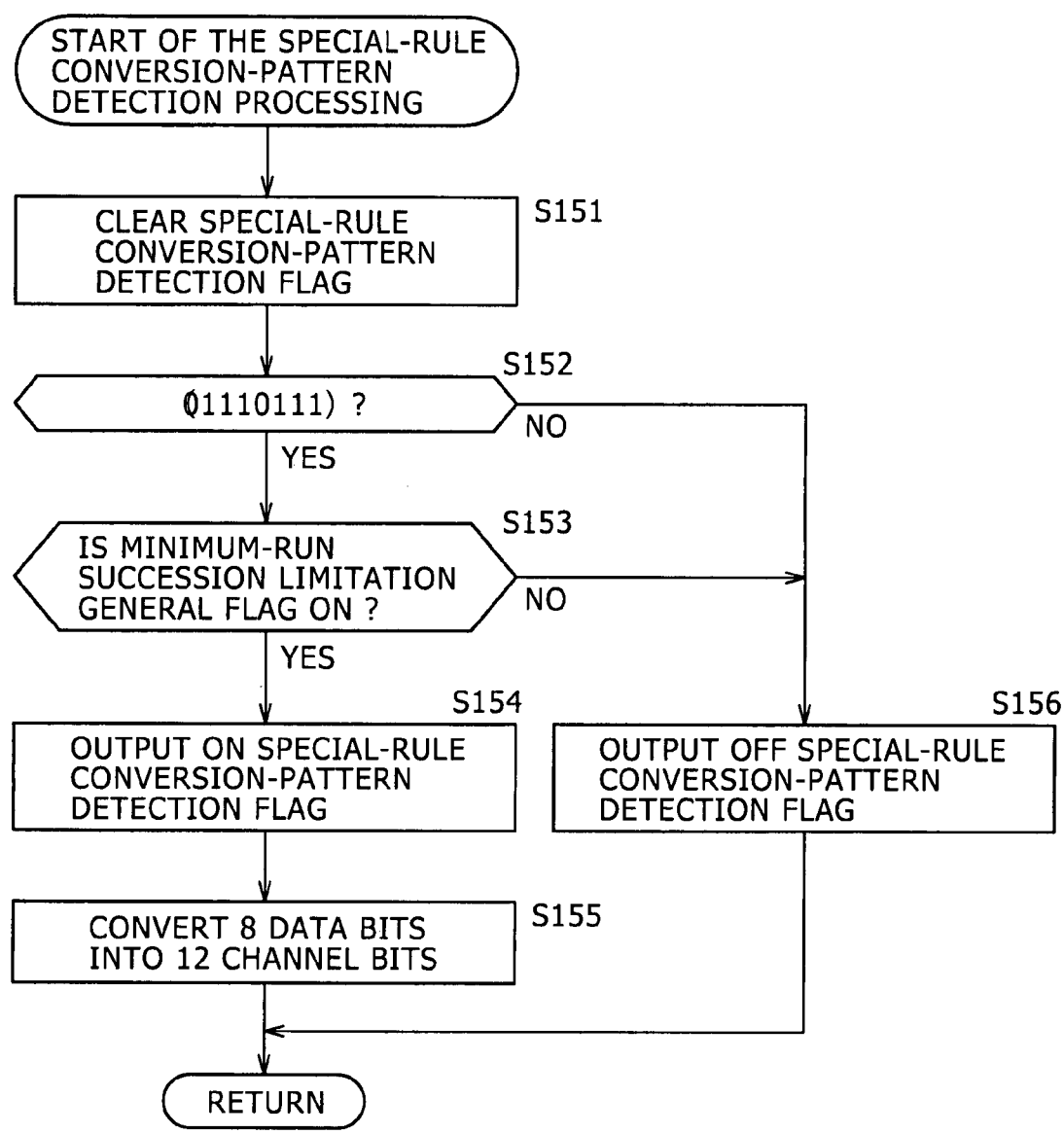
FIG. 7 shows a flowchart to be referred to in explanation of processing carried out at a step S5 of the flowchart shown in FIG. 4 to detect a special-rule conversion pattern.

As shown in the FIG. 7, the flowchart begins with a step S151 at which the special-rule conversion-pattern detection unit 131 clears a detection flag. In the following description, the detection flag is also referred to as a special-rule conversion-pattern detection flag to be output in a process carried out at either of steps S154 and S156 described later. Then, at the next step S152, the special-rule conversion-pattern detection unit 131 produces a result of determination as to whether or not the data matches a pattern of (01110111). If the result of the determination indicates that the data matches the pattern of (01110111), the flow of the processing goes on to a step S153 at which the special-rule conversion-pattern detection unit 131 further produces a result of determination as to whether or not a minimum-run succession limitation general flag on. If the result of the determination indicating that the minimum-run succession limitation general flag is on, the flow of the processing goes on to the aforementioned step S154 at which the special-rule conversion-pattern detection unit 131 turns on the special-rule conversion-pattern detection flag and outputs the on special-rule conversion-pattern detection flag. As will be described later by referring to a flowchart shown in FIG. 12, the minimum-run succession limitation general flag is turned on when the 1 channel bit of the immediately preceding code word sequence is "1". The special-rule conversion-pattern detection flag is used in a process carried out at a step S182 of a flowchart shown in FIG. 8. Then, at the next step S155, the special-rule conversion table 132 is used for converting the 8-bit data into 12 channel bits. To put it concretely, the data pattern of (01110111) is converted into a code pattern of "010 000 000 101". This code pattern is selected and output as a sequence of channel bits in a process carried out a step S365 of a flowchart shown in FIG. 13.

The conversion process of the step S155 is also carried out for a case in which the 8-bit data includes a DSV control bit. Thus, in this case, the 12 channel bits obtained as a result of the conversion process include a channel bit corresponding to the DSV control bit. However, a determination result produced in a process carried out at a step S361 of a flowchart shown in FIG. 13 indicates that a special-rule conversion-pattern control flag is off, causing a result obtained from the conversion process carried out at the step S155 as the 12 channel bits including a bit corresponding to the DSV control bit to be disused.

If the determination result produced in the process carried out at the step S152 indicates that the data does not match the pattern of (01110111) or the determination result produced in the process carried out at the step S153 indicates that the minimum-run succession limitation general flag is not on (that is, the minimum-run succession limitation general flag is off), on the other hand, the flow of the processing goes on to the aforementioned step S156 at which the special-rule conversion-pattern detection unit 131 turns off the special-rule conversion-pattern detection flag and outputs the on special-rule conversion-pattern detection flag. As will be described later by referring to the flowchart shown in FIG. 12, the minimum-run succession limitation general flag is turned off when the 1 channel bit of the immediately preceding code word sequence is "0".

Next, details of the processing carried out at the step S6 of the flowchart shown in FIG. 4 to control the processing to detect a special-rule conversion pattern are described by referring to the flowchart shown in FIG. 8 as follows.

As shown in the FIG. 8, the flowchart begins with a step S181 at which the special-rule conversion-pattern processing control unit 54 clears a detection flag. In the following description, the detection flag is also referred to as a special-rule conversion-pattern control flag to be output in a process carried out at either of steps S185 and S186 described later. Then, at the next step S182, the special-rule conversion-pattern processing control unit 54 produces a result of determination as to whether or not the special-rule conversion-pattern detection flag is on. The special-rule conversion-pattern detection flag is a flag output at the step S154 or S156 of the flowchart shown in FIG. 7. If the result of the determination indicates that the special-rule conversion-pattern detection flag has is on, the flow of the processing goes on to a step S183. The special-rule conversion-pattern detection flag turned on indicates that the data matches the pattern of (01110111) and the 1 channel bit of the immediately preceding code word sequence is "1". At the step S183, the special-rule conversion-pattern processing control unit 54 further produces a result of determination as to whether or not the prediction flag is on. If the result of the determination indicates that the prediction flag is not on (the prediction flag is off), that is, if the data does not match the pattern of (xx110111) or the data matches the pattern of (xx110111) but the 3 channel bits of the immediately preceding code word sequence are not "010" or if information indicating that the special-rule conversion-pattern processing unit 52 is allowed to carry out a conversion process has been obtained or, in other words, the special-rule conversion-pattern detection flag is on but the detection flag is off, the flow of the processing goes on to a step S184 at which the special-rule conversion-pattern processing control unit 54 further produces a result of determination as to whether or not DSV control bits are included in the data pattern. To be more specific, the special-rule conversion-pattern processing control unit 54 produces a result of determination as to whether or not DSV control bits are included in the data pattern of (01110111) on the basis of information received from the synthesis unit 41 as information on positions into which DSV control bits have been inserted. If the result of the determination indicates that DSV. control bits are not included in the data pattern, the flow of the processing goes on to the aforementioned step S186 at which the special-rule conversion-pattern processing control unit 54 turns on the special-rule conversion-pattern control flag and outputs the flag.

If the determination result produced in the process carried out at the step S182 indicates that the special-rule conversion-pattern detection flag is off, implying that the data does not match the pattern of (01110111) or the data matches the pattern of (01110111) but the 1 channel bit of the immediately preceding code word sequence is "0", if the determination result produced in the process carried out at the step S183 indicates that the prediction flag is on, implying that the data matches the pattern of (xx1110111) and the channel bits of the immediately preceding code word sequence are "010" or if the determination result produced in the process carried out at the step S184 indicates that DSV control bits are included in the data pattern, the flow of the processing goes on to the aforementioned step S185 at which the special-rule conversion-pattern processing control unit 54 turns off the special-rule conversion-pattern control flag and outputs the flag.

Figure 13:
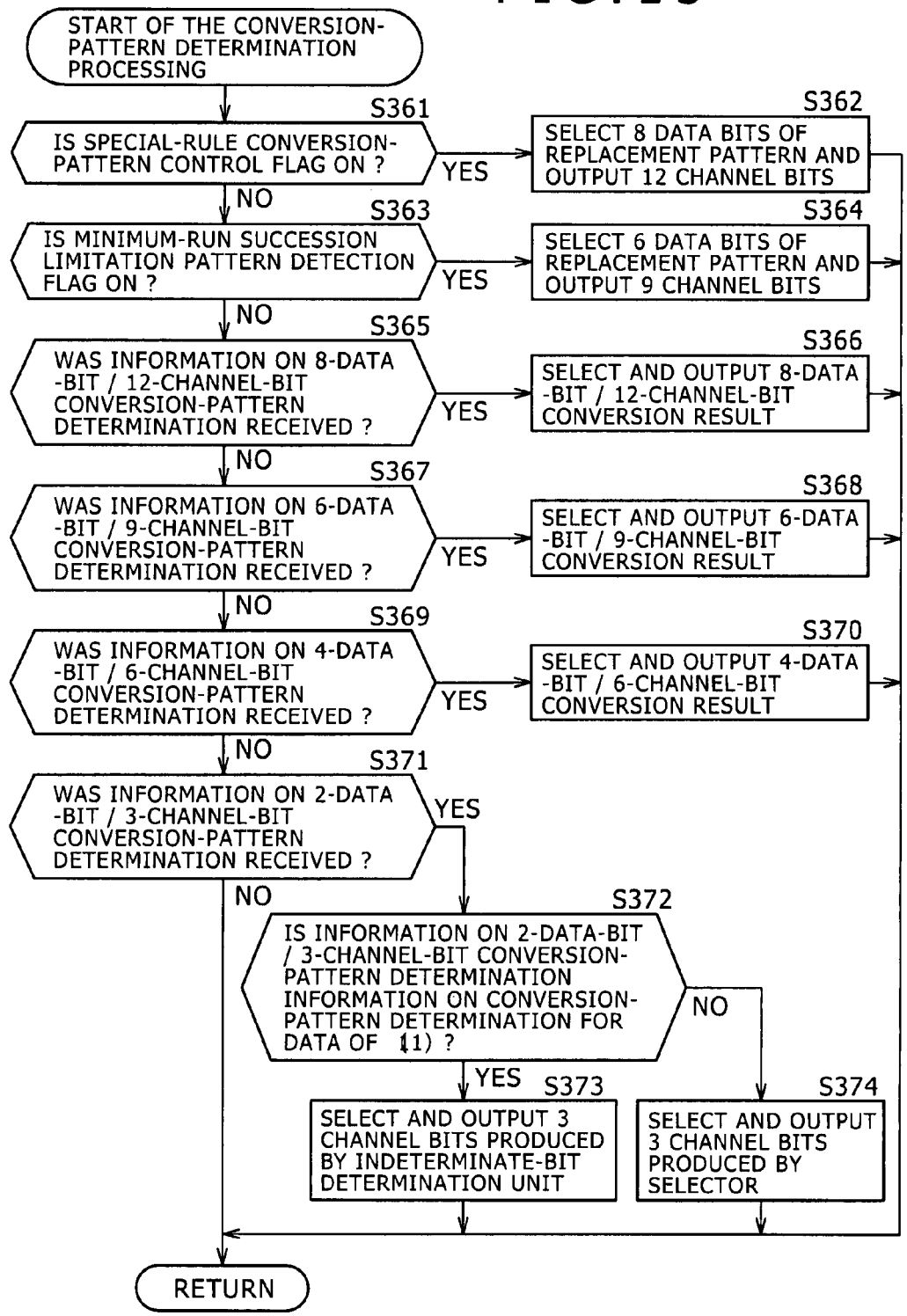
FIG. 13 shows a flowchart to be referred to in explanation of processing carried out at a step S8 of the flowchart shown in FIG. 4 to determine a conversion pattern.

As is obvious from steps S361 and S362 of the flowchart to be described later by referring to FIG. 13, if the special-rule conversion-pattern control flag is on, a special-rule conversion pattern (that is, an even/odd characteristic retention violating code pattern) obtained as a result of the conversion process carried out at the step S155 of the flowchart shown in FIG. 7 is selected and output. If the special-rule conversion-pattern control flag is off, on the other hand, the process of the step S362 of the flowchart shown in FIG. 13 is skipped so as not to select and output the special-rule conversion pattern. Instead, processes of a step S363 and subsequent steps of the flowchart shown in FIG. 13 are carried out in order to select and output an individual conversion code pattern generated as an even/odd characteristic retention violating code pattern by converting an even/odd characteristic retention violating data pattern associated with the even/odd characteristic retention violating code pattern on a case-by-case basis. That is to say, the special-rule conversion-pattern control flag functions as a permission flag indicating whether or not a conversion process according to the special-rule conversion pattern is permitted.

Next, details of the processing carried out at the step S7 of the flowchart shown in FIG. 4 to detect a special-rule conversion pattern are described by referring to the flowchart shown in FIG. 9 as follows.

Figure 9:
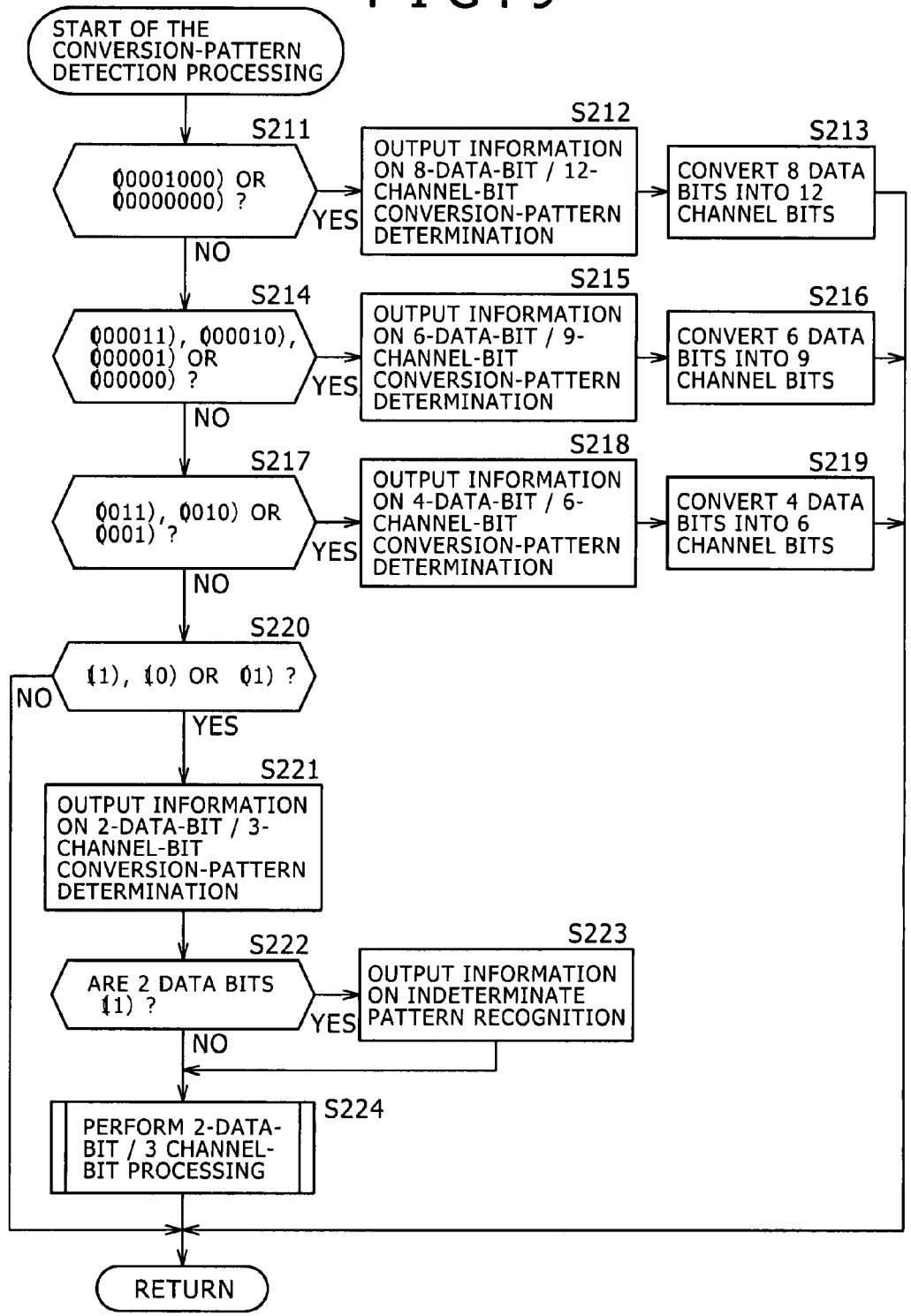
FIG. 9 shows a flowchart to be referred to in explanation of processing carried out at a step S7 of the flowchart shown in FIG. 4 to detect a conversion pattern.

As shown in the FIG. 9, the flowchart begins with a step S211 at which the conversion-pattern detection unit 121 produces a result of determination as to whether or not the input data received from the shift register 42 matches a pattern of (00001000) or (00000000). If the result of the determination indicates that the input data matches the pattern of (00001000) or (00000000), the flow of the processing goes on to a step S212 at which the conversion-pattern detection unit 121 outputs information on determination of 8-data-bit and 12-channel-bit conversion patterns to the conversion-pattern determination unit 53 and the conversion tables 122A to 122D. Then, at the next step S213, the conversion table 122D is used for converting the 8-bit data into 12 channel bits. Subsequently, the 12 channel bits are supplied to the conversion-pattern determination unit 53. That is to say, if the input data matches the pattern of (00001000), a code sequence of "000 100 100 100" is supplied to the conversion-pattern determination unit 53. By the same token, if the input data matches the pattern of (00000000), a code sequence of "010 100 100 100" is supplied to the conversion-pattern determination unit 53. The information generated in the process carried out at the step S212 as the information on determination of 8-data-bit and 12-channel-bit conversion patterns is confirmed in a process carried out at a step S365 of the flowchart shown in FIG. 13 and, as a result of the confirmation, the code sequence produced in the conversion process carried out at the step S213 is selected and output at a step S366.

If the determination result produced in the process carried out at the step S211 indicates that the input data does not matches the patterns of (00001000) and (00000000), on the other hand, the flow of the processing goes on to a step S214 at which the conversion-pattern detection unit 121 produces a result of determination as to whether or not the input data matches a pattern of (000011), (000010), (000001) or (000000). If the result of the determination indicates that the input data matches the pattern of (000011), (000010), (000001) or (000000), the flow of the processing goes on to a step S215 at which the conversion-pattern detection unit 121 outputs information on determination of 6-data-bit and 9-channel-bit conversion patterns to the conversion-pattern determination unit 53 and the conversion tables 122A to 122D. Then, at the next step S216, the conversion table 122C is used for converting the 6-bit data into 9 channel bits. Subsequently, the 9 channel bits are supplied to the conversion-pattern determination unit 53. That is to say, if the input data matches the pattern of (000011), a code sequence of "000 100 100" is supplied to the conversion-pattern determination unit 53. By the same token, if the input data matches the pattern of (000010), a code sequence of "000 100 000" is supplied to the conversion-pattern determination unit 53. Likewise, if the input data matches the pattern of (000001), a code sequence of "010 100 100" is supplied to the conversion-pattern determination unit 53. Similarly, if the input data matches the pattern of (000000), a code sequence of "010 100 000" is supplied to the conversion-pattern determination unit 53. The information generated in the process carried out at the step S215 as the information on determination of 6-data-bit and 9-channel-bit conversion patterns is confirmed in a process carried out at a step S367 of the flowchart shown in FIG. 13 and, as a result of the confirmation, the code sequence produced in the conversion process carried out at the step S216 is selected and output at a step S368.

If the determination result produced in the process carried out at the step S214 indicates that the input data does not matches the patterns of (000011), (000010), (000001) and (000000), on the other hand, the flow of the processing goes on to a step S217 at which the conversion-pattern detection unit 121 produces a result of determination as to whether or not the input data matches a pattern of (0011), (0010) or (0001). If the result of the determination indicates that the input data matches the pattern of (0011), (0010) or (0001), the flow of the processing goes on to a step S218 at which the conversion-pattern detection unit 121 outputs information on determination of 4-data-bit and 6-channel-bit conversion patterns to the conversion-pattern determination unit 53 and the conversion tables 122A to 122D. Then, at the next step S219, the conversion table 122B is used for converting the 4-bit data into 6 channel bits. Subsequently, the 6 channel bits are supplied to the conversion-pattern determination unit 53. That is to say, if the input data matches the pattern of (0011), a code sequence of "010 100" is supplied to the conversion-pattern determination unit 53. By the same token, if the input data matches the pattern of (0010), a code sequence of "010 100" is supplied to the conversion-pattern determination unit 53. Likewise, if the input data matches the pattern of (0001), a code sequence of "000 100" is supplied to the conversion-pattern determination unit 53. The information generated in the process carried out at the step S218 as the information on determination of 4-data-bit and 6-channel-bit conversion patterns is confirmed in a process carried out at a step S369 of the flowchart shown in FIG. 13 and, as a result of the confirmation, the code sequence produced in the conversion process carried out at the step S219 is selected and output at a step S370.

If the determination result produced in the process carried out at the step S217 indicates that the input data does not matches the patterns of (0011), (0010) and (0001), on the other hand, the flow of the processing goes on to a step S220 at which the conversion-pattern detection unit 121 produces a result of determination as to whether or not the input data matches a pattern of (11), (10) or (01). If the result of the determination indicates that the input data matches a pattern of (11), (10) or (01), the flow of the processing goes on to a step S221 at which the conversion-pattern detection unit 121 outputs information on determination of 2-data-bit and 3-channel-bit conversion patterns to the conversion-pattern determination unit 53 and the conversion tables 122A to 122D. The information on determination of 2-data-bit and 3-channel-bit conversion patterns is used in processes carried out at steps S371 and S372 of the flowchart shown in FIG. 13.

Then, at the next step S222, the conversion-pattern detection unit 121 produces a result of determination as to whether or not the input data matches the pattern of (11). If the result of the determination indicates that the input data matches the pattern of (11), the flow of the processing goes on to a step S223 at which the conversion-pattern detection unit 121 outputs information on recognition of an indeterminate pattern to the selector 123. The information on recognition of an indeterminate pattern is used in a process carried out at a step S252 of a flowchart to be described later by referring to FIG. 10. Then, the flow of the processing goes on to a step S224. At the step S224, the conversion table 122A is used for converting the 2-bit data into 3 channel bits.

If the determination result produced in the process carried out at the step S222 indicates that the input data does not match the pattern of (11), on the other hand, the flow of the processing goes on to the step S224 directly, skipping the process carried out at the step S223. That is to say, the flow of the processing goes on from the step S223 to the step S224 or from the step S222 to the step S224 if the determination result produced in the process carried out at the step S222 indicates that the input data does not match the pattern of (11). At the step S224, the 2-bit data is converted into 3 channel bits on the basis of conversion patterns shown in the conversion table 122A. Details of the processing carried out at the step S224 to convert the 2-bit data into 3 channel bits are explained by referring to the flowchart shown in FIG. 10.

Next, details of the processing carried out at the step S224 of the flowchart shown in FIG. 9 to convert 2-bit data into 3 channel bits are explained by referring to the flowchart shown in FIG. 10 as follows.

Figure 10:
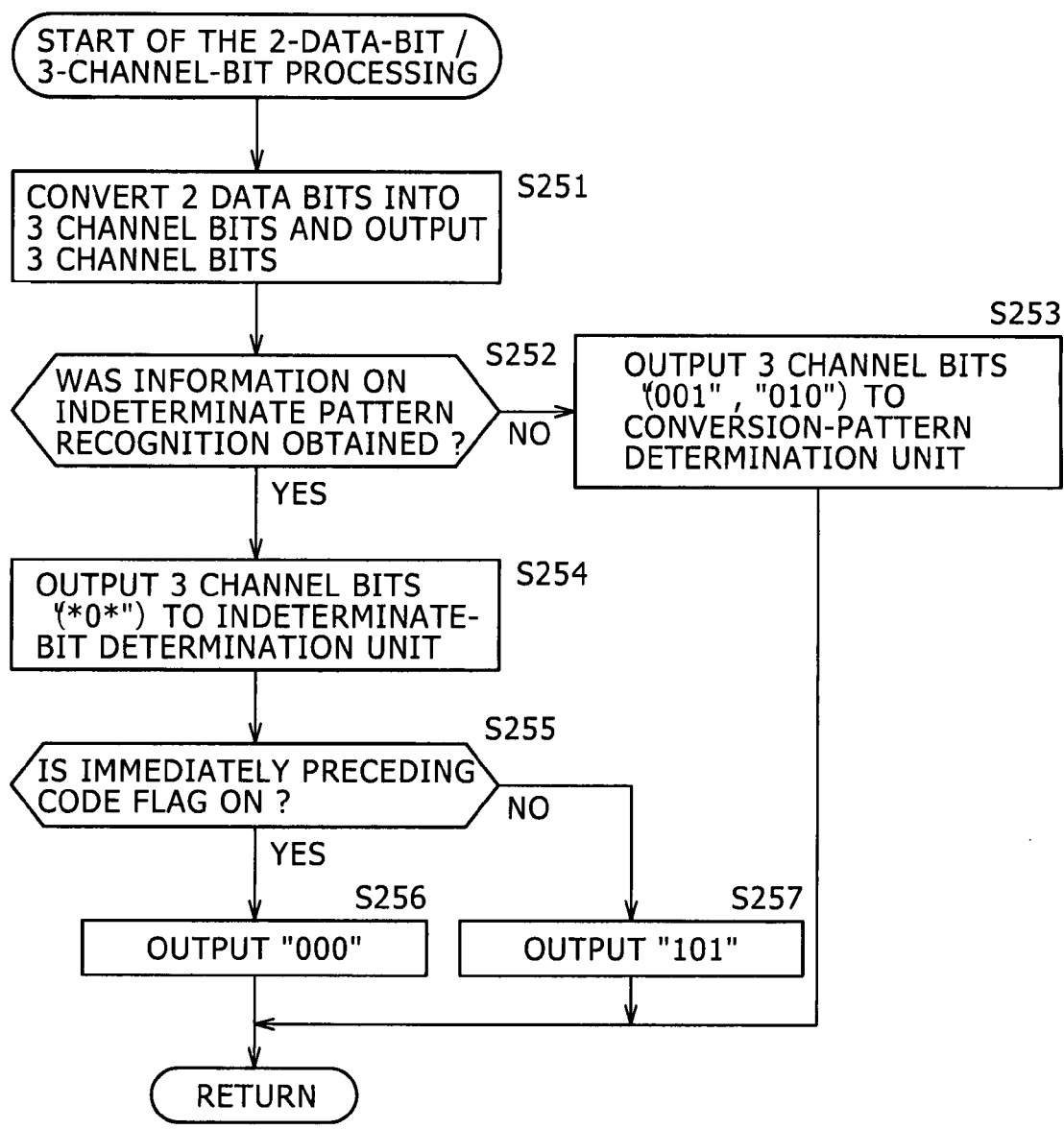
FIG. 10 shows a flowchart to be referred to in explanation of processing carried out at a step S224 of the flowchart shown in FIG. 9 to carry out a 2-data-bit/3-channel-bit process.

As shown FIG. 10, the flowchart begins with a step S251 at which the conversion table 122A is used for converting the 2-bit data into 3 channel bits, which are output to the selector 123. To put it in detail, if the input 2-bit data is the data pattern of (11), a code sequence of "*0*" is output from the conversion table 122A. If the input 2-bit data is the data pattern of (10), a code sequence of "001" is output from the conversion table 122A. If the input 2-bit data is the data pattern of (01), a code sequence of "010" is output from the conversion table 122A.

Then, at the next step S252, the selector 123 produces a result of determination as to whether or not information on recognition of an indeterminate pattern has been received from the conversion-pattern detection unit 121. As described earlier, conversion-pattern detection unit 121 outputs the information on recognition of an indeterminate pattern to the selector 123 at the step S223 of the flowchart shown in FIG. 9. If the result of the determination indicates that the information on recognition of an indeterminate pattern has not been received from the conversion-pattern detection unit 121, the flow of the processing goes on to a step S253 at which the selector 123 carries out a process to output 3 channel bits to the conversion-pattern determination unit 53. To put it concretely, the selector 123 carries out a process to supply a channel bit sequence output from the conversion table 122A as a sequence including no indeterminate bits to the conversion-pattern determination unit 53. The channel bit sequence output from the conversion table 122A as a sequence including no indeterminate bits is "001" or "010". The channel bit sequence output in the process carried out at the step S253 is selected and output at a process carried out a step S374 of the flowchart shown in FIG. 13.

If the determination result produced in the process carried out at the step S252 indicates that the information on recognition of an indeterminate pattern has been received from the conversion-pattern detection unit 121, on the other hand, the flow of the processing goes on to a step S254 at which the selector 123 outputs the channel bit sequence of "*0*" to the indeterminate-bit determination unit 124. Then, at the next step S255, the indeterminate-bit determination unit 124 produces a result of determination as to whether or not an immediately preceding code flag is on. The immediately preceding code flag is a flag output by the immediately preceding code detection unit 71 as a flag having a value set at a process carried out at a step S303 or S304 of a flowchart to be described later by referring to FIG. 11. The immediately preceding code flag is turned on in order to indicate that the 1 channel bit of an immediately preceding code word sequence is "1". If the determination result produced in the process carried out at the step S255 indicates that the immediately preceding code flag is on, the flow of the processing goes on to a step S256 at which the indeterminate-bit determination unit 124 outputs a code word sequence of "000" to the conversion-pattern determination unit 53. By the way, the immediately preceding code flag is turned off in order to indicate that the 1 channel bit of an immediately preceding code word sequence is "0". If the determination result produced in the process carried out at the step S255 indicates that the immediately preceding code flag is off, on the other hand, the flow of the processing goes on to a step S257 at which the indeterminate-bit determination unit 124 outputs a code word sequence of "101" to the conversion-pattern determination unit 53. The code sequence output in the process carried out at the step S256 or S257 is selected and output at a process carried out a step S373 of the flowchart shown in FIG. 13.

Figure 11:
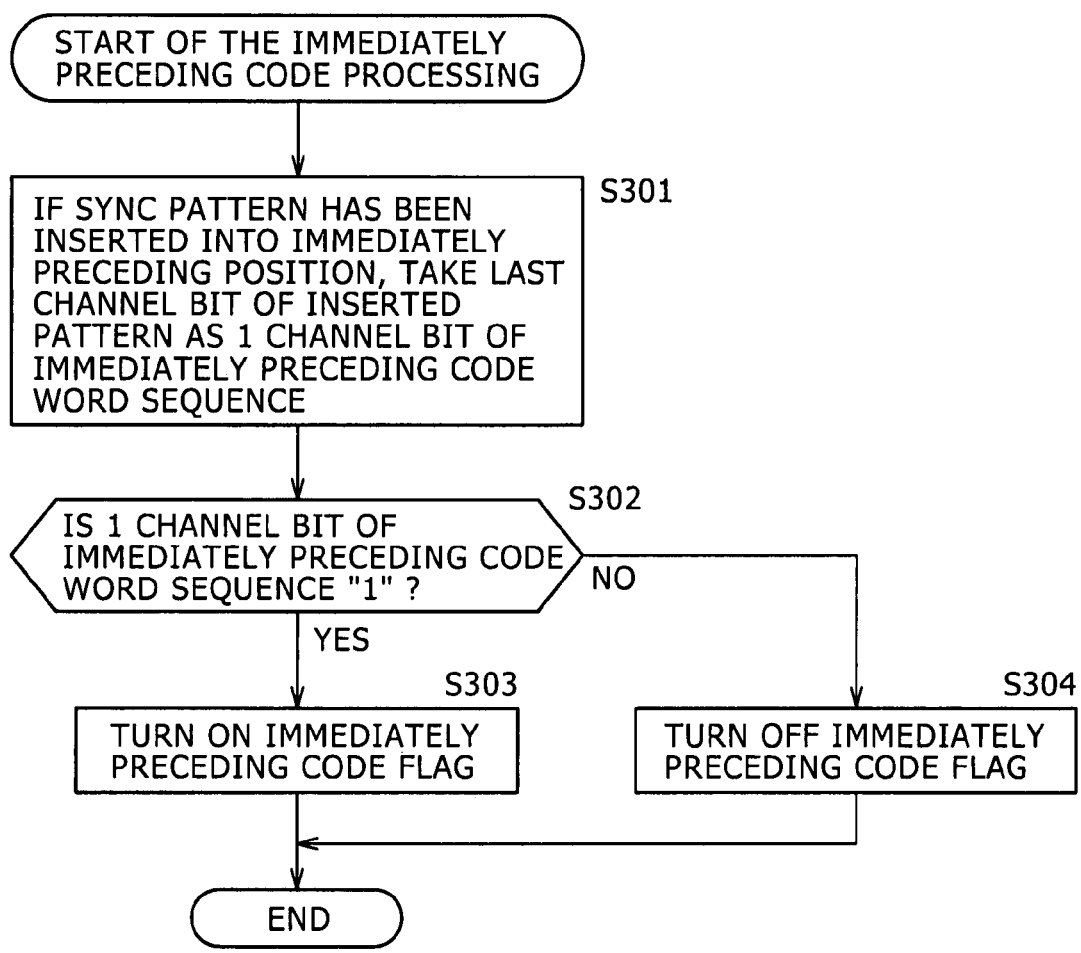
FIG. 11 shows a flowchart to be referred to in explanation of processing to detect an immediately preceding code.
Figure 12:
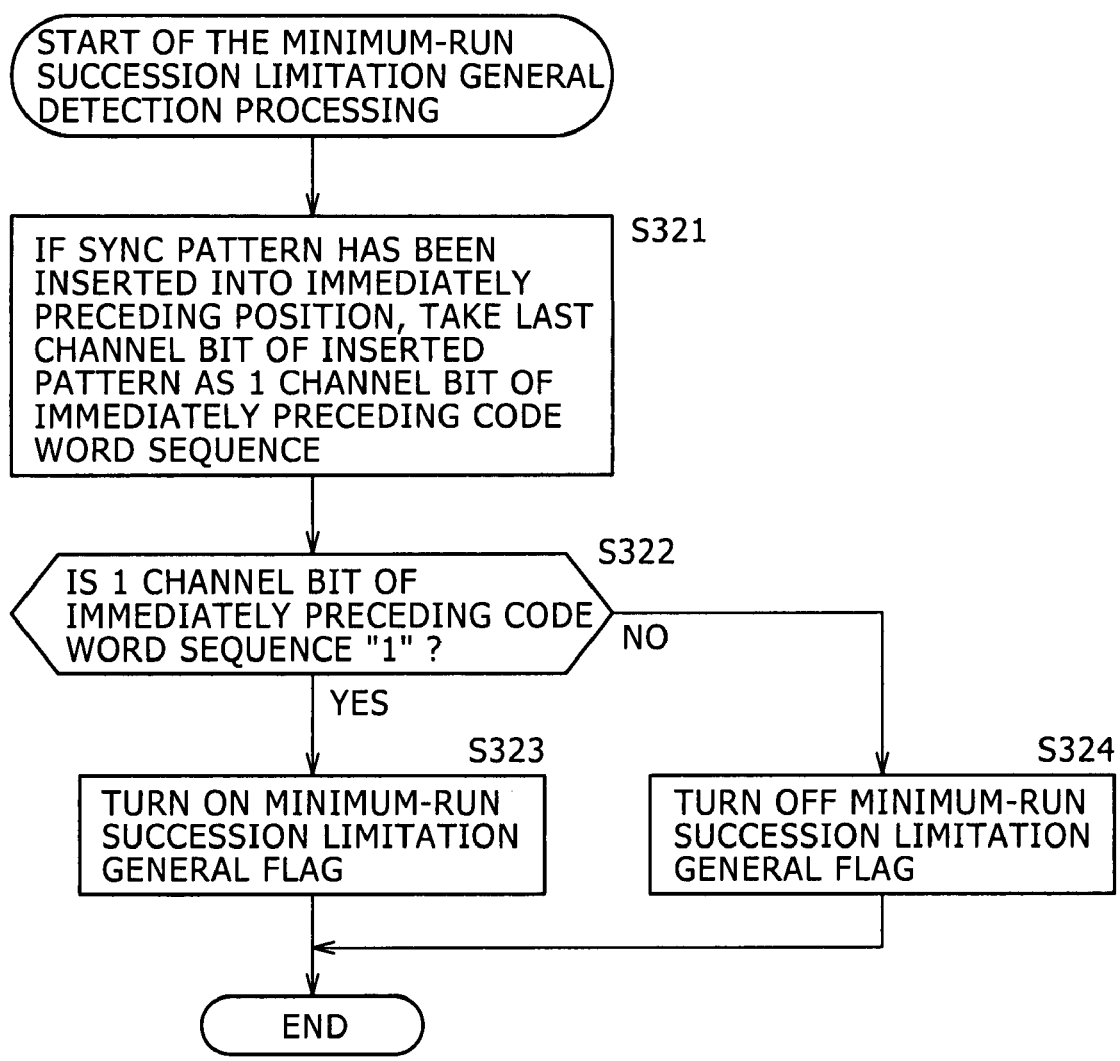
FIG. 12 shows a flowchart to be referred to in explanation of minimum-run succession limitation general detection processing.

By referring to the flowcharts shown in FIGS. 11 and 12, the following description explains respectively processing carried out by the immediately preceding code detection unit 71 and processing carried out by the general detection unit 72.

First of all, the processing carried out by the immediately preceding code detection unit 71 to detect an immediately preceding code sequence is explained by referring to the flowchart shown in FIG. 11.

As shown in FIG. 11, the flowchart begins with a S301 at which the immediately preceding code detection unit 71 takes the last channel bit of an inserted synchronization pattern as 1 channel bit of the immediately preceding code word sequence if such a synchronization pattern has been inserted into a position immediately preceding the data. That is to say, on the basis of the output of the synchronization-pattern insertion unit 23, the immediately preceding code detection unit 71 produces a result of determination as to whether or not a synchronization pattern has been inserted into a position immediately preceding the data. If the result of the determination indicates that a synchronization pattern has been inserted into a position immediately preceding the data, the immediately preceding code detection unit 71 takes the last channel bit of the inserted synchronization pattern as 1 channel bit of the immediately preceding code word sequence. The 1 channel bit of the immediately preceding code word sequence will be examined in a determination process carried out at the next step S302.

Then, at the step S302, the immediately preceding code detection unit 71 produces a result of determination as to whether or not the 1 channel bit of a code sequence eventually confirmed by the conversion-pattern determination unit 53 as a code sequence immediately preceding the next conversion process is "1". If the result of determination indicates that the 1 channel bit of the immediately preceding code sequence is "1", the flow of the processing goes on to a step S303 at which the immediately preceding code detection unit 71 turns on the immediately preceding code flag and outputs the flag to the indeterminate-bit determination unit 124. If the determination result produced in the process carried out at the step S302 indicates that the 1 channel bit of the immediately preceding code sequence is not "1", that is, the 1 channel bit of the immediately preceding code sequence is "0", on the other hand, the flow of the processing goes on to a step S304 at which the immediately preceding code detection unit 71 turns off the immediately preceding code flag and outputs the flag to the indeterminate-bit determination unit 124. The immediately preceding code flag is used in the process carried out at the step S255 of the flowchart shown in FIG. 10.

Next, the minimum-run succession limitation general detection processing carried out by the general detection unit 72 to detect an immediately preceding code sequence is explained by referring to the flowchart shown in FIG. 12.

As shown in FIG. 12, the flowchart begins with a S321 at which the general detection unit 72 takes the last channel bit of an inserted synchronization pattern as 1 channel bit of the immediately preceding code word sequence if such a synchronization pattern has been inserted into a position immediately preceding the data. That is to say, on the basis of the output of the synchronization-pattern insertion unit 23, the general detection unit 72 produces a result of determination as to whether or not a synchronization pattern has been inserted into a position immediately preceding the data. If the result of the determination indicates that a synchronization pattern has been inserted into a position immediately preceding the data, the general detection unit 72 takes the last channel bit of the inserted synchronization pattern as 1 channel bit of the immediately preceding code word sequence. The 1 channel bit of the immediately preceding code word sequence will be examined in a determination process carried out at the next step S322.

Then, at the step S322, the general detection unit 72 produces a result of determination as to whether or not the 1 channel bit of a code sequence eventually confirmed by the conversion-pattern determination unit 53 as a code sequence immediately preceding the next conversion process is "1". If the result of determination indicates that the 1 channel bit of the immediately preceding code sequence is "1", the flow of the processing goes on to a step S323 at which the general detection unit 72 turns on the immediately preceding code flag and outputs the flag to the special-rule conversion-pattern detection unit 131. If the determination result produced in the process carried out at the step S322 indicates that the 1 channel bit of the immediately preceding code sequence is not "1", that is, the 1channel bit of the immediately preceding code sequence is "0", on the other hand, the flow of the processing goes on to a step S324 at which the general detection unit 72 turns off the immediately preceding code flag and outputs the flag to the special-rule conversion-pattern detection unit 131. The immediately preceding code flag is used in the process carried out at the step S153 of the flowchart shown in FIG. 7.

It is to be noted that, in this embodiment, the detection processing represented by the flowchart shown in FIG. 11 is identical with the detection processing represented by the flowchart shown in FIG. 12 as is obvious from the above description. Thus, they can be implemented as a common routine. In the detection processing represented by the flowchart shown in FIG. 11, however, an immediately preceding code sequence output from a conversion table is examined while, in the detection processing represented by the flowchart shown in FIG. 12, an immediately preceding code sequence output from a different conversion table may be examined.

Next, the processing carried out at the step S8 of the flowchart shown in FIG. 4 to determine a conversion pattern is explained by referring to the flowchart shown in FIG. 13.

As shown in FIG. 13, the flowchart begins with a S361 at which the conversion-pattern determination unit 53 produces a result of determination as to whether or not the special-rule conversion-pattern control flag is on. The special-rule conversion-pattern control flag is a flag output by the special-rule conversion-pattern processing control unit 54 in the process carried out at the step S185 or S186 of the flowchart shown in FIG. 8. If the result of the determination indicates that the special-rule conversion-pattern control flag is on, the flow of the processing goes on to a step S362 at which the conversion-pattern determination unit 53 selects conversion patterns for conversion of an 8-bit replacement pattern into a pattern of 12 channel bits and outputs the pattern of 12 channel bits. This is because the special-rule conversion pattern does not include a DSV control bit as evidenced by the processing flow from the step S184 to the step S186 in the flowchart shown in FIG. 8 so that, even if the special-rule conversion pattern is used, the DSV control is not difficult to execute. To put it concretely, in the process carried out at the step S362, the conversion-pattern determination unit 53 selects an 8-bit data pattern of (1110111) as a pattern to be converted into a 12-bit code pattern of "010 000 000 101" and outputs the code pattern of "010 000 000 101" as channel bits. The code pattern of "010 000 000 101" is selected and output at the step S155 of the flowchart shown in FIG. 7 as a result of a process to convert the data pattern of (01110111) serving as an even/odd characteristic retention violating pattern (or a special-rule conversion pattern).

If the determination result produced in the process carried out at the step S361 indicates that the special-rule conversion-pattern control flag is off, on the other hand, the process of the step S362 is not carried out. This is because the special-rule conversion pattern includes a DSV control bit as evidenced by the processing flow from the step S184 to the step S185 in the flowchart shown in FIG. 8 so that, if the special-rule conversion pattern is used, the DSV control may be difficult to execute in some cases.

For the reason described above, if the determination result produced in the process carried out at the step S361 indicates that the special-rule conversion-pattern control flag is off, that is, if the special-rule conversion pattern includes a DSV control bit, the flow of the processing goes on to a step S363 at which the conversion-pattern determination unit 53 produces a result of determination as to whether or not the minimum-run succession limitation pattern detection flag is on. The minimum-run succession limitation pattern detection flag is turned on in the process carried out at the step S75 of the flowchart shown in FIG. 6 due to the fact that the data pattern is (110111) and the next 3 channel bits are "010". If the determination result produced in the process carried out at the step S363 indicates that the minimum-run succession limitation pattern detection flag has been turned on to indicate that the data pattern matches (110111) and the next 3 channel bits are "010", the flow of the processing goes on to a step S364 at which the conversion-pattern determination unit 53 selects conversion patterns for conversion of a 6-bit replacement pattern into a pattern of 9 channel bits and outputs the pattern of 9 channel bits. To put it concretely, the conversion-pattern determination unit 53 selects the 6-bit data pattern of (110111) as a pattern to be converted into a 9-bit code pattern of "001 000 000" and outputs the code pattern of "001 000 000" as channel bits. The channel-bit sequence of "001 000 000" is a replacement pattern output in the process carried out at the step S76 of the flowchart shown in FIG. 6.

If the determination result produced in the process carried out at the step S363 indicates that the special-rule conversion-pattern control flag is off, that is, the data pattern does not match (110111) or the data pattern matches (110111) but the next 3 channel bits are not "010", on the other hand, the flow of the processing goes on to a step S365 at which the conversion-pattern determination unit 53 produces a result of determination as to whether or not information on determination of 8-data-bit/12-channel-bit conversion patterns has been received. The information on determination of 8-data-bit/12-channel-bit conversion patterns is information output in the process carried out at the step S212 of the flowchart shown in FIG. 9. If the result of determination indicates that the information on determination of 8-data-bit/12-channel-bit conversion patterns has been received, the flow of the processing goes on to a step S366 at which the conversion-pattern determination unit 53 selects conversion patterns for conversion of a 8-bit data pattern into a pattern of 12 channel bits and outputs the pattern of 12 channel bits. To put it concretely, the conversion-pattern determination unit 53 selects an 8-bit data pattern to be converted into a 12-bit code pattern of "000 100 100 100" or "010 100 100 100" and outputs the code pattern of "000 100 100 100" or "010 100 100 100" as channel bits. The channel-bit sequence of "000 100 100 100" or "010 100 100 100" is a code pattern output in the process carried out at the step S213 of the flowchart shown in FIG. 9.

If the determination result produced in the process carried out at the step S365 indicates that the information on determination of 8-data-bit/12-channel-bit conversion patterns has not been received, on the other hand, the flow of the processing goes on to a step S367 at which the conversion-pattern determination unit 53 produces a result of determination as to whether or not information on determination of 6-bit/9-channel-bit conversion patterns has been received. The information on determination of 6-bit/9-channel-bit conversion patterns is information output in the process carried out at the step S215 of the flowchart shown in FIG. 9. If the result of determination indicates that the information on determination of 6-bit/9-channel-bit conversion patterns has been received, the flow of the processing goes on to a step S368 at which the conversion-pattern determination unit 53 selects conversion patterns for conversion of a 6-bit data pattern into a pattern of 9 channel bits and outputs the pattern of 9 channel bits. To put it concretely, the conversion-pattern determination unit 53 selects a 6-bit data pattern to be converted into a 9-bit code pattern of "000 100 100", "000 100 000", "010 100 100" or "010 100 000" and outputs the code pattern of "000 100 100", "000 100 000", "010 100 100" or "010 100 000" as channel bits. The channel-bit sequence of "000 100 100", "000 100 000", "010 100 100" or "010 100 000" is a code pattern output in the process carried out at the step S216 of the flowchart shown in FIG. 9.

If the determination result produced in the process carried out at the step S367 indicates that the information on determination of 6-bit/9-channel-bit conversion patterns has not been received, on the other hand, the flow of the processing goes on to a step S369 at which the conversion-pattern determination unit 53 produces a result of determination as to whether or not information on determination of 4-data-bit/6-channel-bit conversion patterns has been received. The information on determination of 4-data-bit/6-channel-bit conversion patterns is information output in the process carried out at the step S218 of the flowchart shown in FIG. 9. If the result of determination indicates that the information on determination of 4-data-bit/6-channel-bit conversion patterns has been received, the flow of the processing goes on to a step S370 at which the conversion-pattern determination unit 53 selects conversion patterns for conversion of a 4-bit data pattern into a pattern of 6 channel bits and outputs the pattern of 6 channel bits. To put it concretely, the conversion-pattern determination unit 53 selects a 4-bit data pattern to be converted into a 6-bit code pattern of "010 100", "010 000" or "000 100" and outputs the code pattern of "010 100", "010 000" or "000 100" as channel bits. The channel-bit sequence of "010 100", "010 000" or "000 100" is a code pattern output in the process carried out at the step S219 of the flowchart shown in FIG. 9.

If the determination result produced in the process carried out at the step S369 indicates that the information on determination of 4-data-bit/6-channel-bit conversion patterns has not been received, on the other hand, the flow of the processing goes on to a step S371 at which the conversion-pattern determination unit 53 produces a result of determination as to whether or not information on determination of 2-data-bit/3-channel-bit conversion patterns has been received from the conversion-pattern detection unit 121. The information on determination of 2-data-bit/3-channel-bit conversion patterns is information output in the process carried out at the step S221 of the flowchart shown in FIG. 9. If the result of determination indicates that the information on determination of 2-data-bit/3-channel-bit conversion patterns has been received, the flow of the processing goes on to a step S372 at which the conversion-pattern determination unit 53 further produces a result of determination as to whether or not the information on determination of 2-data-bit/3-channel-bit conversion patterns is the information on determination of 2-data-bit/3-channel-bit conversion patterns for a data pattern of (11). This is because it is quite within the bounds of possibility that the data pattern of (11) is converted into a code pattern including an indeterminate bit. If the result of the determination indicates that the information on determination of 2-data-bit/3-channel-bit conversion patterns is the information on determination of 2-data-bit/3-channel-bit conversion patterns for a data pattern of (11), the flow of the processing goes on to a step S373 at which the conversion-pattern determination unit 53 selects and output 3 channel bits produced by the indeterminate-bit determination unit 124. To put it concretely, the conversion-pattern determination unit 53 selects and outputs the 3-bit code pattern of "000" or "101" as channel bits. The channel-bit sequence of "000" or "101" is a code pattern output in the process carried out respectively at the step S256 or S257 of the flowchart shown in FIG. 10.

If the determination result produced in the process carried out at the step S372 indicates that the information on determination of 2-data-bit/3-channel-bit conversion patterns is not the information on determination of 2-data-bit/3-channel-bit conversion patterns for the data pattern of (11), which may be converted into a code pattern including an indeterminate bit, on the other hand, the flow of the processing goes on to a step S374 at which the conversion-pattern determination unit 53 selects and output 3 channel bits produced by the selector 123. To put it concretely, the conversion-pattern determination unit 53 selects and outputs the 3-bit code pattern of "001" or "010" as channel bits. The channel-bit sequence of "001" or "010" is a code pattern output in the process carried out at the step S253 of the flowchart shown in FIG. 10.

When conversion patterns are determined as described above, the data sequence is shifted through the shift register 42 by a shift distance equivalent to channel bits corresponding to the determined conversion patterns. Then, processing to determine the next conversion pattern of the input data is carried out.

By carrying out the modulation processing based on conversion patterns listed in the modulation table given as Table 3 as described above, it is possible to reduce the length of a member easily causing an erroneous pattern at a recording time due to successive minimum runs included in the member. In addition, conversion tables with few error propagations occurring at a demodulation time are used. Thus, a stable system can be realized.

It is also possible to provide a configuration in which the special-rule conversion-pattern processing control unit 54 keeps the special-rule conversion-pattern control flag in an on state to permit a conversion process all the time, and determines a conversion pattern in accordance with a signal received from an external source. This scheme represents setting of typically utilizing the randomness of the input data and tolerating deteriorated performance of the DSV control to a certain degree. As an alternative, for a system not requiring suppression of low-frequency components, the special-rule conversion-pattern control flag can be kept in an on state to permit a conversion process all the time. In this case, the generated recording-code sequence is an output sequence with the minimum-run succession limited to an upper limit of 5 and it is possible to further reduce the length of a member easily causing an erroneous pattern at a recording time due to successive minimum runs included in the member. As a result, a more stable system can be realized.

In addition, even in the case of the conversion tables other than the modulation table given as Table 3, the special-rule conversion-pattern processing control unit 54 is capable of assuring the DSV control for a special-rule conversion-pattern. Thus, a pattern can be selected from a wide selection range.

FIG. 14 is a block diagram showing the configuration of another embodiment implementing a modulation apparatus according to an embodiment of the present invention. The configuration shown in FIG. 14 is similar to those shown in FIGS. 1 to 3 except that the other embodiment is obtained by adding a replacement-pattern processing control unit 151 to the configuration of the embodiment shown in FIG. 3.

The replacement-pattern processing control unit 151 is a unit for generating information on control of a replacement-pattern process on the basis of information received from the special-rule conversion-pattern processing control unit 54 as information on control of a special-rule conversion-pattern process and outputting the information on control of a replacement-pattern process to the conversion-pattern determination unit 53. The rest of the configuration shown in FIG. 14 is identical with the configuration of the embodiment shown in FIG. 3.

By referring to a flowchart shown in FIG. 15, the following description explains a recording method (which is also referred to as a modulation method) adopted by the modulation apparatus 1 employing a coding apparatus 11 having the configuration shown in FIG. 14.

Processes carried out at steps S401 to S412 of the flowchart shown in FIG. 15 are identical with those of the flowchart shown in FIG. 4 except that, in the flowchart shown in FIG. 15, processing to control a replacement-pattern process is inserted as a step S407 between a step S406 executed to carry out the processing to control the processing to detect a special-rule conversion pattern and a step S408 executed to carry out the processing to detect a conversion pattern. In addition, processing carried out at a step S409 of the flowchart shown in FIG. 15 to determine a conversion pattern is different from the processing carried out at the counterpart step S8 of the flowchart shown in FIG. 4. Otherwise, the processes carried out at the steps S401 to S412 of the flowchart shown in FIG. 15 are identical with those carried out at the steps S1 to S11 of the flowchart shown in FIG. 4.

To be more specific, in the flowchart shown in FIG. 15, prediction processing carried out at the step S403, processing carried out at the step S404 to detect a pattern limiting the succession of minimum runs, processing carried out at the step S405 to detect a special-rule conversion pattern, processing carried out at the step S406 to control the processing to detect a special-rule conversion pattern and processing carried out at the step S408 to detect a conversion pattern are identical with respectively the processes carried out at the steps S3, S4, S5, S6 and S7 of the flowchart shown in FIG. 4. As described earlier, details of the processes carried out at the steps S3, S4, S5, S6 and S7 are described in the flowcharts shown in FIGS. 5, 6, 7, 8 and 9 respectively. For this reason, the steps S403, S404, S405, S406 and S408 are not described concretely in order to avoid duplications of explanations.

By referring to a flowchart shown in FIG. 16, the following description explains the new processing inserted as the step S407 as processing to control of a replacement-pattern process. In addition, by referring to a flowchart shown in FIG. 17, the following description explains the processing carried out at the step S409 to determine a conversion pattern in a way different from the processing carried out to determine a conversion pattern at the step S8, which is described earlier in detail by referring to the flowchart shown in FIG. 13.

First of all, by referring to the flowchart shown in FIG. 16, the following description explains details of the new processing inserted into a stage of the step S407 as processing to control of a replacement-pattern process.

As shown in the figure, the flowchart begins with a step S451 at which the replacement-pattern processing control unit 151 clears a variable count (count=0) at predetermined intervals. That is to say, the replacement-pattern processing control unit 151 initializes the variable count, which will be incremented at a step S453 to be described later. For example, the replacement-pattern processing control unit 151 clears the variable count for every ECC (Error-Correcting Code) block used as an error correction unit. Then, in a process carried out at the next step S452, the replacement-pattern processing control unit 151 produces a result of determination as to whether or not the special-rule conversion-pattern control flag is on. The special-rule conversion-pattern control flag is a flag output in the process carried out at the step S185 or S186 of the flowchart shown in FIG. 8. If the result of the determination indicates that the special-rule conversion-pattern control flag is on, the flow of the processing goes on to the aforementioned step S453 at which the replacement-pattern processing control unit 151 increments the variable count by 1 (count=count+1). The special-rule conversion-pattern control flag turned on indicates that the special-rule conversion-pattern detection flag is on, the prediction flag is not on and the input data does not include a DSV control bit.

The variable count is the number of states each observed so far as a state in which the special-rule conversion-pattern detection flag is on, the prediction flag is off and the input data pattern of (01110111) does not include a DSV control bit. The special-rule conversion-pattern detection flag turned on indicates that the input data matches a pattern of (01110111) and the immediately preceding channel bit is "1". The prediction flag turned off indicates that the input data does not match the pattern of (xx110111) or, even if the input data matches the pattern of (xx110111), the 3 next channel bits are not "010". Thus, the variable count is the number of conversion processes carried out by making use of special-rule conversion patterns. For this reason, the variable count represents a frequency at which special-rule conversion patterns are used in conversion processes.

Then, in a process carried out at the next step S454, the replacement-pattern processing control unit 151 produces a result of determination as to whether or not the variable count is equal to or greater than a reference value determined in advance. If the result of the determination indicates that the variable count is smaller than the reference value, the flow of the processing goes on to a step S456 at which the replacement-pattern processing control unit 151 turns on a replacement-pattern control flag and outputs the flag.

If the determination result produced in the process carried out at the step 452 indicates that the special-rule conversion-pattern control flag is not on, that is, the special-rule conversion-pattern control flag is off or the determination result produced in the process carried out at the step 454 indicates that the variable count is equal to or greater than the reference value, on the other hand, the flow of the processing goes on to a step S455 at which the replacement-pattern processing control unit 151 turns off the replacement-pattern control flag and outputs the flag. The special-rule conversion-pattern detection flag turned off indicates that the input data does not match the pattern of (01110111) or the immediately preceding channel bit is not "1". The special-rule conversion-pattern detection flag turned off may also indicate that the input data matches the pattern of (xx110111) and the immediately preceding channel bit is "1" but the 3 immediately following channel bits are "010". The special-rule conversion-pattern detection flag turned off may also indicate that the input data includes a DSV control bit.

It is obvious that, in the processing described above, the replacement-pattern control flag is turned on in order to indicate a state in which the number of conversion processes carried out by making use of special-rule conversion patterns has not reached the reference value. On the other hand, the replacement-pattern control flag is turned off in order to indicate a state in which the number of conversion processes carried out by making use of special-rule conversion patterns has reached the reference value.

It is to be noted that the processing represented by the flowchart shown in FIG. 16 can also be carried out by the conversion-pattern determination unit 53. That is to say, it is possible to provide a configuration in which the conversion-pattern determination unit 53 owns the variable count embedded therein to be used in execution of replacement-pattern control.

As will be explained later by referring to the flowchart shown in FIG. 17, if the replacement-pattern control flag is on, at a step S483 of the flowchart, a code pattern of "010 000 000 101" obtained as a result of the process carried out at the step S155 of the flowchart shown in FIG. 7 to convert a data pattern of (01110111) is selected and output. That is to say, a conversion process to produce a code pattern that may not be demodulated by a demodulation apparatus based on the conversion table given as Table 2 is carried out. If the code pattern is forcibly demodulated by such a demodulation apparatus, an error will be generated anyway. If the replacement-pattern control flag is off, on the other hand, the code pattern of "010 000 000 101" is not selected. Instead, the data pattern of (01110111) is converted as individual data patterns of (01), (11), (01) and (11) into their respective code patterns and the resulting code patterns are selected and output. That is to say, the resulting code patterns are code patterns that can be demodulated by a demodulation apparatus based on the conversion table given as Table 2.

If a conversion result that may not be demodulated by a demodulation apparatus based on the conversion table given as Table 2 is forcibly demodulated by such a demodulation apparatus, a demodulation error will be generated anyway. The demodulation apparatus based on the conversion table given as Table 2 can be the existing demodulation apparatus or an apparatus compatible with the existing demodulation apparatus. In order to solve this problem, in the process carried out at the step S454 of the flowchart shown in FIG. 16, the reference value to be compared with the variable count is set in advance at a predetermined value in a range allowing a generated error to be corrected in typically an ECC block. Thus, even if a modulation process resulting in a code pattern that may not be demodulated by the existing demodulation apparatus is carried out, the original data can be obtained by carrying out a process to correct an error in an ECC block.

It is to be noted that, if the reference value to be compared with the variable count is set in advance at the upper limit of the range allowing a generated error to be corrected in typically an ECC block, it is feared that an error generated at the same time as a normally generated error may not be corrected. For this reason, it is desirable to give a margin by setting the reference value in advance at a value equal to 50% of the upper limit of the range allowing a generated error to be corrected.

In addition, in the case of this embodiment, in order to make a result of modulation based on conversion patterns listed in the modulation table given as Table 3 compatible with a demodulation apparatus based on the modulation table given as Table 2, the number of times a replacement pattern included in the modulation table given as Table 3 is counted and stored in the variable count. The replacement pattern is a conversion pattern resulting in a code pattern, which will cause an error if demodulated by using demodulation apparatus based on the modulation table given as Table 2. Not included in the modulation table given as Table 2, the replacement pattern is listed separately in the modulation table given as Table 4. Thus, the variable count is the number of conversion processes carried out so far on the basis of the replacement pattern not included in the modulation table given as Table 2 but listed on another table provided to maintain the compatibility. As described earlier, the replacement pattern described in the modulation table given as Table 4 is a special-rule conversion pattern.

A modulation table given as Table 8 is a difference between the modulation table given as Table 2 and a modulation table given as Table 3 (or, strictly speaking, Table 3 (8) to be described later). If a code pattern listed in the modulation table given as Table 8 is used, an error will be generated. For this reason, the number of times a code pattern included in the modulation table given as Table 8 is counted and stored in the variable count. Code patterns listed in the modulation table given as Table 8 are an even/odd characteristic retention violating conversion pattern for a restrain length i of 4 (i=4) and an even/odd characteristic retaining conversion pattern for a restrain length i of 5 (i=5). Thus, the variable count is the number of conversion processes carried out so far on the basis of the even/odd characteristic retention violating conversion pattern or the even/odd characteristic retaining conversion pattern, which are not included in the modulation table given as Table 2 but listed in another table provided to maintain the compatibility. That is to say, the variable count is the number of conversion processes carried out so far on the basis of a code pattern that, which will cause an error if demodulated by using a demodulation apparatus with which compatibility is maintained. The embodiment for the modulation table given as Table 3 (8) will be described later by referring to FIG. 18 and subsequent figures.

Next, by referring to the flowchart shown in FIG. 17, the following description explains details of the processing carried out at the step S409 of the flowchart shown in FIG. 15 to determine a conversion pattern.

As shown in FIG. 17, the flowchart begins with a S481 at which the conversion-pattern determination unit 53 produces a result of determination as to whether or not the special-rule conversion-pattern control flag is on. The special-rule conversion-pattern control flag is a flag output by the special-rule conversion-pattern processing control unit 54 in the process carried out at the step S185 or S186 of the flowchart shown in FIG. 8. The special-rule-conversion-pattern control flag turned on indicates that the DSV control is not difficult to execute even if the special-rule-conversion-pattern is used (or adopted) because a DSV control bit is not included in the data pattern in conformity with the flow of processing from the step S184 to the step S186 in the flowchart shown in FIG. 8.

If the result of the determination indicates that the special-rule conversion-pattern control flag is on, the flow of the processing goes on to a step S482 at which the conversion-pattern determination unit 53 further produces a result of determination as to whether or not a replacement-pattern control flag is on. The replacement-pattern control flag is a flag output by the replacement-pattern processing control unit 151 in the process carried out at the step S455 or S456 of the flowchart shown in FIG. 16. If the result of the determination indicates that the replacement-pattern control flag is on, that is, if the variable count is smaller than the reference value, the flow of the processing goes on to a step S483 at which the conversion-pattern determination unit 53 selects conversion patterns for conversion of a 8-bit replacement pattern into a pattern of 12 channel bits and outputs the pattern of 12 channel bits. To put it concretely, the conversion-pattern determination unit 53 selects a data pattern of (01110111) and outputs a code pattern of "010 000 000 101" serving as a conversion result associated with the data pattern of (01110111), which has been converted into the code pattern of "010 000 000 101" in the process carried out at the step S155 of the flowchart shown in FIG. 7 as an even/odd characteristic retention violating pattern also referred to as a special-rule conversion pattern. If the result of the determination indicates that the replacement-pattern control flag is off, that is, if the variable count is at least equal to the reference value, on the other hand, the process of the step S483 is not carried out.

In addition, the replacement-pattern control flag turned off indicates that the special-rule conversion pattern includes a DSV control bit. Thus, when the special-rule conversion pattern is used (or adopted), there will be a case in which the DSV control is difficult to execute. Therefore, if the replacement-pattern control flag turned is off, the process of the step S483 is not carried out.

The special-rule conversion patterns exist in the modulation table given as Table 3 but are not included in the existing modulation table reproduction-compatible with the modulation table given as Table 2. Thus, if a code sequence obtained as a result of modulation based on the special-rule conversion patterns is demodulated by the existing demodulation apparatus for demodulating a code sequence demodulated by making use of the modulation table given as Table 2, the code sequence will cause a reproduction error. That is to say, the reproduction compatibility is not sustained.

In order to solve the above problem, the reference value to be compared with the variable count in the process carried out at the step S454 of the flowchart shown in FIG. 16 is set in advance at a predetermined value in a range allowing a generated error to be corrected in typically an ECC block. Thus, even if a modulation process is carried out to result in a code pattern that may not be demodulated by the existing demodulation apparatus, the original data can be obtained by carrying out a process to correct an error in an ECC block as long as the number of times the modulation process has been carried out so far does not exceed the reference value set in advance as described above.

If the determination result produced in the process carried out at the step S481 indicates that the special-rule conversion-pattern control flag has been turned off in order to indicate that the special-rule conversion pattern includes a DSV control bit or if the determination result produced in the process carried out at the step S482 indicates that the replacement-pattern control flag is off, meaning that the reproduction compatibility is not sustained, on the other hand, the flow of the processing goes on to a step S484 at which the conversion-pattern determination unit 53 produces a result of determination as to whether or not the minimum-run succession limitation pattern detection flag is on. The minimum-run succession limitation pattern detection flag is a flag is turned on in the process carried out at the step S75 of the flowchart shown in FIG. 6 if the data matches a pattern of (110111) and the following 3 channel bits are "010". If the determination result produced in the process carried out at the step S484 indicates that the minimum-run succession limitation pattern detection flag has been turned on in order to indicate that the data matches a pattern of (110111) and the following 3 channel bits are "010", the flow of the processing goes on to a step S485 at which the conversion-pattern determination unit 53 selects conversion patterns for conversion of a 6-bit replacement pattern into a pattern of 9 channel bits and outputs the pattern of 9 channel bits. To put it concretely, the conversion-pattern determination unit 53 selects and outputs a replacement pattern of "001 000 000" obtained as a result of the conversion process carried out at the step S76 of the flowchart shown in FIG. 6.

If the determination result produced in the process carried out at the step S484 indicates that the minimum-run succession limitation pattern detection flag has been turned off in order to indicate that the data does not match the pattern of (110111) or, even if the data matches the pattern of (110111), the following 3 channel bits are not "010", on the other hand, the flow of the processing goes on to a step S486 at which the conversion-pattern determination unit 53 produces a result of determination as to whether or not information on determination of 8-data-bit/12-channel-bit conversion patterns has been received. The information on determination of 8-data-bit/12-channel-bit conversion patterns is information output in the process carried out at the step S212 of the flowchart shown in FIG. 9. If the result of determination indicates that the information on determination of 8-data-bit/12-channel-bit conversion patterns has been received, the flow of the processing goes on to a step S487 at which the conversion-pattern determination unit 53 selects conversion patterns for conversion of a 8-bit data pattern into a pattern of 12 channel bits and outputs the pattern of 12 channel bits. To put it concretely, the conversion-pattern determination unit 53 selects an 8-bit data pattern to be converted into a 12-bit code pattern of "000 100 100 100" or "010 100 100 100" and outputs the code pattern of "000 100 100 100" or "010 100 100 100" as channel bits.

If the determination result produced in the process carried out at the step S486 indicates that the information on determination of 8-data-bit/12-channel-bit conversion patterns has not been received, on the other hand, the flow of the processing goes on to a step S488 at which the conversion-pattern determination unit 53 produces a result of determination as to whether or not information on determination of 6-bit/9-channel-bit conversion patterns has been received. The information on determination of 6-bit/9-channel-bit conversion patterns is information output in the process carried out at the step S215 of the flowchart shown in FIG. 9. If the result of determination indicates that the information on determination of 6-bit/9-channel-bit conversion patterns has been received, the flow of the processing goes on to a step S489 at which the conversion-pattern determination unit 53 selects conversion patterns for conversion of a 6-bit data pattern into a pattern of 9 channel bits and outputs the pattern of 9 channel bits. To put it concretely, the conversion-pattern determination unit 53 selects a 6-bit data pattern to be converted into a 9-bit code pattern of "000 100 100", "000 100 000", "010 100 100" or "010 100 000" and outputs the code pattern of "000 100 100", "000 100 000", "010 100 100" or "010 100 000" as channel bits.

If the determination result produced in the process carried out at the step S488 indicates that the information on determination of 6-bit/9-channel-bit conversion patterns has not been received, on the other hand, the flow of the processing goes on to a step S490 at which the conversion-pattern determination unit 53 produces a result of determination as to whether or not information on determination of 4-data-bit/6-channel-bit conversion patterns has been received. The information on determination of 4-data-bit/6-channel-bit conversion patterns is information output in the process carried out at the step S218 of the flowchart shown in FIG. 9. If the result of determination indicates that the information on determination of 4-data-bit/6-channel-bit conversion patterns has been received, the flow of the processing goes on to a step S370 at which the conversion-pattern determination unit 53 selects conversion patterns for conversion of a 4-bit data pattern into a pattern of 6 channel bits and outputs the pattern of 6 channel bits. To put it concretely, the conversion-pattern determination unit 53 selects a 4-bit data pattern to be converted into a 6-bit code pattern of "010 100", "010 000" or "000 100" and outputs the code pattern of "010 100", "010 000" or "000 100" as channel bits.

If the determination result produced in the process carried out at the step S490 indicates that the information on determination of 4-data-bit/6-channel-bit conversion patterns has not been received, on the other hand, the flow of the processing goes on to a step S492 at which the conversion-pattern determination unit 53 produces a result of determination as to whether or not information on determination of 2-data-bit/3-channel-bit conversion patterns has been received from the conversion-pattern detection unit 121. The information on determination of 2-data-bit/3-channel-bit conversion patterns is information output in the process carried out at the step S221 of the flowchart shown in FIG. 9. If the result of determination indicates that the information on determination of 2-data-bit/3-channel-bit conversion patterns has been received, the flow of the processing goes on to a step S493 at which the conversion-pattern determination unit 53 further produces a result of determination as to whether or not the information on determination of 2-data-bit/3-channel-bit conversion patterns is the information on determination of 2-data-bit/3-channel-bit conversion patterns for a data pattern of (11). This is because it is quite within the bounds of possibility that the data pattern of (11) is converted into a code pattern including an indeterminate bit. If the result of the determination indicates that the information on determination of 2-data-bit/3-channel-bit conversion patterns is the information on determination of 2-data-bit/3-channel-bit conversion patterns for a data pattern of (11), the flow of the processing goes on to a step S494 at which the conversion-pattern determination unit 53 selects and output 3 channel bits produced by the indeterminate-bit determination unit 124. To put it concretely, the conversion-pattern determination unit 53 selects and outputs the 3-bit code pattern of "000" or "101" as channel bits. The channel-bit sequence of "000" or "101" is a code pattern output in the process carried out respectively at the step S256 or S257 of the flowchart shown in FIG. 10.

If the determination result produced in the process carried out at the step S493 indicates that the information on determination of 2-data-bit/3-channel-bit conversion patterns is not the information on determination of 2-data-bit/3-channel-bit conversion patterns for the data pattern of (11), which may be converted into a code pattern including an indeterminate bit, on the other hand, the flow of the processing goes on to a step S495 at which the conversion-pattern determination unit 53 selects and output 3 channel bits produced by the selector 123. To put it concretely, the conversion-pattern determination unit 53 selects and outputs the 3-bit code pattern of "001" or "010" as channel bits. The channel-bit sequence of "001" or "010" is a code pattern output in the process carried out at the step S253 of the flowchart shown in FIG. 10.

When conversion patterns are determined as described above, the data sequence is shifted through the shift register 42 by a shift distance equivalent to channel bits corresponding to the determined conversion patterns. Then, processing to determine the next conversion pattern of the input data is carried out.

As described above, the embodiment shown in FIG. 14 allows the DSV control to be executed with a high degree of reliability and compatibility with the existing apparatus to be sustained.

By comparing the embodiment shown in FIG. 14 with the embodiment shown in FIG. 3, it becomes obvious that, in the case of the embodiment shown in FIG. 3, a code pattern is selected on the basis of the special-rule conversion-pattern control flag as shown in the flowchart of FIG. 13, but in the case of the embodiment shown in FIG. 14, on the other hand, the special-rule conversion-pattern control flag is changed on the basis of the variable count and a code pattern is selected on the basis of the changed special-rule conversion-pattern control flag as shown in the flowchart of FIG. 17.

It is possible to provide the embodiment shown in FIG. 14 with a modified configuration in which the outputs of the immediately preceding code detection unit 71 and the general detection unit 72 are supplied to the conversion-pattern determination unit 53 and the conversion-pattern determination unit 53 carries out the processing of the indeterminate-bit determination unit 124. Even if detection operations are transferred among the detection units shown in FIG. 14 and the determination operation is transferred from the indeterminate-bit determination unit 124 to the conversion-pattern determination unit 53 in this way, it is possible to construct a configuration for providing the same effects.

As described above, with the basic configuration set at the same configuration as that for the 1, 7 PP code, that is, with the basic configuration set at the same configuration as that for the code with a minimum run d set at 1 (d=1), a maximum run k set at 7 (k=7) and a conversion ratio (m:n) at (2:3), the DSV control can be executed with a high degree of efficiency by inserting 1 DSV control bit into a predetermined position in the data sequence. In addition, it is also possible to provide conversion tables and a modulation apparatus, which are capable of limiting the number of successive minimum runs and improving the characteristic of propagating errors generated at recording and reproduction times even for a case in which a predetermined recognition bit is used and a synchronization pattern is inserted.

On top of that, by providing a configuration like the one shown in FIG. 3, even if the conversion table is a table including even/odd characteristic retention violating patterns as is the case with the modulation table given as Table 3, it is possible to prevent a conversion process based on the even/odd characteristic retention violating patterns at a position into which a DSV control bit has been inserted. Thus, reliable DSV control can be executed.

In addition, by providing a configuration like the one shown in FIG. 14, in a predetermined ECC-block interval, the number of timed the conversion process is carried out on the basis of conversion patterns shown in the modulation table given as Table 4 is counted whereas a flag is turned on to permit the conversion processes as long as the number of conversion processes is smaller than a reference value determined in advance and, as the number of conversion processes reaches the reference value, the flag is turned off to prohibit further conversion processes. It is thus possible to manage the number of times the conversion process based on conversion patterns shown in the modulation table given as Table 4 can be carried out so as to provide reproduction compatibility with the modulation table given as Table 2.

That is to say, by carrying out a modulation process on the basis of the modulation table given as Table 3, it is possible to reduce the number of members each including minimum-runs succession making the member prone to error patterns generated at recording and reproduction times so that the DSV control can be executed with a high degree of reliability. Thus, a more stable system can be implemented. In addition, since a demodulation process can be carried out by making use of not only a demodulation apparatus based on conversion patterns listed in the modulation table given as Table 3, but also a demodulation apparatus based on conversion patterns listed in the modulation table given as Table 2, by making use of a demodulation apparatus available as a product in the market, it is possible to reproduce a code sequence recorded in a format including codes shown in the modulation table given as Table 3 in accordance with the present invention.

It is also possible to provide a configuration in which an indeterminate bit represented by symbol $ or * in the modulation table given as Table 3 is determined by making use of not only the immediately preceding code, but also the immediately succeeding code in order to satisfy a condition set for the table.

In addition, in the process carried out by the embodiment shown in FIG. 14 to control the replacement-pattern processing, one pair of replacement patterns shown in the modulation table given as Table 4 is used. However, it is possible to provide a configuration in which another typical table showing 2 replacement-pattern pairs is employed. In this case, a conversion-process count representing the number of conversion processes carried out so far is found for each of the replacement-pattern pairs in the same way and the sum of the conversion-process counts is compared with a reference value. Also in this configuration, each of the replacement-pattern pairs can be multiplied by a weight, which is set in accordance with a condition for prohibiting the use of replacement patterns of the pair. As another alternative, the use of one of the replacement-pattern pairs can be prohibited completely.

In addition, it is also possible to provide a configuration in which, with a modulation apparatus having Table 3 embedded therein, a code word sequence is output by switching the sequence from a sequence based on conversion patterns shown in the modulation table given as Table 3 to a sequence based on conversion patterns shown in the modulation table given as Table 2 and vice versa in accordance with a control signal received from an external source shown in none of the figures. For example, in accordance with a control signal received from an external source, the replacement-pattern processing control unit 151 employed in the embodiment shown in FIG. 14 can be driven to output information indicating prohibition and permission of a conversion process based on replacement patterns. That is to say, if the control signal received from an external source is a command making a request for prohibition, the conversion-pattern determination unit 53 prohibits a predetermined replacement process. In this case, the conversion-pattern determination unit 53 outputs a code word sequence based on conversion patterns shown in the modulation table given as Table 2.

On top of that, it is also possible to provide a configuration in which information is input from the TOC (Table of Contents) of a disk as a control signal obtained from an external source and a replacement process is controlled on the basis of the information. Let us assume for example that the recording density of a disk with which compatibility is to be sustained is lower and the recording density of a disk with which compatibility is not to be sustained is higher. In this case, if the input recording density of a mounted disk is equivalent to the recording density of a disk with which compatibility is to be sustained, the conversion process based on conversion patterns shown in the modulation table given as Table 4 can be prohibited. If the input recording density of a mounted disk is equivalent to the recording density of a disk with which compatibility is not to be sustained, on the other hand, the conversion process based on conversion patterns shown in the modulation table given as Table 4 can be permitted.

In addition, it is also possible to provide a configuration in which, in the case of a disk having a hybrid structure including a portion with which compatibility is to be sustained and a portion with which compatibility is not to be sustained, information such as an identification flag of the hybrid structure is retrieved from the TOC of the disk and, depending on the recording location of the information, the conversion process based on conversion patterns shown in the modulation table given as Table 4 is prohibited or permitted.

On top of that, it is also possible to provide a configuration in which the period to assure compatibility is determined on the basis of a control signal received from an external source. In this case, on the basis of time information provided by an internal source such as an embedded clock, the conversion process based on conversion patterns shown in the modulation table given as Table 4 is permitted or prohibited. To be more specific, the conversion process is permitted if the time information is within the period or prohibited if the time information is beyond the period.

The description given so far has explained for a case in which data is modulated on the basis of conversion patterns listed in the modulation table given as Table 3. By referring to FIGS. 18 to 27, the following description explains a case in which data is modulated on the basis of conversion patterns listed in a special table obtained by replacing a portion included in the modulation table given as Table 3 as the portion described in the modulation table given as Table 4 with a portion described in the modulation table given as Table 8. That is to say, the special table is obtained from the modulation table given as Table 3 except that the portion described in the modulation table given as Table 4 is replaced with the portion described in the modulation table given as Table 8. In the following description, the special table is also referred to as Table 3 (8) for the sake of convenience.

In this case, the coding apparatus 11 employed in the modulation apparatus 1 has a configuration shown in FIG. 18, which is a block diagram showing a further embodiment of the present invention. The minimum-run succession limitation pattern processing unit 62 has a minimum-run succession limitation table 113B for a process to convert 10-bit data into 15 channel bits in addition to a minimum-run succession limitation table 113A, which corresponds to the minimum-run succession limitation table 113 shown in FIG. 14 as a table used for a process to convert 6-bit data into 9 channel bits. The minimum-run succession limitation table 113B itself is a table, the use frequency of which is counted. The use frequency is defined as the number of times the minimum-run succession limitation table 113B has been used so far. To put it concretely, the minimum-run succession limitation table 113B is used in a process to convert an even/odd characteristic retaining data pattern of (1001110111) listed in the modulation table given as Table 8 for a restrain length i of 5 (i=5) into an even/odd characteristic retaining data pattern of "$0$ 010 000 000 101 (not 010)" corresponding to the even/odd characteristic retaining data pattern of (1001110111).

In addition, the minimum-run succession limitation pattern processing unit 62 employs an indeterminate-bit determination unit 114. The indeterminate-bit determination unit 114 is a unit for confirming indeterminate bits received from the minimum-run succession limitation table 113B on the basis of a minimum-run succession limitation general flag (1) output by the general detection unit 72 and an immediately preceding code flag output by the immediately preceding code detection unit 71 and supplying the result of the confirmation to the conversion-pattern determination unit 53. A replacement-pattern processing control unit 151 is a unit for receiving not only information on special-rule conversion-pattern processing control from the special-rule conversion-pattern processing control unit 54, but also information on detection and prediction of a pattern for limiting the succession of minimum runs from the minimum-run succession limitation pattern detection/prediction unit 111 and information on detection of a pattern for limiting the succession of minimum runs from the minimum-run succession limitation pattern detection unit 112. The rest of the configuration is identical with the configuration of the embodiment shown in FIG. 14.

Recording processing for a modulation process based on conversion patterns listed in the modulation table given as Table 3 (8) is explained by referring to a flowchart shown in FIG. 19. Processes carried out at steps S601 to S612 of the flowchart shown in FIG. 19 are basically identical with respectively the processes carried out at steps S401 to S412 of the flowchart shown in FIG. 15. However, processes carried out as called subroutines at the steps S603 to S607 and the step S609 are different from respectively the processes carried out as called subroutines at the steps S403 to S407 and the step S409, which pertain to the flowchart shown in FIG. 15. Only their differences are explained as follows.

Figure 20:
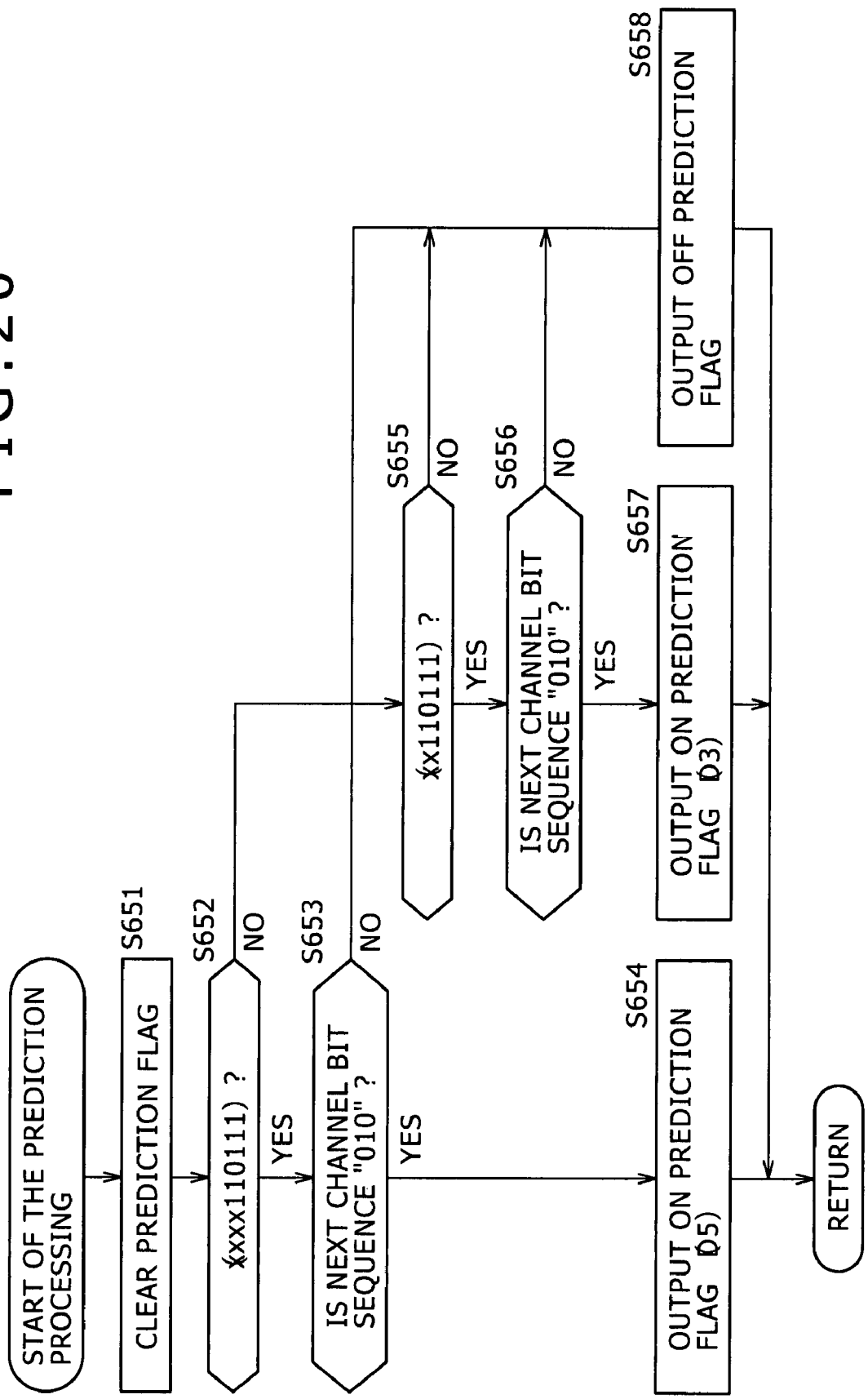
FIG. 20 shows a flowchart to be referred to in explanation of prediction processing carried out at a step S603 of the flowchart shown in FIG. 19.

FIG. 20 is a diagram referred to in explanation of a flowchart representing details of prediction processing carried out at the step S603 of the flowchart shown in FIG. 19.

As shown in the figure, the flowchart begins with a step S651 at which the minimum-run succession limitation pattern detection/prediction unit 111 clears prediction flags. The prediction flags will be turned on and output in processes carried out at steps S654 and S657 as described later as prediction flags (D5) and (D3) respectively. Then, in a process carried out at the next step S652, the minimum-run succession limitation pattern detection/prediction unit 111 produces a result of determination as to whether or not input data received from the shift register 42 matches a pattern of (xxxx110111). The minimum-run succession limitation pattern detection/prediction unit 111 determines whether or not the input data is a data pattern of (110111) by comparing the fifth and subsequent bits of the input data with those of the data pattern. If the result of the determination indicates that the input data matches the pattern of (xxxx110111), the flow of the prediction processing goes on to a step S653 at which the minimum-run succession limitation pattern detection/prediction unit 111 further produces a result of determination as to whether or not the next channel bits are "010". If the result of the determination indicates that the next channel bits are "010", the flow of the prediction processing goes on to the aforementioned step S654 at which the minimum-run succession limitation pattern detection/prediction unit 111 turns on the prediction flag (D5) and outputs the flag to the replacement-pattern processing control unit 151 as information on detection and prediction of a pattern limiting the succession of minimum runs. The prediction flag (D5) will be used in a process carried out at a step S773 of a flowchart shown in FIG. 25.

If the determination result produced in the process carried out at the step S652 indicates that the input data does not matches the pattern of (xxxx110111), on the other hand, the flow of the prediction processing goes on to a step S655 at which the minimum-run succession limitation pattern detection/prediction unit 111 produces a result of determination as to whether or not the input data matches a pattern of (xx110111). The minimum-run succession limitation pattern detection/prediction unit 111 determines whether or not the input data is a data pattern of (110111) by comparing the third and subsequent bits of the input data with those of the data pattern. If the result of the determination indicates that the input data matches the pattern of (xx110111), the flow of the prediction processing goes on to a step S656 at which the minimum-run succession limitation pattern detection/prediction unit 111 further produces a result of determination as to whether or not the next channel bits are "010". If the result of the determination indicates that the next channel bits are "010", the flow of the prediction processing goes on to the aforementioned step S657 at which the minimum-run succession limitation pattern detection/prediction unit 111 turns on the prediction flag (D3) and outputs the flag to the special-rule conversion-pattern processing control unit 54 as information on detection and prediction of a pattern limiting the succession of minimum runs. The prediction flag (D3) will be used in a process carried out at a step S753 of a flowchart shown in FIG. 24.

If the determination result produced in the process carried out at the step S653 indicates that the next channel bits are not "010", that is, the next channel bits are "000", "101" or "001", if the determination result produced in the process carried out at the step S655 indicates that the input data does not match the data pattern of (xx110111) or if the determination result produced in the process carried out at the step S656 indicates that the next channel bits are not "010", that is, the next channel bits are "000", "101" or "001", on the other hand, the flow of the prediction processing goes on to the aforementioned step S658 at which the minimum-run succession limitation pattern detection/prediction unit 111 turns off the prediction flag and output the flags to the replacement-pattern processing control unit 151 as well as the special-rule conversion-pattern processing control unit 54. The prediction flags turned off are the prediction flag (D5) turned on as well as output in the process carried out at the step S654 and the prediction flag (D3) turned on as well as output in the process carried out at the step S657.

Figure 21:
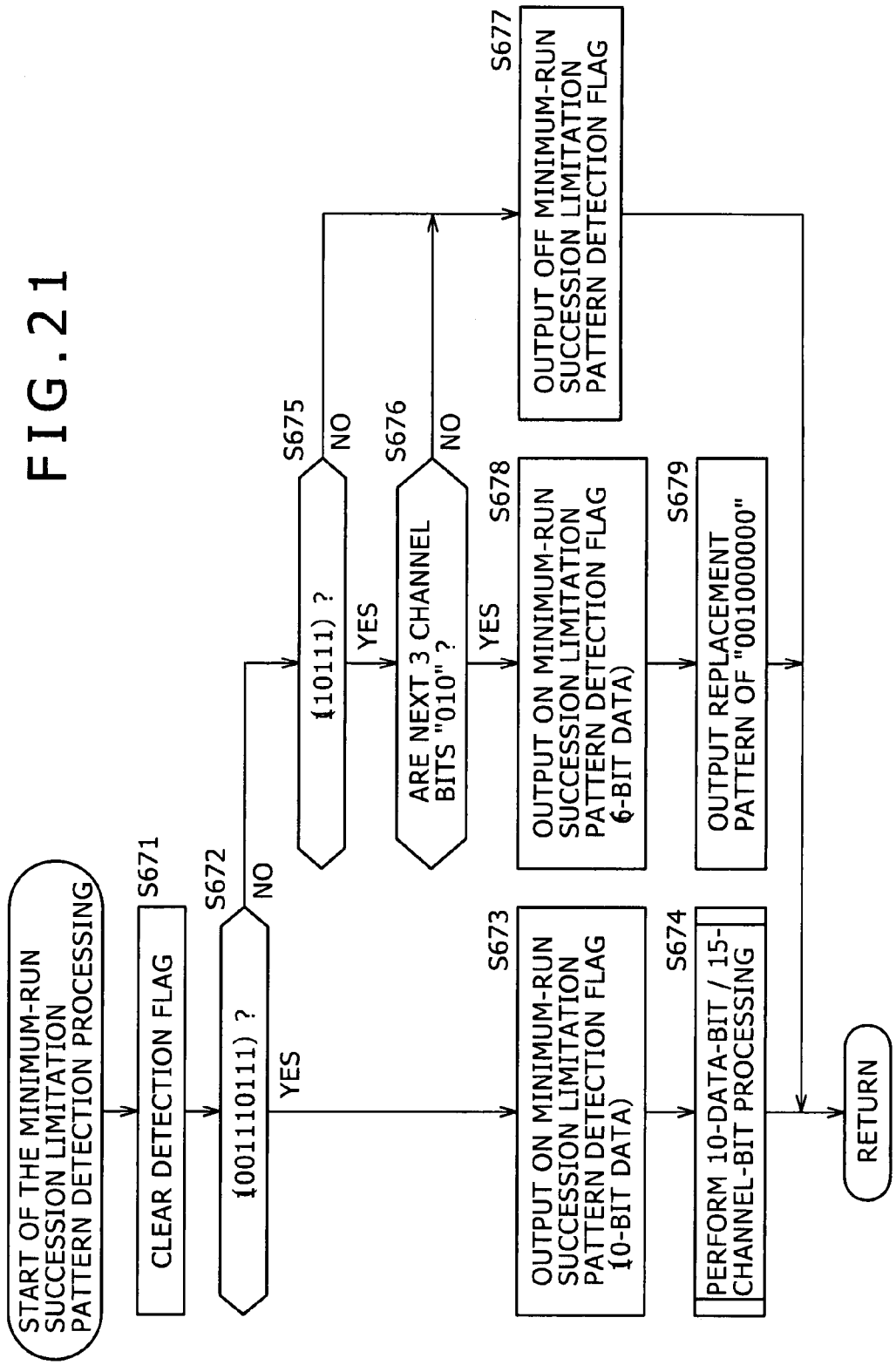
FIG. 21 shows a flowchart to be referred to in explanation of processing carried out at a step S604 of the flowchart shown in FIG. 19 to detect a minimum-run succession limitation pattern.

By referring to a flowchart shown in FIG. 21, the following description explains the processing carried out at the step S604 of the flowchart shown in FIG. 19.

As shown in FIG. 21, the flowchart begins with a step S671 at which the minimum-run succession limitation pattern detection unit 112 clears detection flags. In the following description, the detection flags are also referred to as a minimum-run succession limitation pattern detection flag (10-bit data) and a minimum-run succession limitation pattern detection flag (6-bit data) to be turned on and output in processes carried out respectively at steps S673 and S678 described later. Then, in a process carried out at the next step S672, the minimum-run succession limitation pattern detection unit 112 produces a result of determination as to whether or not data output by the register 42 matches a pattern of (1001110111). If the result of the determination indicates that the data output by the register 42 matches the pattern of (1001110111), the flow of the processing goes on to a step S673 at which the minimum-run succession limitation pattern detection unit 112 turns on the minimum-run succession limitation pattern detection flag (10-bit data) and outputs the flag to the replacement-pattern processing control unit 151 and the minimum-run succession limitation table 113B as information on detection of a pattern for limiting the succession of minimum runs. The minimum-run succession limitation pattern detection flag (10-bit data) is used in a process carried out at a step S772 of the flowchart shown FIG. 25.

Then, at the next step S674, the minimum-run succession limitation table 113B is used in a process to convert 10-bit data into 15 channel bits. Details of this process will be explained later by referring to a flowchart shown in FIG. 22.

Figure 22:
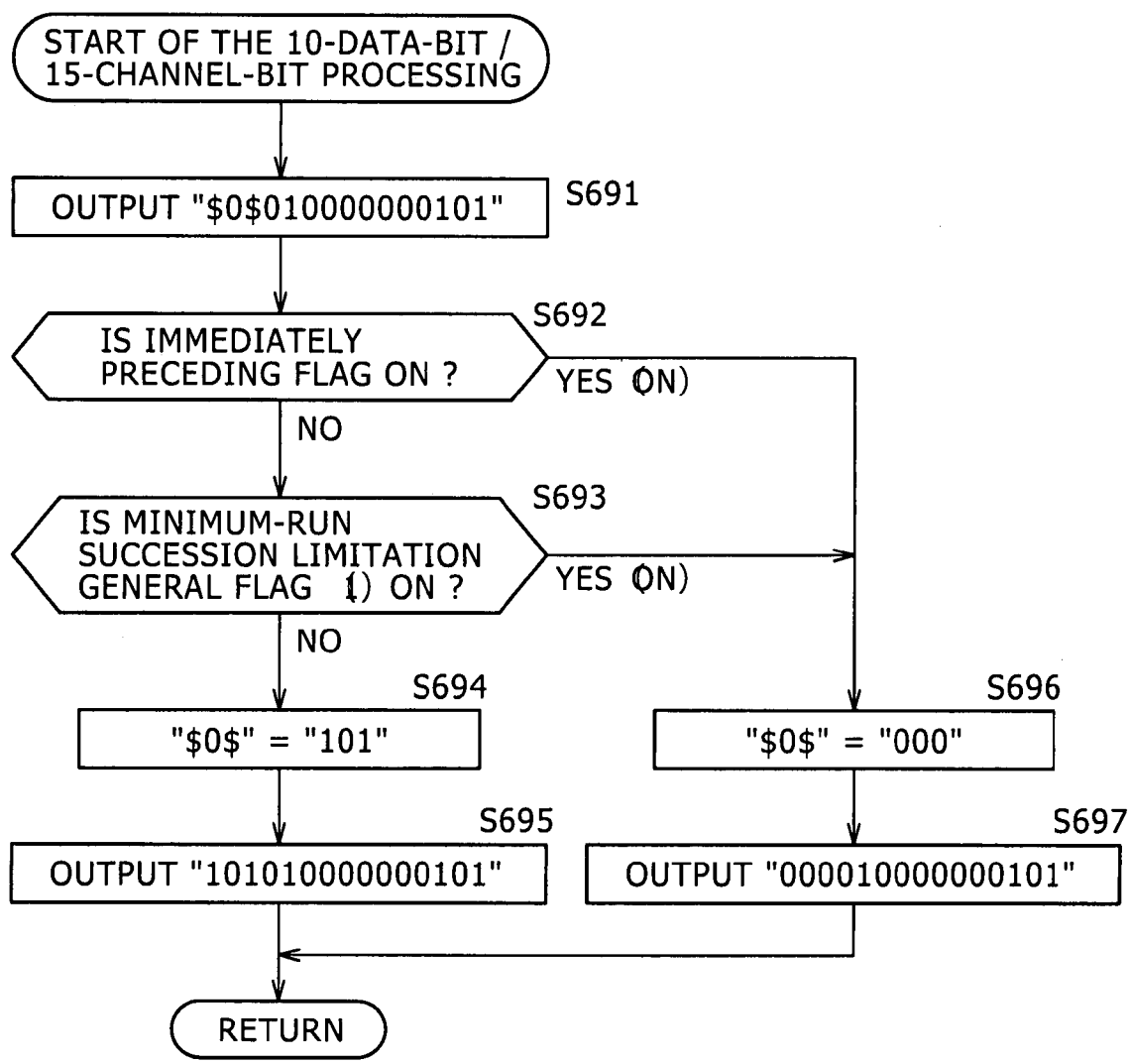
FIG. 22 shows a flowchart to be referred to in explanation of processing carried out at a step S674 of the flowchart shown in FIG. 21 to carry out a 10-data-bit/15-channel-bit process.

By the way, in a process carried out at a step S691 of a flowchart shown in FIG. 22, a code pattern of "$0$ 010 000 000 101" is output from the minimum-run succession limitation table 113B to the indeterminate-bit determination unit 114. Then, in a process carried out at a step S692, the indeterminate-bit determination unit 114 produces a result of determination as to whether or not the immediately,preceding code flag is on. The immediately preceding code flag is a flag turned on or off and output by the immediately preceding code detection unit 71 in a process carried out respectively at a step S303 or S304 of the flowchart shown in FIG. 11. The immediately preceding code flag is turned on if the 1 channel bit of the immediately preceding code word sequence is "1". If the 1 channel bit of the immediately preceding code word sequence is "0", on the other hand, the immediately preceding code flag is turned off.

If the determination result produced in the process carried out at the step S692 indicates that the immediately preceding code flag has been turned on to indicate that the 1 channel bit of the immediately preceding code word sequence is "1", the flow of the processing goes on to a step S696 at which the indeterminate-bit determination unit 114 sets the code word of "$0$" output in the process carried out at the step S691 as a code word including indeterminate bits at "000". Then, in a process carried out at the next step S697, a replacement pattern of "000 010 000 000 101" is output. The replacement pattern, which is a sequence of channel bits, is selected and output in a process carried out at a step S912 of a flowchart shown in FIG. 27.

If the determination result produced in the process carried out at the step S692 indicates that the immediately preceding code flag has not been turned on (or has been turned off) to indicate that the 1 channel bit of the immediately preceding code word sequence is "0", on the other hand, the flow of the processing goes on to a step S693 at which the indeterminate-bit determination unit 114 further produces a result of determination as to whether or not a minimum-run succession limitation general flag (1) is on. The minimum-run succession limitation general flag (1) is a flag detected by the general detection unit 72 in a process carried out at a step S893 of a flowchart shown in FIG. 26. If the 3 channel bits of the immediately preceding code word sequence are "010", the minimum-run succession limitation general flag (1) is turned on. If the 3 channel bits of the immediately preceding code word sequence are not "010", on the other hand, the minimum-run succession limitation general flag (1) is turned off.

If the determination result produced in the process carried 6ut at the step S693 indicates that the minimum-run succession limitation general flag (1) has been turned on to indicate that the 3 channel bits of the immediately preceding code word sequence are "010", the flow of the processing goes on to the step S696 at which the indeterminate-bit determination unit 114 sets the code word of "$0$" output in the process carried out at the step S691 as a code word including indeterminate bits at "000" as described earlier. Then, in the process carried out at the next step S697, a replacement pattern of "000 010 000 000 101" is output as explained before. The replacement pattern, which is a sequence of channel bits, is selected and output in the process carried out at a step S912 of the flowchart shown in FIG. 27 as described before.

If the determination result produced in the process carried out at the step S693 indicates that the minimum-run succession limitation general flag (1) has been turned off to indicate that the 3 channel bits of the immediately preceding code word sequence are not "010", on the other hand, the flow of the processing goes on to the step S694 at which the indeterminate-bit determination unit 114 sets the code word of "$0$" output in the process carried out at the step S691 as a code word including indeterminate bits at "101". Then, in a process carried out at the next step S695, a replacement pattern of "101 010 000 000 101" is output. This replacement pattern, which is a sequence of channel bits, is selected and output in the process carried out at a step S912 of the flowchart shown in FIG. 27.

Let us again refer to the flowchart shown in FIG. 21. If the determination result produced in the process carried out at the step S672 indicates that the data output by the register 42 does not match the pattern of (1001110111), on the other hand, the flow of the processing goes on to a step S675 at which the minimum-run succession limitation pattern detection unit 112 further produces a result of determination as to whether or not the data output by the register 42 matches a pattern of (110111) If the result of the determination indicates that the data output by the register 42 matches the pattern of (110111), the flow of the processing goes on to a step S676 at which the minimum-run succession limitation pattern detection unit 112 further produces a result of determination as to whether or not the next 3 channel bits are "010". If the result of the determination indicates that the next 3 channel bits are "010", the flow of the processing goes on to a step S678 at which the minimum-run succession limitation pattern detection unit 112 turns on the minimum-run succession limitation pattern detection flag (6-bit data) and outputs the flag to the conversion-pattern determination unit 53. The minimum-run succession limitation pattern detection flag (6-bit data) is used in a process carried out at a step S915 of the flowchart shown FIG. 27. In a process carried out at the next step S679, a replacement pattern of "001 000 000" is output from the minimum-run succession limitation table 113B to the conversion-pattern determination unit 53. This replacement pattern, which is a sequence of channel bits, is selected and output in the process carried out at a step S916 of the flowchart shown in FIG. 27.

If the determination result produced in the process carried out at the step S675 indicates that the data output by the register 42 does not matches a pattern of (110111) or if the determination result produced in the process carried out at the step S676 indicates that the next 3 channel bits are not "010", on the other hand, the flow of the processing goes on to a step S677 at which the minimum-run succession limitation pattern detection unit 112 turns off the minimum-run succession limitation pattern detection flags and outputs the flags. In the process to turn off the minimum-run succession limitation pattern detection flags, both the minimum-run succession limitation pattern detection flag (10-bit data) and the minimum-run succession limitation pattern detection flag (6-bit data) are turned off.

Figure 23:
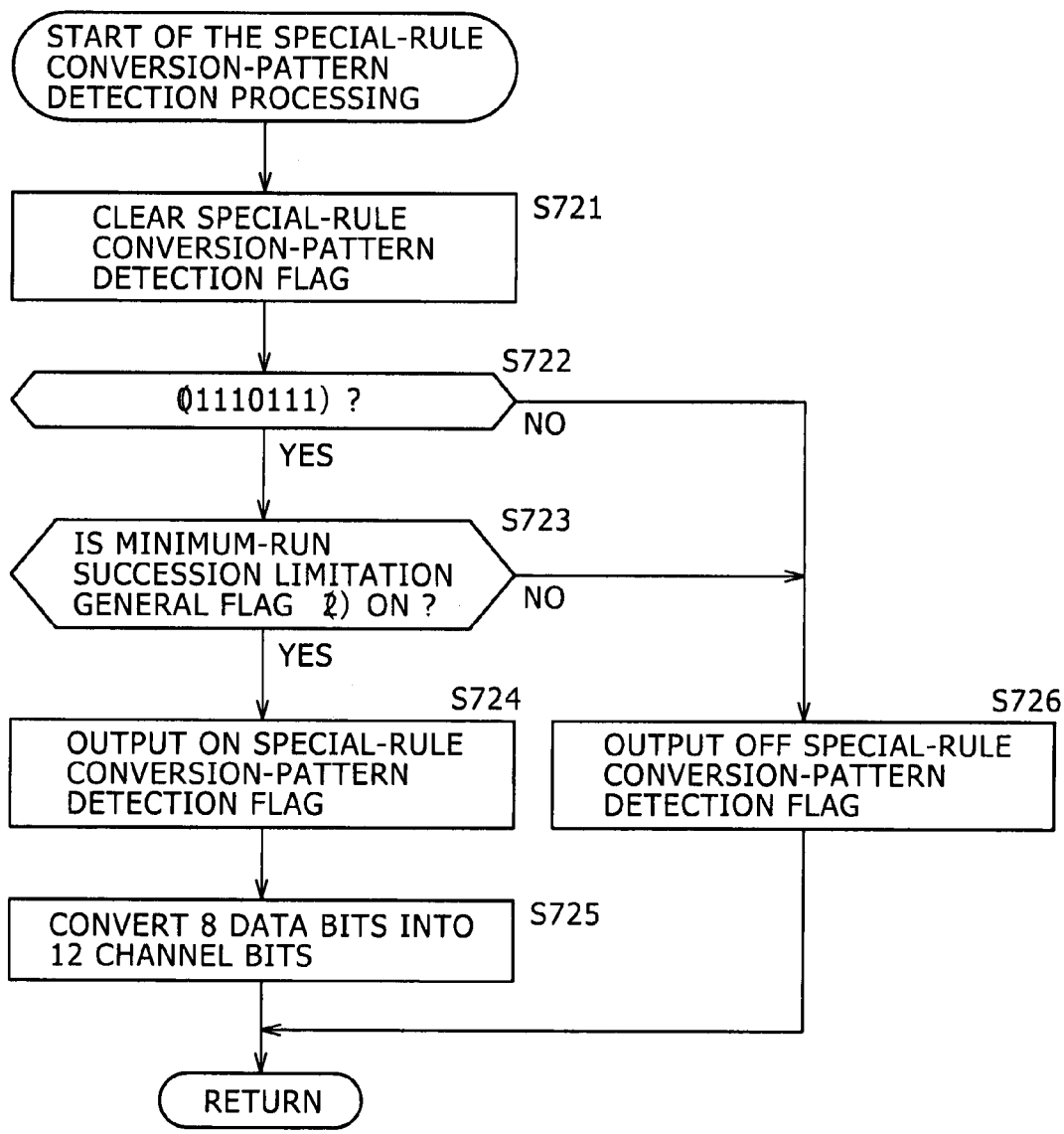
FIG. 23 shows a flowchart to be referred to in explanation of processing carried out at a step S605 of the flowchart shown in FIG. 19 to detect a special-rule conversion pattern.

FIG. 23 is a diagram referred to in explanation of a flowchart representing the processing carried out at the step S605 of the flowchart shown in FIG. 19 to detect a pattern for limiting the succession of minimum runs. Processes carried out at steps S721 to S726 are basically identical with respectively the processes carried out at the steps S151 to S156 of the flowchart shown in FIG. 7.

However, in the process carried out at the step S153 of the flowchart shown in FIG. 7, the special-rule conversion-pattern detection unit 131 produces a result of determination as to whether or not the minimum-run succession limitation general flag is on as described before. In a process carried out at the step S723 of the flowchart shown in FIG. 23, on the other hand, the special-rule conversion-pattern detection unit 131 produces a result of determination as to whether or not the minimum-run succession limitation general flag (2) is on. The minimum-run succession limitation general flag is a flag turned on by the general detection unit 72 in a process carried out at a step S896 of a flowchart explained later by referring to FIG. 26. Much like the minimum-run succession limitation general flag set in the process carried out at the step S323 of the flowchart shown in FIG. 12, the minimum-run succession limitation general flag (2) is a flag, which is turned on when the 1 channel bit of the immediately preceding code word sequence is "1".

Since the rest of the processing represented by the flowchart shown in FIG. 23 is identical with the processing represented by the flowchart shown in FIG. 7, it is not necessary to describe the processing represented by the flowchart shown in FIG. 23 in order to avoid duplications of explanation.

Figure 24:
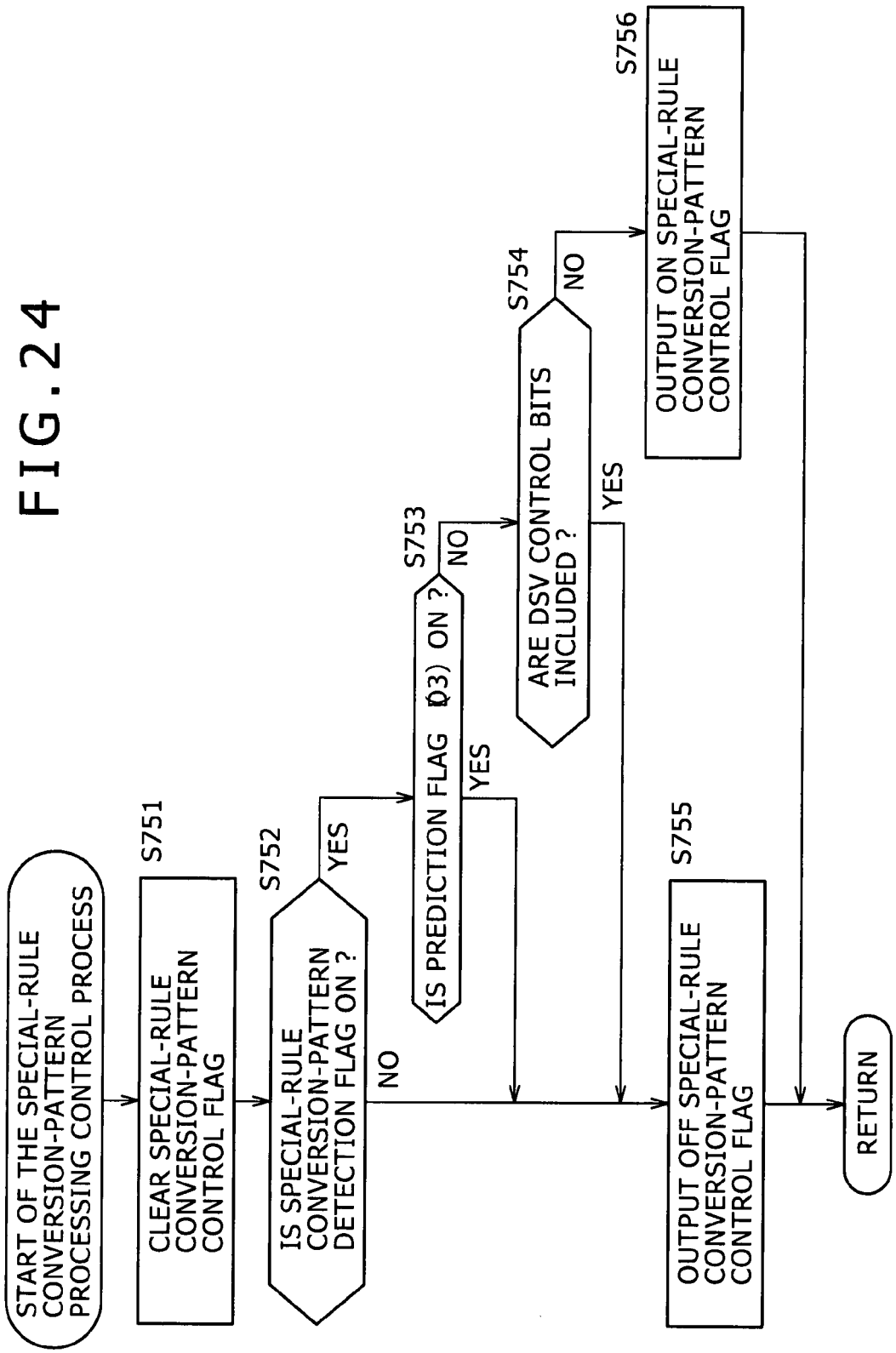
FIG. 24 shows a flowchart to be referred to in explanation of processing carried out at a step S606 of the flowchart shown in FIG. 19 to control a special-rule conversion-pattern process.

FIG. 24 is a diagram referred to in explanation of a flowchart representing the processing carried out at the step S606 of the flowchart shown in FIG. 19 to control a special-rule conversion-pattern process. Processes carried out at steps S751 to S756 are basically identical with respectively the processes carried out at the steps S181 to S186 of the flowchart shown in FIG. 8.

However, in the process carried out at the step S183 of the flowchart shown in FIG. 8, the special-rule conversion-pattern processing control unit 54 produces a result of determination as to whether or not the prediction flag is on. In a process carried out at the step S753 of the flowchart shown in FIG. 24, on the other hand, the special-rule conversion-pattern processing control unit 54 produces a result of determination as to whether or not the prediction flag (D3) is on. The prediction flag (D3) is a flag turned on by the minimum-run succession limitation pattern detection/prediction unit 111 in the process carried out at the step S657 of the flowchart shown in FIG. 20. Much like the prediction flag set in the process carried out at the step S54 of the flowchart shown in FIG. 5, the prediction flag (D3) is a flag, which is turned on when the input data matches a pattern of (xx110111) and the next channel bits are "010". The prediction flag (D3) is turned on when the third and subsequent bits of the input data match a pattern of (110111) and the next channel bits are "010".

Since the rest of the processing represented by the flowchart shown in FIG. 24 is identical with the processing represented by the flowchart shown in FIG. 8, it is not necessary to describe the processing represented by the flowchart shown in FIG. 24 in order to avoid duplications of explanation.

FIG. 25 is a diagram referred to in explanation of a flowchart representing the processing carried out at the step S607 of the flowchart shown in FIG. 19 to control a special-rule conversion-pattern process. As shown in FIG. 25, the flowchart shown in FIG. 25 begins with a step S771 at which the replacement-pattern processing control unit 151 clears variables count 1 and count 2 at predetermined intervals. That is to say, the variables count 1 and count 2 are initialized in the process carried out at the step S771. For example, the variables count 1 and count 2 are initialized for every ECC (Error-Correcting Code) block used as a unit for correcting an error included in a code sequence. The variables counts 1 and count 2 are counts used in processes carried out respectively at steps S774 and S779 to be described later.

Then, in a process carried out at a step S772, the replacement-pattern processing control unit 151 produces a result of determination as to whether or not the minimum-run succession limitation pattern detection flag (10-bit data) is on. The minimum-run succession limitation pattern detection flag (10-bit data) is a flag output in the process carried out at the step S673 or S677 of the flowchart shown in FIG. 21. If the result of the determination indicates that the minimum-run succession limitation pattern detection flag (10-bit data) has been turned on to indicate that the input data matches a pattern of (1001110111), the flow of the processing goes on to a step S773 at which the replacement-pattern processing control unit 151 produces a result of determination as to whether or not the prediction flag (D5) is on. The prediction flag (D5) is a flag output in the process carried out at the step S654 or S658 of the flowchart shown in FIG. 20.

If the result of determination indicates that the prediction flag (D5) has not been turned on (that is, if the prediction flag (D5) has been turned off) to indicate that the input data does not match a pattern of (xxxx110111) and the succeeding channel bits are not "101", the flow of the processing goes on to the aforementioned step S774 at which the variable count 1 is incremented by 1 (count 1=count 1+1). Then, in a process carried out at the next step S775, the replacement-pattern processing control unit 151 produces a result of determination as to whether or not the sum of the variables count 1 and count 2 (count 1+count 2) has reached a reference value determined in advance. The variable count 2 is a variable incremented by 1 in a process carried out at the aforementioned step S779 to be described later. If the result of the determination indicates that the sum of the variables count 1 and count 2 (count 1+count 2) has not reached the reference value, the flow of the processing goes on to a step S777 at which the replacement-pattern processing control unit 151 turns on the replacement-pattern control flag (1) and outputs the flag to the conversion-pattern determination unit 23. If the determination result produced in the process carried out at the step S775 indicates that the sum of the variables count 1 and count 2 (count 1+count 2) has reached the reference value or if the determination result produced in the process carried out at the step S772 indicates that the minimum-run succession limitation pattern detection flag (10-bit data) is off, on the other hand, the flow of the processing goes on to a step S776 at which the replacement-pattern processing control unit 151 turns off the replacement-pattern control flag (1) and outputs the flag to the conversion-pattern determination unit 23.

After the process carried out at the step S776 or S777 is completed, the flow of the processing goes on to a step S778 at which the replacement-pattern processing control unit 151 produces a result of determination as to whether or not the special-rule conversion pattern control flag is on. The special-rule conversion pattern control flag is a flag output in the process carried out at the step S755 or S756 of the flowchart shown in FIG. 24. If the result of the determination indicates that the special-rule conversion pattern control flag has been turned on to indicate that the input data matches a pattern of (01110111), the bit of the immediately preceding code is "1" and the next channel bits are not "010", the flow of the processing goes on to the aforementioned step S779 at which the variable count 2 is incremented by 1 (count 2=count 2+1). Then, in a process carried out at the next step S780, the replacement-pattern processing control unit 151 produces a result of determination as to whether or not the sum of the variables count 1 and count 2 (count 1+count 2) has reached the reference value. If the result of the determination indicates that the sum of the variables count 1 and count 2 (count 1+count 2) has not reached the reference value, the flow of the processing goes on to a step S782 at which the replacement-pattern processing control unit 151 turns on the replacement-pattern control flag (2) and outputs the flag to the conversion-pattern determination unit 23. If the determination result produced in the process carried out at the step S780 indicates that the sum of the variables count 1 and count 2 (count 1+count 2) has reached the reference value or if the determination result produced in the process carried out at the step S778 indicates that the special-rule conversion pattern control flag is off, on the other hand, the flow of the processing goes on to a step S781 at which the replacement-pattern processing control unit 151 turns off the replacement-pattern control flag (2) and outputs the flag to the conversion-pattern determination unit 23.

The variable count 1 is the number of times a specific state has existed so far. The specific state for typically an ECC block is a state in which the minimum-run succession limitation pattern detection flag (10-bit data) is on but the prediction flag (D5) is off in the ECC block. That is to say, the variable count 1 is a process execution frequency, which is defined as the number of times a process has been carried out to convert an even/odd characteristic retaining data pattern of (1001110111) into an even/odd characteristic retaining code pattern of "$0$ 010 000 000 101" corresponding to the even/odd characteristic retaining data pattern of (1001110111). On the other hand, the variable count 2 is the number of times a particular state has existed so far. The particular state is a state in which the special-rule conversion pattern control flag is on. That is to say, the variable count 2 is another process execution frequency, which is defined as the number of times a process has been carried out to convert an even/odd characteristic retention violating data pattern of (01110111) into an even/odd characteristic retention. violating code pattern of "010 000 000 101" corresponding to the even/odd characteristic retention violating data pattern of (01110111). Both the variables count 1 and count 2 are the number of times a conversion process has been carried out on the basis of conversion patterns listed in the modulation table given as Table 8 to convert a data sequence into an erroneous code sequence. The erroneous code sequence is a sequence resulting in an error if demodulated by making use of the existing demodulation apparatus, which is a demodulation apparatus based on conversion patterns listed in the modulation table given as Table 2. Thus, the sum of the variables count 1 and count 2 (count 1+count 2) is the number of times the conversion process has been carried out on the basis of conversion patterns listed in the modulation table given as Table 8 to convert a data sequence into an erroneous code sequence, which is a sequence resulting in an error if demodulated by making use of the existing demodulation apparatus serving as a demodulation apparatus based on conversion patterns listed in the modulation table given as Table 2 as described above.

As will be described later by referring to a flowchart shown in FIG. 27, if the replacement-pattern control flag (1) also referred to as a permission flag is on, in a process carried out at a step S912 of the flowchart, a code pattern of "$0$ 010 000 000 101" representing code patterns of "101 010 000 000 101" and "000 010 000 000 101" is selected and output. The code pattern of "$0$ 010 000 000 101" is a code pattern obtained as a result of a process. carried out at the step S674 of the flowchart shown in FIG. 21 to convert a data pattern of (1001110111). This code pattern is a sequence resulting in an error if demodulated by making use of a demodulation apparatus based on conversion patterns listed in the modulation table given as Table 2. If the replacement-pattern control flag (1) is off, on the other hand, the code pattern of "$0$ 010 000 000 101"representing code patterns of "101 010 000 000 101" and "000 010 000 000 101" is not selected as an output code pattern. Instead, the data pattern of (1001110111) is converted as individual data patterns of (10), (01), (11), (01) and (11) into their respective code patterns and the resulting code patterns are selected and output. In this case, the resulting code patterns are each a code pattern that can be demodulated by making use of a demodulation apparatus based on conversion patterns listed in the modulation table given as Table 2.

By the same token, if the replacement-pattern control flag (2) also referred to as a permission flag as well is on, in a process carried out at a step S914 of the flowchart shown in FIG. 27, a code pattern of "010 000 000 101" is selected and output. The code pattern of "010 000 000 101" is a code pattern obtained as a result of a process carried out at the step S725 of the flowchart shown in FIG. 23 to convert a data pattern of (01110111), which is an even/odd characteristic retention violating pattern also referred to as a special-rule conversion pattern. This code pattern is also a sequence resulting in an error if demodulated by making use of a demodulation apparatus based on conversion patterns listed in the modulation table given as Table 2. If the replacement-pattern control flag (2) is off, on the other hand, the code pattern of "010 000 000 101" is not selected as an output code pattern. Instead, the data pattern of (01110111) is converted as individual data patterns of (01), (11), (01) and (11) into their respective code patterns and the resulting code patterns are selected and output. In this case, the resulting code patterns are each a code pattern that can be demodulated by making use of a demodulation apparatus based on conversion patterns listed in the modulation table given as Table 2.

An error is gene-rated from a portion included in a result of a conversion process as a portion that may not be demodulated by making use of the existing demodulation apparatus serving as a demodulation apparatus based on conversion patterns listed in the modulation table given as Table 2. In order to solve this problem, the reference value to be compared with sum of the variables count 1 and count 2 (count 1+count 2) in the processes carried out at the steps S775 and S780 of the flowchart shown in FIG. 25 is set in advance at a predetermined value in a range allowing a generated error to be corrected in typically an ECC block. Thus, even if a modulation process is carried out to result in a code pattern that may not be demodulated by the existing demodulation apparatus, the original data can be obtained by carrying out a process to correct an error in an ECC block as long as the number of times the modulation process has been carried out so far does not exceed the reference value set in advance as described above.

It is to be noted that, in this embodiment, the modulation table given as Table 8 has a configuration including the minimum-run succession limitation table 113B and the special-rule conversion table 132 whereas the modulation table given as Table 2, with which compatibility is sustained, has a configuration including the conversion tables 122 (that is, the conversion tables 122A to 122D) and the minimum-run succession limitation table 113A. The modulation table given as Table 8 is joined to the modulation table given as Table 2 to result in the modulation Table 3 (8) including all the tables.

Since the processing carried out at the step S608 of the flowchart shown in FIG. 19 is identical with the processing represented by the flowchart shown in FIG. 9, the processing carried out at the step S608 is not described in particular in order to avoid duplications of explanation.

The following description explains the processing carried out by the immediately preceding code detection unit 71 to detect an immediately preceding code and the minimum-run succession limitation general processing carried out by the general detection unit 72. Since the processing carried out by the immediately preceding code detection unit 71 to detect an immediately preceding code is identical with the processing represented by the flowchart shown in FIG. 11, the processing carried by the immediately preceding code detection unit 71 to detect an immediately preceding code is not described in particular in order to avoid duplications of explanation.

Figure 26:
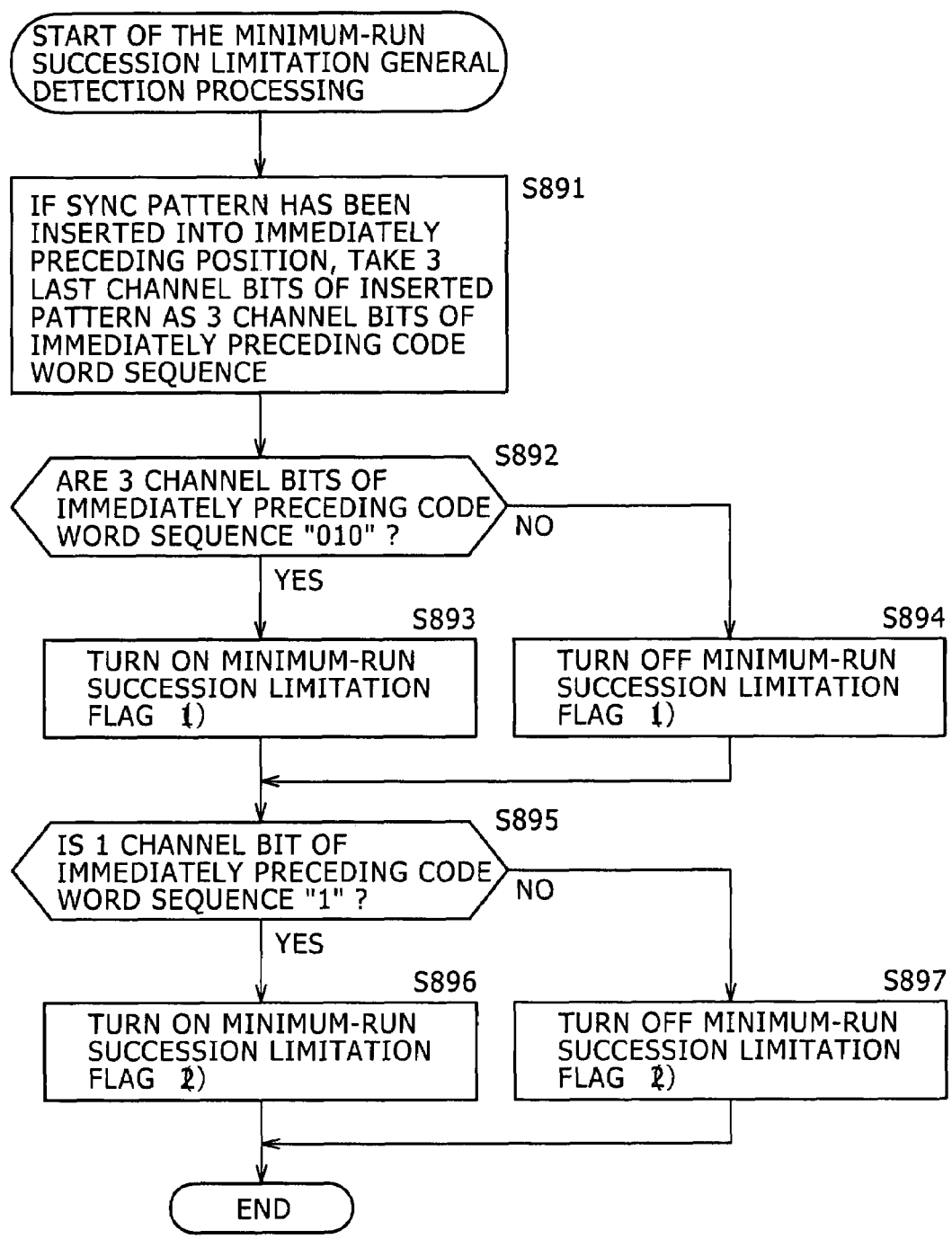
FIG. 26 shows a flowchart to be referred to in explanation of other minimum-run succession limitation general detection processing.

FIG. 26 is a diagram referred to in explanation of a flowchart representing the minimum-run succession limitation general processing carried out by the general detection unit 72.

As shown in the figure, the flowchart begins with a step S891 at which the general detection unit 72 takes the 3 last channel bits of an inserted synchronization pattern as 3 channel bits of an immediately preceding code word sequence if the synchronization pattern has been inserted into the immediately preceding position. That is to say, on the basis of the output of the conversion-pattern determination unit 23, the general detection unit 72 produces a result of determination as to whether or not a synchronization pattern has been inserted into the immediately preceding position. If the result of the determination indicates that a synchronization pattern has been inserted into the immediately preceding position, the general detection unit 72 take the 3 last channel bits of the inserted synchronization pattern as 3 channel bits of an immediately preceding code word sequence. The 3 channel bits of an immediately preceding code word sequence are examined in a determination process carried out at the next step S892.

In a process carried out at the step S892, the general detection unit 72 produces a result of determination as to whether or not the 3 channel bits of a code word sequence determined by the conversion-pattern determination unit 53 as a code word sequence immediately preceding the next conversion process are "010". If the result of the determination indicates that the 3 channel bits of a code word sequence determined by the conversion-pattern determination unit 53 as a code word sequence immediately preceding the next conversion process are "010", the flow of the processing goes on to a step S893 at which the general detection unit 72 turns on the minimum-run succession limitation flag (1) and outputs the flag to the indeterminate-bit determination unit 114. If the determination result produced in the process carried out at the step S892 indicates that the 3 channel bits of a code word sequence determined by the conversion-pattern determination unit 53 as a code word sequence immediately preceding the next conversion process are not "010", that is, if the 3 channel bits of the code word sequence are "000", "101" or "001", on the other hand, the flow of the processing goes on to a step S894 at which the general detection unit 72 turns off the minimum-run succession limitation flag (1) and outputs the flag to the indeterminate-bit determination unit 114. The minimum-run succession limitation flag (1) is a flag examined by the indeterminate-bit determination unit 114 in the determination process carried at the step S693 of the flowchart shown in FIG. 22.

After the process carried out at the step S893 or S894 is completed, the flow of the processing goes on to a step S895 at which the general detection unit 72 produces a result of determination as to whether or not the 1 channel bit of the immediately preceding code word sequence is "1". If the result of determination indicates that the 1 channel bit of the immediately preceding code word sequence is "1", the flow of the processing goes on to a step S896 at which the general detection unit 72 turns on the minimum-run succession limitation flag (2) and outputs the flag to the special-rule conversion-pattern detection unit 131. If the determination results produced in the process carried out at the step S895 indicates that the 1 channel bit of the immediately preceding code word sequence is not "1", that is, if the 1 channel bit of the immediately preceding code word sequence is "0", on the other hand, the flow of the processing goes on to a step S897 at which the general detection unit 72 turns off the minimum-run succession limitation flag (2) and outputs the flag to the special-rule conversion-pattern detection unit 131. The minimum-run succession limitation flag (2) is a flag examined by the special-rule conversion-pattern detection unit 131 in the determination process carried at the step S723 of the flowchart shown in FIG. 23.

FIG. 27 is a diagram referred to in explanation of a flowchart representing the processing carried out at the step S609 of the flowchart shown in FIG. 19 to determine a conversion pattern.

The flowchart shown in FIG. 27 begins with a step S911 at which the conversion-pattern determination unit 53 produces a result of determination as to whether or not the replacement pattern control flag (1) is on. The replacement pattern control flag (1) is a flag output by the replacement-pattern processing control unit 151 in the process carried out at the step S776 or S777 of the flowchart shown in FIG. 25. If the result of the determination indicates that the replacement pattern control flag (1) is on, the flow of the processing goes on to a step S912 at which the conversion-pattern determination unit 53 selects conversion patterns for conversion of a 10-bit replacement pattern into a pattern of 15 channel bits and outputs the pattern of 15 channel bits. To put it concretely, the conversion-pattern determination unit 53 selects a data pattern of (1001110111) and outputs a code pattern of "101 010 000 000 101" or "000 010 000 000 101" serving as a conversion result associated with the data pattern of (1001110111), which has been converted into the code pattern of "101 010 000 000 101" or "000 010 000 000 101" in the process carried out respectively at the step S695 or S697 of the flowchart shown in FIG. 22 as an even/odd characteristic retaining pattern also referred to as a basic-rule conversion pattern.

If the determination result produced in the process carried out at the step S911 indicates that the replacement-pattern control flag (1) is not on, that is, if the replacement-pattern control flag (1) is off, on the other hand, the flow of the processing goes on to a step S913 at which the conversion-pattern determination unit 53 produces a result of determination as to whether or not the replacement pattern control flag (2) is on. The replacement pattern control flag (2) is a flag output by the replacement-pattern processing control unit 151 in the process carried out at the step S781 or S782 of the flowchart shown in FIG. 25. If the result of the determination indicates that the replacement pattern control flag (2) is on, the flow of the processing goes on to a step S914 at which the conversion-pattern determination unit 53 selects conversion patterns for conversion of a 8-bit replacement pattern into a pattern of 12 channel bits and outputs the pattern of 12 channel bits. To put it concretely, the conversion-pattern determination unit 53 selects a data pattern of (01110111) and outputs a code pattern of "010 000 000 101" serving as a conversion result associated with the data pattern of (01110111), which has been converted into the code pattern of "010 000 000 101" in the process carried out at the step S725 of the flowchart shown in FIG. 23 as an even/odd characteristic retention violating pattern also referred to as a special-rule conversion pattern.

As described above, if the replacement pattern control flag (1) or the replacement pattern control flag (2) is on, a conversion process is carried out to generate a code sequence that may not be demodulated by making use of a demodulation apparatus based on the modulation table given as Table 2, with which compatibility is sustained. If the replacement pattern control flag (1) and the replacement pattern control flag (2) are off, on the other hand, no conversion process is carried out to generate a code sequence that may not be demodulated by making use of a demodulation apparatus based on the modulation table given as Table 2. Instead, processes of a step S915 and subsequent steps are carried out.

If the determination result produced in the process carried out at the step S913 indicates that the replacement-pattern control flag (2) is not on, that is, if the replacement-pattern control flag (2) is off, on the other hand, the flow of the processing goes on to a step S915 at which the conversion-pattern determination unit 53 produces a result of determination as to whether or not the minimum-run succession limitation pattern detection flag (6-bit data) is on. The minimum-run succession limitation pattern detection flag (6-bit data) is a flag turned on and output in the process carried out at the step S678 of the flowchart shown in FIG. 21 if the data pattern is (110111) and the 3 next channel bits are "010". If the determination result produced in the process carried out at the step S915 indicates that the minimum-run succession limitation pattern detection flag (6-bit data) has been turned on to indicate that the data pattern is (110111) and the 3 next channel bits are-"010", the flow of the processing goes on to a step S916 at which the conversion-pattern determination unit 53 selects conversion patterns for conversion of a 6-bit replacement pattern into a pattern of 9 channel bits and outputs the pattern of 9 channel bits. To put it concretely, the conversion-pattern determination unit 53 selects the input data pattern of (110111) and outputs a code pattern of "001 000 000" serving as a conversion result associated with the data pattern of (110111), which has been converted into the code pattern of "001 000 000" serving as a replacement pattern in the process carried out at the step S679 of the flowchart shown in FIG. 21.

If the determination result produced in the process carried out at the step S915 indicates that the minimum-run succession limitation pattern detection flag (6-bit data) has been turned off to indicate that the input data pattern is not (110111) or the input data pattern is (110111) but the 3 next channel bits are not "010", on the other hand, the flow of the processing goes on to a step S917 at which the conversion-pattern determination unit 53 produces a result of determination as to whether or not information on determination of 8-data-bit/12-channel-bit conversion patterns has been received. The information on determination of 8-data-bit/12-channel-bit conversion patterns is information output in the process carried out at the step S212 of the flowchart shown in FIG. 9. If the result of determination indicates that the information on determination of 8-data-bit/12-channel-bit conversion patterns has been received, the flow of the processing goes on to a step S918 at which the conversion-pattern determination unit 53 selects conversion patterns for conversion of a 8-bit data pattern into a pattern of 12 channel bits and outputs the pattern of 12 channel bits. To put it concretely, the conversion-pattern determination unit 53 selects an 8-bit data pattern to be converted into a 12-bit code pattern of "000 100 100 100" or "010 100 100 100" and outputs the code pattern of "000 100 100 100" or "010 100 100 100" as channel bits.

If the determination result produced in the process carried out at the step S917 indicates that the information on determination of 8-data-bit/12-channel-bit conversion patterns has not been received, on the other hand, the flow of the processing goes on to a step S919 at which the conversion-pattern determination unit 53 produces a result of determination as to whether or not information on determination of 6-bit/9-channel-bit conversion patterns has been received. The information on determination of 6-bit/9-channel-bit conversion patterns is information output in the process carried out at the step S215 of the flowchart shown in FIG. 9. If the result of determination indicates that the information on determination of 6-bit/9-channel-bit conversion patterns has been received, the flow of the processing goes on to a step S920 at which the conversion-pattern determination unit 53 selects conversion patterns for conversion of a 6-bit data pattern into a pattern of 9 channel bits and outputs the pattern of 9 channel bits. To put it concretely, the conversion-pattern determination unit 53 selects a 6-bit data pattern to be converted into a 9-bit code pattern of "000 100 100", "000 100 000", "010 100 100" or "010 100 000" and outputs the code pattern of "000 100 100", "000 100 000", "010 100 100" or "010 100 000" as channel bits.

If the determination result produced in the process carried out at the step S919 indicates that the information on determination of 6-bit/9-channel-bit conversion patterns has not been received, on the other hand, the flow of the processing goes on to a step S921 at which the conversion-pattern determination unit 53 produces a result of determination as to whether or not information on determination of 4-data-bit/6-channel-bit conversion patterns has been received. The information on determination of 4-data-bit/6-channel-bit conversion patterns is information output in the process carried out at the step S218 of the flowchart shown in FIG. 9. If the result of determination indicates that the information on determination of 4-data-bit/6-channel-bit conversion patterns has been received, the flow of the processing goes on to a step S922 at which the conversion-pattern determination unit 53 selects conversion patterns for conversion of a 4-bit data pattern into a pattern of 6 channel bits and outputs the pattern of 6-channel bits. To put it concretely, the conversion-pattern determination unit 53 selects a 4-bit data pattern to be converted into a 6-bit code pattern of "010 100", "010 000" or "000 100" and outputs the code pattern of "010 100", "010 000" or "000 100" as channel bits.

If the determination result produced in the process carried out at the step S921 indicates that the information on determination of 4-data-bit/6-channel-bit conversion patterns has not been received, on the other hand, the flow of the processing goes on to a step S923 at which the conversion-pattern determination unit 53 produces a result of determination as to whether or not information on determination of 2-data-bit/3-channel-bit conversion patterns has been received from the conversion-pattern detection unit 121. The information on determination of 2-data-bit/3-channel-bit conversion patterns is information output in the process carried out at the step S221 of the flowchart shown in FIG. 9. If the result of determination indicates that the information on determination of 2-data-bit/3-channel-bit conversion patterns has been received, the flow of the processing goes on to a step S924 at which the conversion-pattern determination unit 53 further produces a result of determination as to whether or not the information on determination of 2-data-bit/3-channel-bit conversion patterns is the information on determination of 2-data-bit/3-channel-bit conversion patterns for a data pattern of (11). This is because it is quite within the bounds of possibility that the data pattern of (11) is converted into a code pattern including an indeterminate bit. If the result of the determination indicates that the information on determination of 2-data-bit/3-channel-bit conversion patterns is the information on determination of 2-data-bit/3-channel-bit conversion patterns for a data pattern of (11), the flow of the processing goes on to a step S925 at which the conversion-pattern determination unit 53 selects and output 3 channel bits produced by the indeterminate-bit determination unit 114. To put it concretely, the conversion-pattern determination unit 53 selects and outputs the 3-bit code pattern of "000" or "101" as channel bits. The channel-bit sequence of "000" or "101" is a code pattern output in the process carried out respectively at the step S256 or S257 of the flowchart shown in FIG. 10.

If the determination result produced in the process carried out at the step S924 indicates that the information on determination of 2-data-bit/3-channel-bit conversion patterns is not the information on determination of 2-data-bit/3-channel-bit conversion patterns for the data pattern of (11), which may be converted into a code pattern including an indeterminate bit, on the other hand, the flow of the processing goes on to a step S926 at which the conversion-pattern determination unit 53 selects and output 3 channel bits produced by the selector 123. To put it concretely, the conversion-pattern determination unit 53 selects and outputs the 3-bit code pattern of "001" or "010" as channel bits.

As described above, even if a modulation process is carried out on the basis of the modulation table given as Table 3 (8), the DSV control can be executed with a high degree of reliability and compatibility with the existing apparatus can be assured.

In the case of the embodiment shown in FIG. 3, a code pattern is selected on the basis of the special-rule conversion-pattern control flag as shown in the flowchart of FIG. 13, but in the case of the embodiment shown in FIG. 18, on the other hand, the replacement-pattern control flags (1) and (2) are changed on the basis of the variables count 1 and count 2 as shown in the flowchart of FIG. 25 and a code pattern is selected on the basis of the changed replacement-pattern control flags (1) and (2).

For the 1,77 PP code, the modulation table with a minimum run d set at 1 (d=1), a maximum run k set at 7 (k=7) and a conversion ratio (m:n) set at (2:3) or ((m:n)=(2:3)) includes replacement patterns for limiting the succession of minimum runs to provide the following effects:

(1): The degree of tolerance for high-density recording and reproduction operations as well as a tangential-tilt state can be increased.

(2): The number of portions each having a low signal level is reduced and precision of waveform processing such as AGC (Auto Gain Control) and PLL (Phase-Locked Loop) is raised. Thus, the overall characteristics can be improved.

(3): In comparison with the existing apparatus, the modulation apparatus provided by the present invention is designed to provide a small length of a pass memory used in processes such as Viterbi modulation processing. Thus, the circuit scale can be decreased.

In addition, by carrying out the processing to determine a conversion pattern by making use the special-rule conversion-pattern control flag, a remainder obtained as a result of an operation to divide the number of 1s included as bit elements in a data pattern serving as a pattern to be converted into a code pattern by 2 and a remainder obtained as a result of an operation to divide the number of 1s included as bit elements in the code pattern resulting from the conversion process by 2 are both made equal to 1 or 0 in order to provide the following additional effects:

(4): The number of redundant bits for execution of the DSV control can be reduced.

(5): For a minimum run d of 1 (d=1) and a conversion ratio (m:n) of (2:3) or ((m:n)=(2:3)), the DSV control can be executed by using only 1.5 code words.

(6): The redundancy can be kept little and, on top of that, it is possible to abide by the minimum run and the maximum run. In addition, in comparison with the modulation table given as Table 2 for the 1, 7 PP code, the modulation table given as Table 4 reduces the maximum number of successive minimum runs from 6 to 5. Thus, the propagation of an error generated at data recording and reproduction times can be further reduced.

As described earlier, in some cases, data starting with the edge at the head of consecutive minimum marks and ending with the edge at the tail of the minimum marks is mistakenly shifted altogether as a pattern of a data reproduction error. That is to say, the generated bit error length becomes the distance of error propagation from the head of the succession of minimum runs to the tail of the succession. Thus, there is raised a problem that the error propagation becomes undesirably long. By reducing the maximum number of successive minimum runs from 6 to 5 as described above, however, it is possible to decrease the number of cases in which such an error is generated and, hence, implement a more stable operations to record and reproduce data.

FIG. 28 is a block diagram showing a typical configuration of a personal computer for executing programs in order to carry out the series of processes described so far. In the typical configuration shown in FIG. 28, a CPU (Central Processing Unit) 321 carries out various kinds of processing by execution of programs stored in a ROM (Read Only Memory) 322 or programs loaded from a storage unit 328 into a RAM (Random Access Memory) 323. The RAM 323 is also used for properly storing various kinds of information such as data required in the execution of the processing. The CPU 321, the ROM 322 and the RAM 323 are connected to each other by a bus 324.

The input/output interface 325 connected to the CPU 321 by the bus 324 is also connected to an input unit 326, an output unit 327, the storage unit 328 cited above, a communication unit 329 and a drive 330. The input unit 326 includes a keyboard and a mouse whereas the output unit 327 includes a display unit and a speaker. The CPU 21 carries out various kinds of processing in accordance with commands entered by the user through the input unit 326. The CPU 21 outputs results of the processing to the output unit 327.

The storage unit 328 connected to the input/output interface 325 typically employs a hard disk for storing the programs to be executed by the CPU 321 and data required by the programs. The communication section 329 is a unit for carrying out communication processing with other apparatus through a network not shown in the figure. Examples of the network are the Internet and a LAN (local area network). Programs downloaded from the network by way of the communication unit 329 may also be installed in the storage unit 328 as the programs to be loaded into the RAM 323 for execution by the CPU 321.

As described above, the input/output interface 325 is also connected to the drive 330 on which a removable rerecording medium 331 is mounted. The removable recording medium 331 can be a magnetic disk, an optical disk, a magneto-optical disk or a semiconductor memory. When the removable recording medium 331 is mounted on the drive 330, the CPU 321 controls the drive 330 to install a computer program to be executed by the CPU 311 from the removable recording medium 331 into the storage unit 328 to be eventually loaded into the RAM 323 for execution by the CPU 321.

The series of processes described previously can be carried out by hardware and/or execution of software. If the series of processes described above is carried out by execution of software, programs composing the software can be installed into a computer embedded in dedicated hardware, a general-purpose personal computer or the like from typically the network or the removable recording medium 331. In this case, the computer or the personal computer serves as the modulation apparatus 1 described above. A general-purpose personal computer is a personal computer, which can be made capable of carrying out a variety of functions by installing a variety of programs into the personal computer.

The aforementioned removable recording medium 331 for recording programs in an executable state to be installed into a computer or a general-purpose personal computer as programs to be executed by the computer or the general-purpose personal computer respectively is a recording medium provided to the user separately from the main unit of the computer or the general-purpose personal computer as shown in FIG. 28. Examples of the removable recording mediums also each referred to as a package medium include the magnetic disk such as a flexible disk, the optical disk such as a CD-ROM (Compact Disk—Read Only Memory) or a DVD (Digital Versatile Disk), the magneto-optical disk such as an MD (MINIDISC, Registered Trademark of Sony Corporation) as well as the semiconductor memory. Instead of installing the programs from the removable recording mediums 331 into the storage unit 328, the programs can also be stored permanently or temporarily in advance in an embedded recording medium included in the main unit of the computer or the general-purpose personal computer. Examples of the embedded recording medium are the hard disk included in the storage unit 328 and the ROM 322. The programs stored in the hard disk as programs to be executed by the computer or the general-purpose personal computer can also be programs installed from an external source by downloading the programs from the source to the computer or the general-purpose personal computer by way of the communication unit 329 serving as an interface typically having a modem or a terminal adaptor through utilization of communication media based on a radio and/or wire communication. Examples of the communication media based on a radio or wire communication are the local area network cited above, the aforementioned Internet and a digital broadcasting satellite.

It is worth noting that, in this specification, steps of the flowchart described above can be carried out not only in a pre-prescribed order along the time axis, but also concurrently or individually.

It is to be noted that embodiments of the present invention are by no means limited to those described above. That is to say, it is possible to make a variety of changes to the embodiments as long as the changes are within a range not deviating from essentials of the present invention.

In addition, it should be understood by those skilled in the art that a variety of modifications, combinations, sub-combinations and alterations may occur in dependence on design requirements and other factors insofar as they are within the scope of the appended claims or the equivalents thereof.

What is claimed is:

1. A modulation apparatus comprising:
   first conversion means for converting a portion included in processed data by translating a first data pattern into a first code pattern in accordance with a first table which maintains an even/odd-characteristic;
   second conversion means for converting a portion included in processed data by translating a second data pattern into a second code pattern in accordance with a second table which does not maintain an even/odd-characteristic; and
   select means for selecting either said first code pattern or said second code pattern, wherein, if a DSV control bit has been inserted into said processed data output from said second conversion means is not selected.

2. The modulation apparatus according to claim 1, said modulation apparatus further including first processing control means for making use of information on a position into which a DSV control bit is inserted in order to generate control information to be used by said select means to select either said first code pattern or said second code pattern wherein said select means selects either said first code pattern or said second code pattern on the basis of said control information.

3. The modulation apparatus according to claim 2 wherein said first processing control means produces a result of determination as to whether a DSV control bit has been inserted into said processed data on the basis of information indicating that said second conversion means is allowed to carry out a conversion process and said information on a position, into which a DSV control bit is inserted, and generates said control information on the basis of said result of said determination.

4. The modulation apparatus according to claim 2 wherein said first processing control means generates said control information also on the basis of information received from an external source.

5. The modulation apparatus according to claim 1 further comprising a process carried out by said second conversion means is a conversion process which limits a succession of minimum runs.

6. The modulation apparatus according to claim 2, said modulation apparatus further including second processing control means for changing said control information generated by said first processing control means based on a result of detecting a frequency of using at least one of said first and second code patterns.

7. The modulation apparatus according to claim 6 wherein said second processing control means changes said control information generated by said first processing control means so as to allow a process to be carried out if a detected usage frequency of a code pattern is not greater than a predetermined reference value.

8. The modulation apparatus according to claim 7 wherein said second processing control means sets said reference value at a value limited to a range allowing errors to be corrected.

9. The modulation apparatus according to claim 8 wherein said second processing control means detects a usage frequency in an ECC block of said code pattern.

10. The modulation apparatus according to claim 6 wherein reproduction compatibility is sustained.

11. The modulation apparatus according to claim 10 wherein said first table includes all contents of a basic conversion table.

12. The modulation apparatus according to claim 11 wherein said first table includes a replacement/conversion table in addition to all said contents of said basic conversion table.

13. A modulation method comprising:
 converting a portion included in processed data by translating a first data pattern into a first code pattern in accordance with a first table which maintains an even/odd-characteristic;
 converting a portion included in processed data by translating a second data pattern into a second code pattern in accordance with a second table which does not maintain an even/odd-characteristic; and
 selecting either said first code pattern or said second code pattern and if a DSV control bit has been inserted into said processed data said second code pattern is not selected.

14. A program embodied in a computer readable storage medium comprising:
 a portion for converting processed data by translating a first data pattern into a first code pattern in accordance with a first table which maintains an even/odd-characteristic;
 a portion for converting processed data by translating a second data pattern into a second code pattern in accordance with a second table which does not maintain an even/odd-characteristic; and
 a portion for selecting either said first code pattern or said second code pattern and if a DSV control bit has been inserted into said processed data, a process carried out at said second conversion step to convert is not selected.

* * * * *